(12) United States Patent
Koyama et al.

(10) Patent No.: US 9,536,468 B2
(45) Date of Patent: *Jan. 3, 2017

(54) DISPLAY DEVICE

(71) Applicant: Semiconductor Energy Laboratory Co., Ltd., Kanagawa-ken (JP)

(72) Inventors: Jun Koyama, Kanagawa (JP); Hajime Kimura, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/886,994

(22) Filed: Oct. 19, 2015

(65) Prior Publication Data

US 2016/0042685 A1 Feb. 11, 2016

Related U.S. Application Data

(63) Continuation of application No. 14/689,959, filed on Apr. 17, 2015, which is a continuation of application
(Continued)

(30) Foreign Application Priority Data

May 12, 2000 (JP) .................................. 2000-140513

(51) Int. Cl.
*G06F 3/038* (2013.01)
*G09G 5/00* (2006.01)
(Continued)

(52) U.S. Cl.
CPC .............. *G09G 3/30* (2013.01); *G09G 3/3225* (2013.01); *G09G 3/3241* (2013.01);
(Continued)

(58) Field of Classification Search
CPC ............ G09G 2330/021; G09G 3/3696; G09G 3/3233
(Continued)

(56) References Cited

U.S. PATENT DOCUMENTS

| 4,468,659 A | 8/1984 | Ohba et al. |
| 4,937,517 A | 6/1990 | Kurashima |

(Continued)

FOREIGN PATENT DOCUMENTS

| EP | 0 526 232 A1 | 2/1993 |
| EP | 0 863 495 A1 | 9/1998 |

(Continued)

OTHER PUBLICATIONS

Schenk, H. et al., "Polymers for Light Emitting Diodes," Eurodisplay '99: The 19th International Display Research Conference, Sep. 6, 1999, pp. 33-37.
(Continued)

*Primary Examiner* — Kimnhung Nguyen
(74) *Attorney, Agent, or Firm* — Husch Blackwell LLP

(57) ABSTRACT

There is provided an active matrix EL display device that can display a clear multi gray-scale color display to reduce the shift in the potential caused by the potential drop due to the wiring resistance of a power source supply line, in order to decrease the unevenness in a display region. A plurality of drawing out ports of the power source supply line are arranged. Further, in the wiring resistance between the external input terminal and the pixel portion power source supply line, potential compensation is performed by supplying potential to the power source supply line by a feedback amplifier. Further, in addition to above structure, the power source supply line may be arranged in a matrix.

12 Claims, 41 Drawing Sheets

Related U.S. Application Data

No. 14/107,498, filed on Dec. 16, 2013, now Pat. No. 9,013,377, which is a continuation of application No. 13/406,008, filed on Feb. 27, 2012, now Pat. No. 8,610,645, which is a continuation of application No. 11/607,692, filed on Dec. 1, 2006, now Pat. No. 8,125,415, which is a continuation of application No. 10/813,591, filed on Mar. 30, 2004, now Pat. No. 7,148,630, which is a continuation of application No. 09/850,650, filed on May 7, 2001, now Pat. No. 6,714,178.

(51) Int. Cl.
  *G09G 3/30* (2006.01)
  *G09G 3/32* (2016.01)
  *H01L 27/12* (2006.01)
  *H01L 51/52* (2006.01)
  *H01L 27/32* (2006.01)

(52) U.S. Cl.
  CPC ........ *H01L 27/124* (2013.01); *H01L 27/3248* (2013.01); *H01L 27/3262* (2013.01); *H01L 27/3276* (2013.01); *H01L 51/5221* (2013.01); *G09G 2300/0426* (2013.01); *G09G 2320/0214* (2013.01); *G09G 2320/0223* (2013.01); *H01L 27/3244* (2013.01); *H01L 2251/5353* (2013.01)

(58) Field of Classification Search
  USPC ........ 345/76–83, 211–213; 315/169.1–169.4
  See application file for complete search history.

(56) References Cited

U.S. PATENT DOCUMENTS

| | | | |
|---|---|---|---|
| 5,440,208 A | 8/1995 | Uskali et al. |
| 5,610,742 A | 3/1997 | Hinata et al. |
| 5,670,792 A | 9/1997 | Utsugi et al. |
| 5,687,465 A | 11/1997 | Hinata et al. |
| 5,831,709 A | 11/1998 | Song |
| 5,990,629 A | 11/1999 | Yamada et al. |
| 6,058,257 A | 5/2000 | Nojima |
| 6,087,885 A | 7/2000 | Tobita |
| 6,114,715 A | 9/2000 | Hamada |
| 6,127,704 A | 10/2000 | Kim |
| 6,194,837 B1 | 2/2001 | Ozawa |
| 6,239,958 B1 | 5/2001 | Kato et al. |
| 6,348,702 B1 | 2/2002 | Takayama et al. |
| 6,359,320 B1 | 3/2002 | Yamazaki et al. |
| 6,359,606 B1 | 3/2002 | Yudasaka |
| 6,396,105 B1 | 5/2002 | Yamazaki et al. |
| 6,421,034 B1 | 7/2002 | Mihara |
| 6,424,012 B1 | 7/2002 | Kawasaki et al. |
| 6,462,722 B1 | 10/2002 | Kimura et al. |
| 6,462,723 B1 | 10/2002 | Yamazaki et al. |
| 6,469,317 B1 | 10/2002 | Yamazaki et al. |
| 6,476,419 B1 | 11/2002 | Yasuda |
| 6,512,504 B1 | 1/2003 | Yamauchi et al. |
| 6,522,079 B1 | 2/2003 | Yamada |
| 6,522,315 B2 | 2/2003 | Ozawa et al. |
| 6,524,895 B2 | 2/2003 | Yamazaki et al. |
| 6,529,178 B1 | 3/2003 | Kimura |
| 6,531,713 B1 | 3/2003 | Yamazaki |
| 6,542,137 B2 | 4/2003 | Kimura et al. |
| 6,545,359 B1 | 4/2003 | Ohtani et al. |
| 6,545,424 B2 | 4/2003 | Ozawa |
| 6,548,960 B2 | 4/2003 | Inukai |
| 6,556,177 B1 | 4/2003 | Katayama et al. |
| 6,580,408 B1 | 6/2003 | Bae et al. |
| 6,580,409 B1 | 6/2003 | Ito et al. |
| 6,583,577 B1 | 6/2003 | Choi et al. |
| 6,593,592 B1 | 7/2003 | Yamazaki et al. |
| 6,618,029 B1 | 9/2003 | Ozawa |
| 6,714,178 B2 | 3/2004 | Koyama et al. |
| 6,724,011 B2 | 4/2004 | Segawa et al. |
| 6,724,149 B2 | 4/2004 | Komiya et al. |
| 6,734,839 B2 | 5/2004 | Yudasaka |
| 6,836,067 B1 | 12/2004 | Imai |
| 6,839,045 B2 | 1/2005 | Ozawa et al. |
| 6,839,108 B1 | 1/2005 | Hirakata et al. |
| 6,862,011 B2 | 3/2005 | Kimura et al. |
| 7,009,345 B2 | 3/2006 | Komiya et al. |
| 7,009,589 B1 | 3/2006 | Komiya et al. |
| 7,012,278 B2 | 3/2006 | Kimura et al. |
| 7,148,630 B2 | 12/2006 | Koyama et al. |
| 7,180,483 B2 | 2/2007 | Kimura et al. |
| 7,221,337 B1 | 5/2007 | Choi et al. |
| 7,221,339 B2 | 5/2007 | Ozawa et al. |
| 7,253,793 B2 | 8/2007 | Ozawa et al. |
| 7,397,451 B2 | 7/2008 | Ozawa |
| 7,460,094 B2 | 12/2008 | Ozawa |
| 7,710,364 B2 | 5/2010 | Ozawa et al. |
| 7,880,696 B2 | 2/2011 | Ozawa et al. |
| 8,154,199 B2 | 4/2012 | Ozawa et al. |
| 8,188,647 B2 | 5/2012 | Kimura et al. |
| 8,247,967 B2 | 8/2012 | Ozawa et al. |
| 8,354,978 B2 | 1/2013 | Ozawa et al. |
| 2001/0026251 A1 | 10/2001 | Hunter et al. |
| 2001/0048408 A1 | 12/2001 | Koyama et al. |
| 2002/0044140 A1 | 4/2002 | Inukai |
| 2003/0151568 A1 | 8/2003 | Ozawa |
| 2005/0140306 A1 | 6/2005 | Park |
| 2008/0158209 A1 | 7/2008 | Ozawa |
| 2008/0165174 A1 | 7/2008 | Ozawa |
| 2008/0198152 A1 | 8/2008 | Ozawa |
| 2015/0294621 A1* | 10/2015 | Koyama ............. G09G 3/3225 345/212 |

FOREIGN PATENT DOCUMENTS

| | | |
|---|---|---|
| EP | 0 895 219 A1 | 2/1999 |
| EP | 0 917 127 A1 | 5/1999 |
| EP | 0 932 137 A1 | 7/1999 |
| EP | 0 935 229 A1 | 8/1999 |
| EP | 0 961 525 A1 | 12/1999 |
| EP | 1 255 240 A1 | 11/2002 |
| EP | 1 336 953 A2 | 8/2003 |
| EP | 1 337 131 A2 | 8/2003 |
| EP | 1 359 789 A1 | 11/2003 |
| EP | 1 363 265 A2 | 11/2003 |
| EP | 1 465 257 A1 | 10/2004 |
| EP | 1 505 649 A2 | 2/2005 |
| EP | 1 505 650 A2 | 2/2005 |
| EP | 1 505 651 A2 | 2/2005 |
| EP | 1 505 652 A2 | 2/2005 |
| EP | 1 619 654 A1 | 1/2006 |
| EP | 1 830 342 A2 | 9/2007 |
| EP | 1 830 343 A2 | 9/2007 |
| EP | 1 830 344 A2 | 9/2007 |
| EP | 2 112 693 A2 | 10/2009 |
| JP | 52-127790 A | 10/1977 |
| JP | 57-041694 A | 3/1982 |
| JP | 63-083798 A | 6/1988 |
| JP | 63-155595 A | 6/1988 |
| JP | 04-031299 A | 3/1992 |
| JP | 04-079192 A | 3/1992 |
| JP | 04-229529 A | 8/1992 |
| JP | 04-234785 A | 8/1992 |
| JP | 04-250492 A | 9/1992 |
| JP | 06-075209 A | 3/1994 |
| JP | 06-176868 A | 6/1994 |
| JP | 06-194679 A | 7/1994 |
| JP | 07-272848 A | 10/1995 |
| JP | 08-129158 A | 5/1996 |
| JP | 08-171081 A | 7/1996 |
| JP | 09-081053 A | 3/1997 |
| JP | 09-114398 A | 5/1997 |
| JP | 09-260061 A | 10/1997 |
| JP | 09-281928 A | 10/1997 |
| JP | 10-092576 A | 4/1998 |
| JP | 10-214043 A | 8/1998 |
| JP | 10-232412 A | 9/1998 |
| JP | 10-239655 A | 9/1998 |

(56) References Cited

FOREIGN PATENT DOCUMENTS

| | | |
|---|---|---|
| JP | 10-239699 A | 9/1998 |
| JP | 10-247735 A | 9/1998 |
| JP | 10-284690 A | 10/1998 |
| JP | 10-319909 A | 12/1998 |
| JP | 11-024604 A | 1/1999 |
| JP | 11-024606 A | 1/1999 |
| JP | 11-074073 A | 3/1999 |
| JP | 11-219133 A | 8/1999 |
| JP | 2000-132133 A | 5/2000 |
| JP | 2000-242196 A | 9/2000 |
| JP | 2001-100654 A | 4/2001 |
| JP | 2001-100656 A | 4/2001 |
| JP | 2002-032037 A | 1/2002 |
| KR | 1999-0018059 A | 3/1999 |
| KR | 1999-0025571 A | 4/1999 |
| KR | 2005-0065947 A | 6/2005 |
| WO | WO 98/13811 A1 | 4/1998 |
| WO | WO 98/33165 A1 | 7/1998 |
| WO | WO 98/36406 A1 | 8/1998 |
| WO | WO 99/12394 A1 | 3/1999 |

OTHER PUBLICATIONS

Japanese Office Action re Application No. JP 2001-140325, dated Aug. 24, 2010.
Hatalis, M. et al., "VGA Active Matrix OLED Displays Having the Single Polysilicon TFT Pixel Structure," Proceedings of SPIE, Apr. 12, 1999, vol. 3636, pp. 22-31.
Japanese Office Action re Application No. JP 2015-116474, dated May 17, 2016.

* cited by examiner

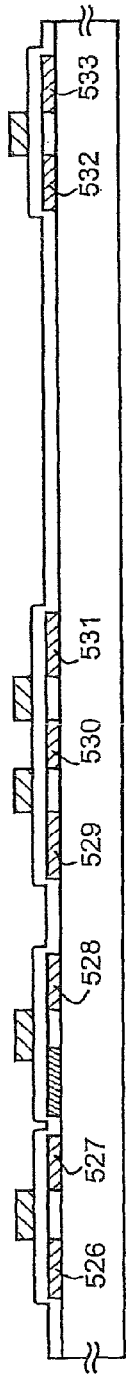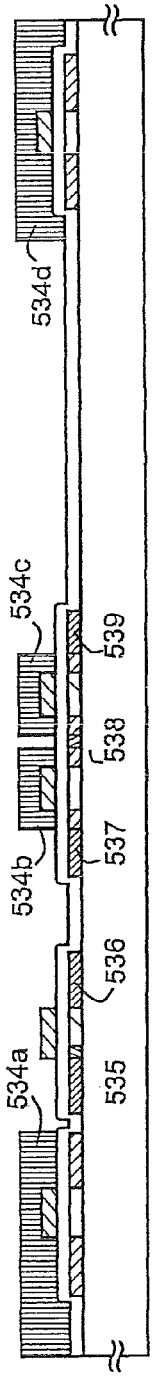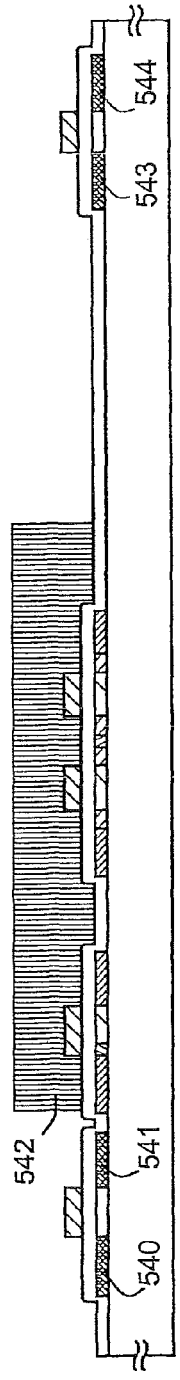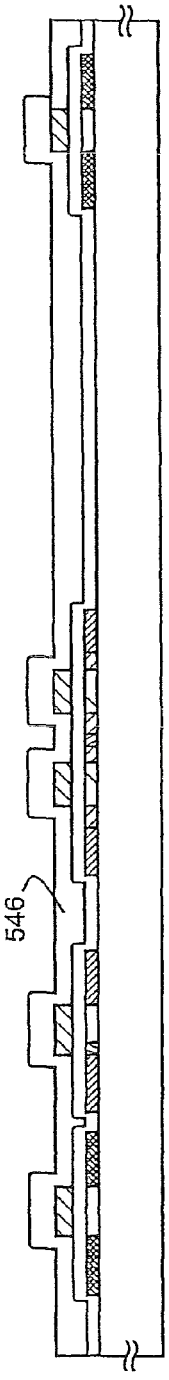

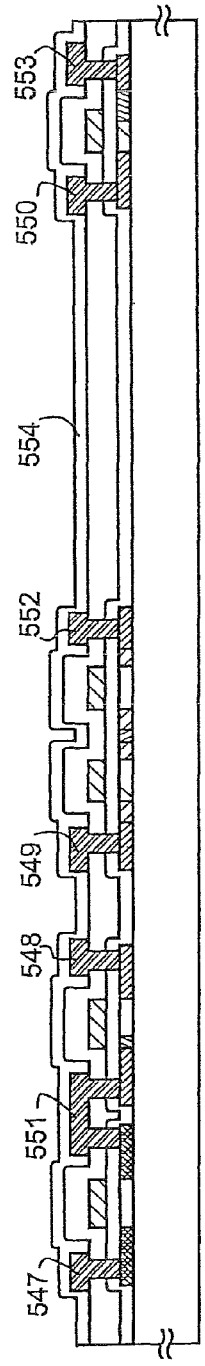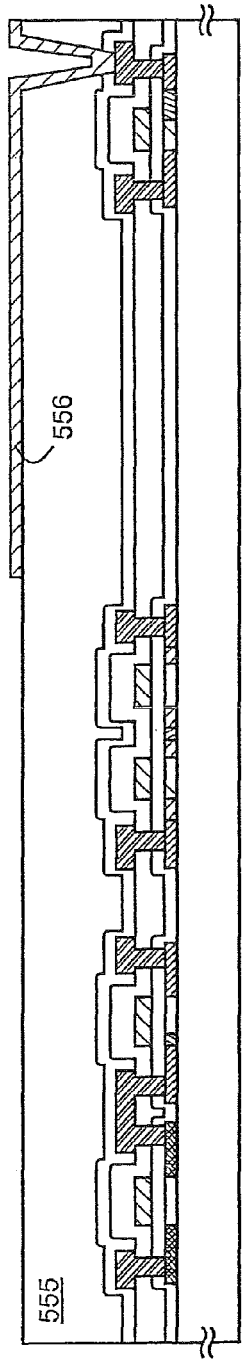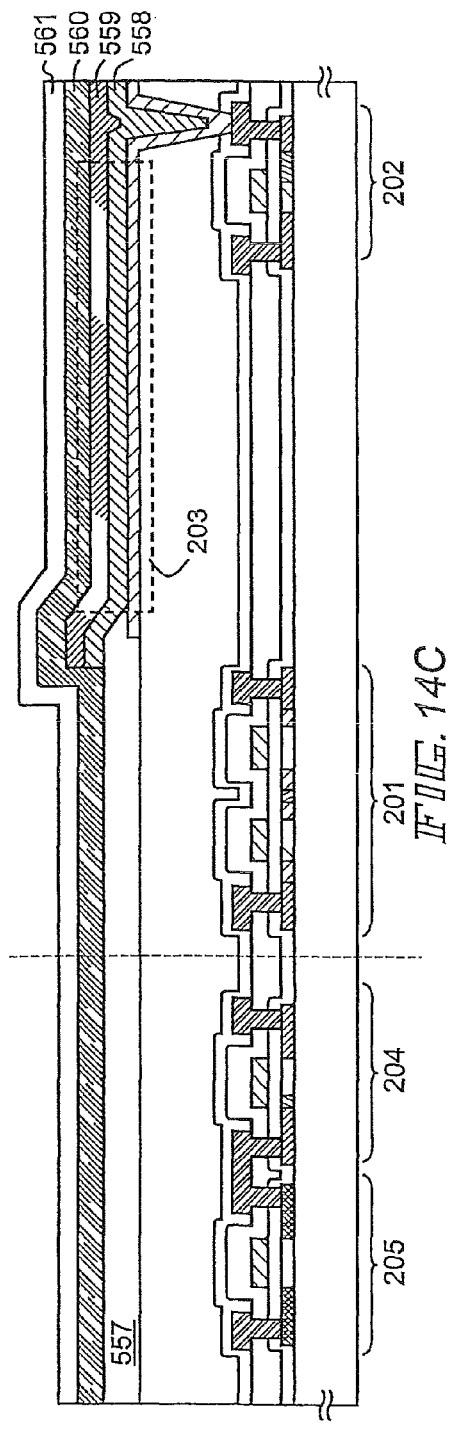

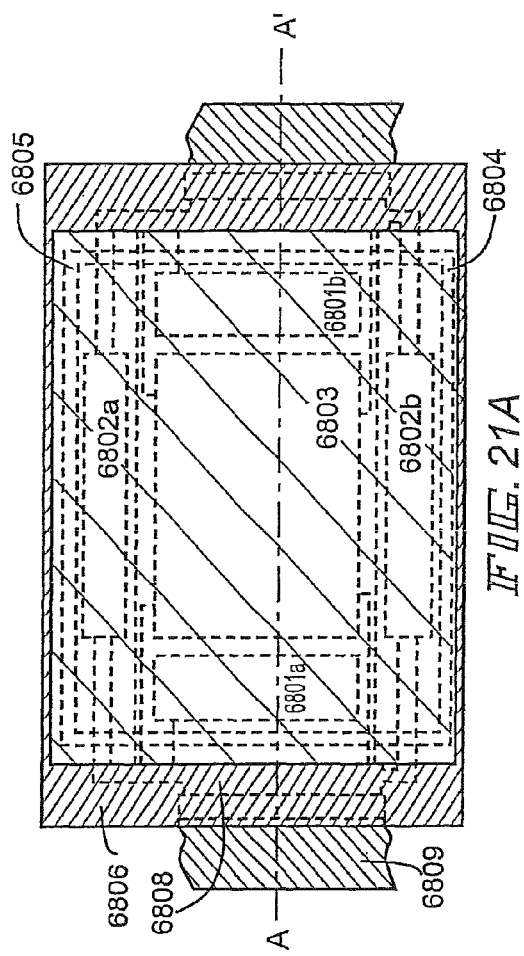
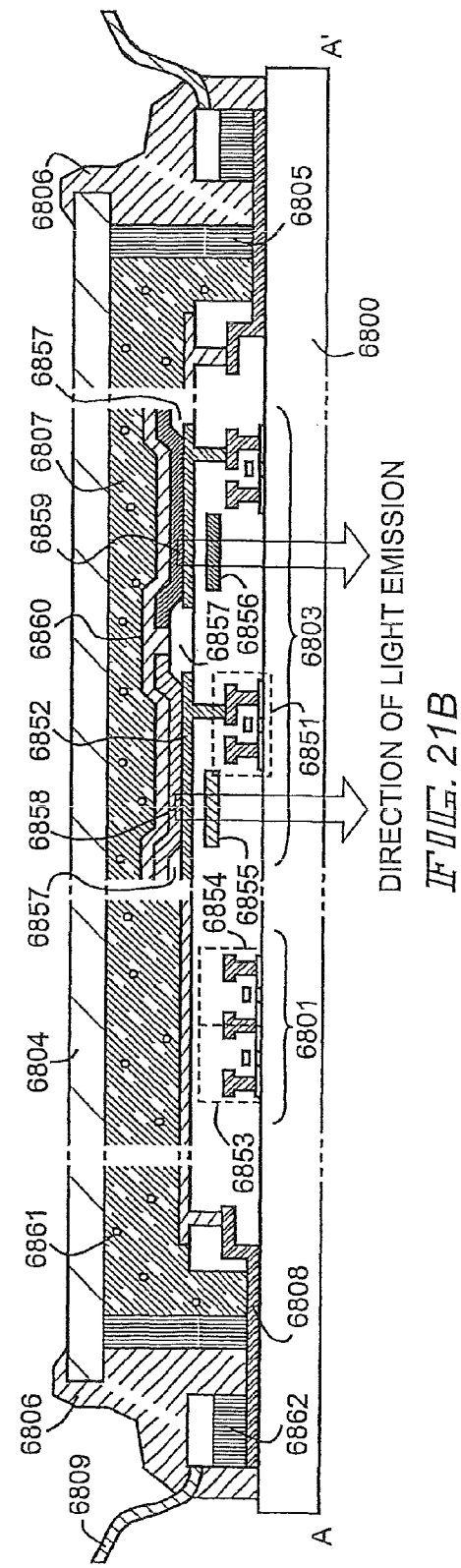
FIG. 21A
FIG. 21B
DIRECTION OF LIGHT EMISSION

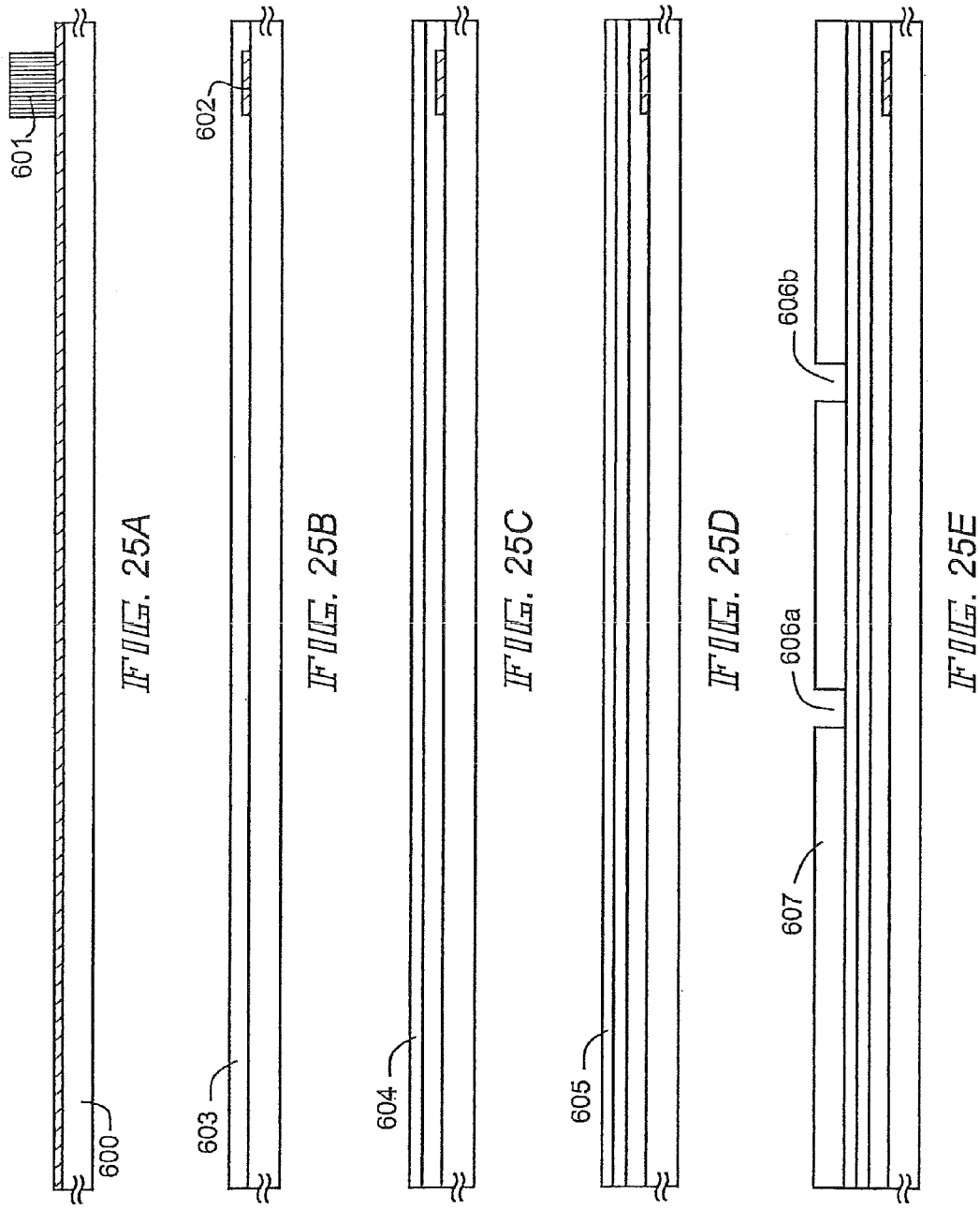

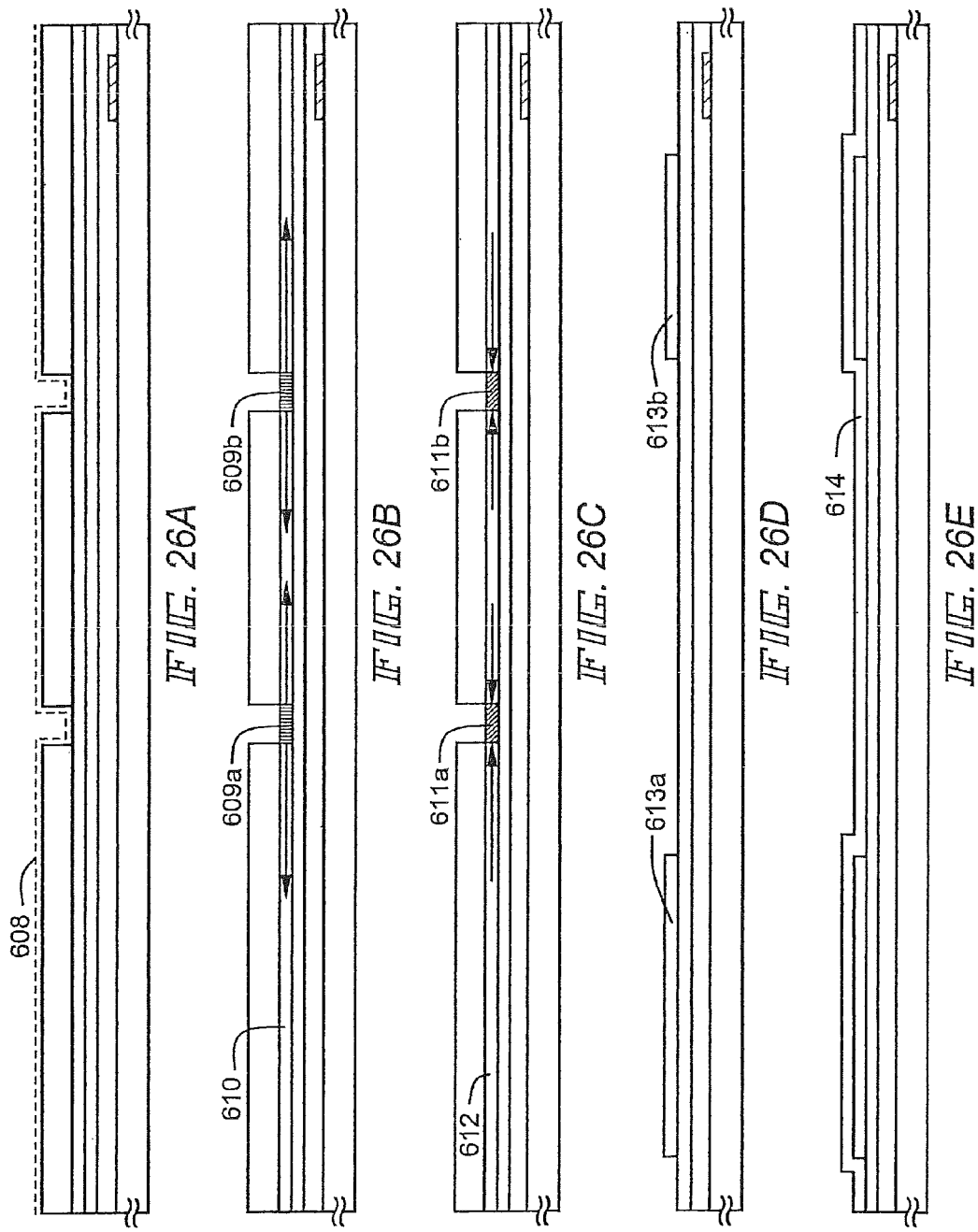

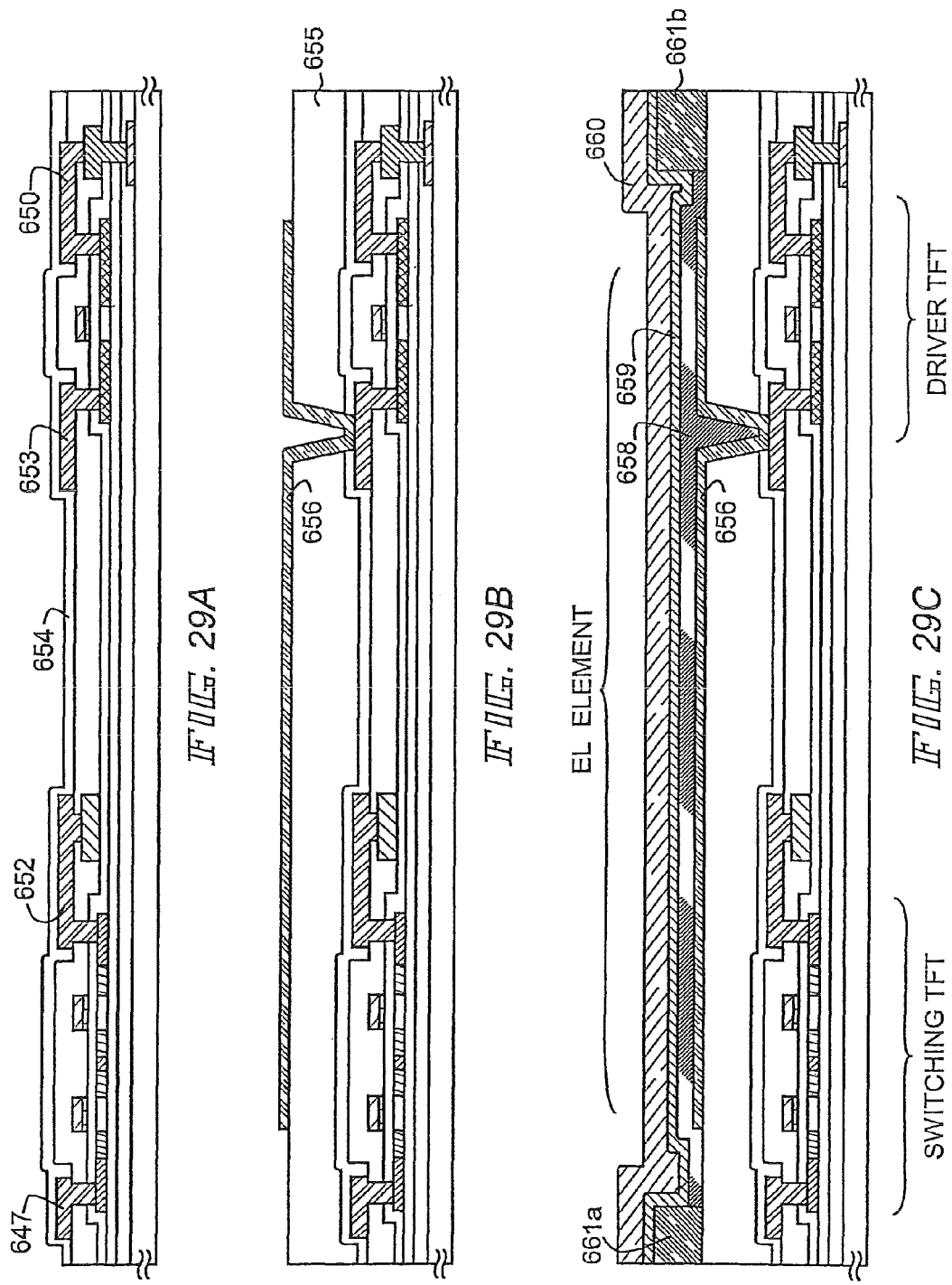

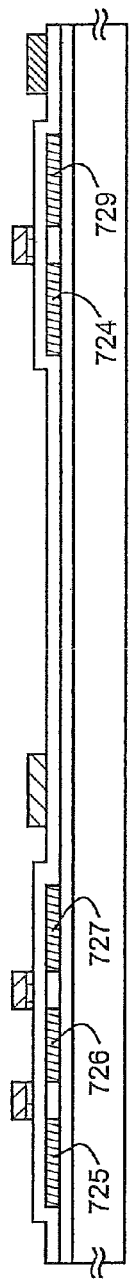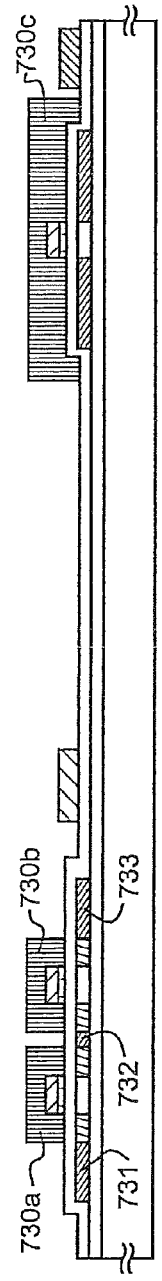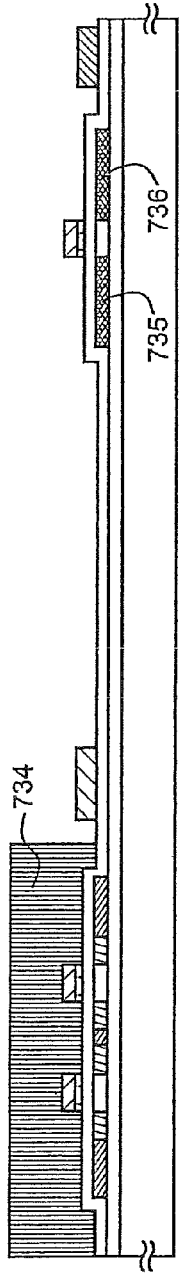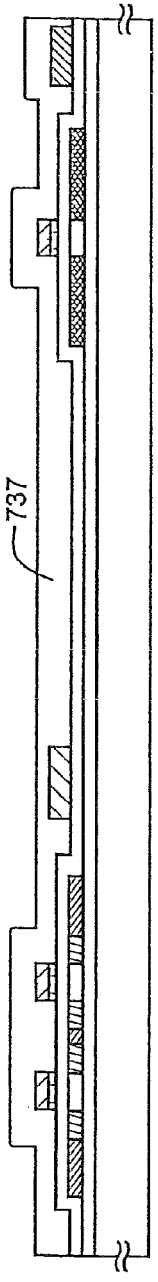

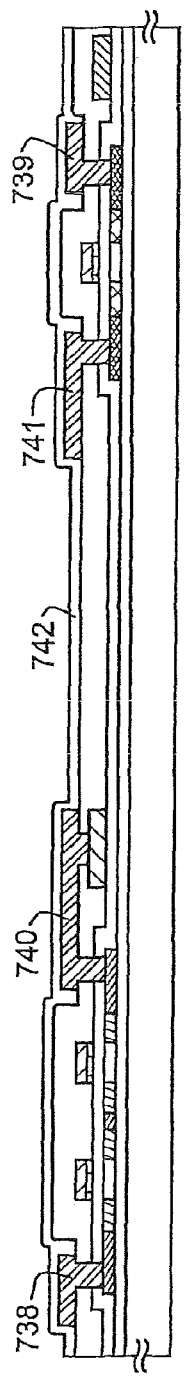
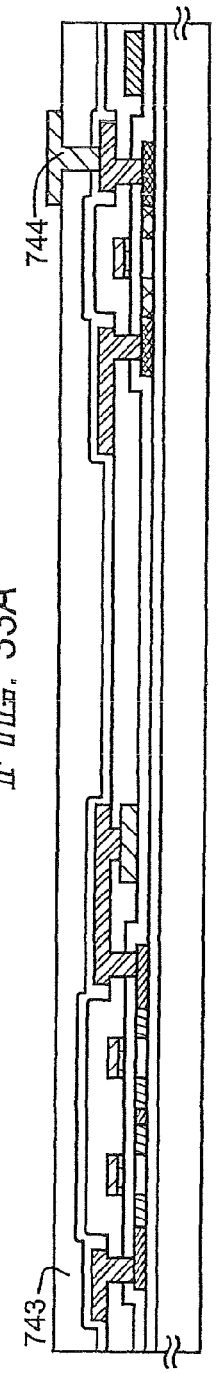
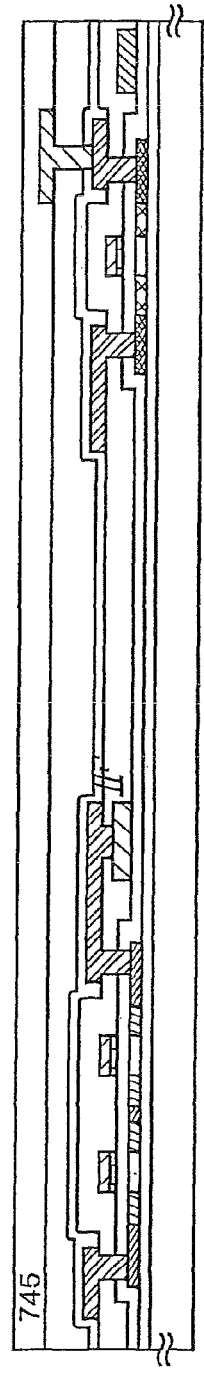
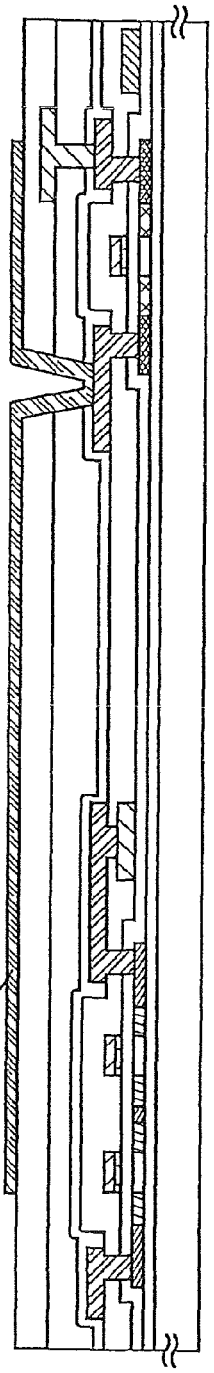
FIG. 33A
FIG. 33B
FIG. 33C
FIG. 33D

DISPLAY DEVICE

This application is a continuation of copending U.S. application Ser. No. 14/689,959 filed on Apr. 17, 2015 which is a continuation of U.S. application Ser. No. 14/107,498 filed on Dec. 16, 2013 (now U.S. Pat. No. 9,013,377 issued Apr. 21, 2015) which is a continuation of U.S. application Ser. No. 13/406,008 filed on Feb. 27, 2012 (now U.S. Pat. No. 8,610,645 issued on Dec. 17, 2013) which is a continuation of U.S. application Ser. No. 11/607,692 filed on Dec. 1, 2006 (now U.S. Pat. No. 8,125,415 issued Feb. 28, 2012) which is a continuation of U.S. application Ser. No. 10/813,591 filed on Mar. 30, 2004 (now U.S. Pat. No. 7,148,630 issued Dec. 12, 2006) which is a continuation of U.S. application Ser. No. 09/850,650, filed on May 7, 2001 (now U.S. Pat. No. 6,714,178 issued Mar. 30, 2004), all of which are incorporated herein by reference.

BACKGROUND OF THE INVENTION

1. Field of the Invention

The present invention relates to an electronic display (electro optical device) formed by fabricating an EL (electro luminescence) element on a substrate. Particularly, the present invention relates to a display device using a semiconductor element (an element employing a semiconductor thin film), and furthermore to electronic equipment using the EL display device as a display portion.

2. Description of the Related Art

In recent years, remarkable progress has been made in a technique for forming thin film transistors (hereinafter referred to as TFTs) on a substrate, and developing the application of TFTs to an active matrix display device is proceeding. TFTs using a polycrystalline semiconductor film such as poly-silicon film, in particular, have a higher electric field effect mobility (also referred to as mobility) than that of conventional TFTs using an amorphous semiconductor film such as an amorphous silicon film, and hence a high speed operation may be made. Thus, control of pixels, which in the past has been controlled by a driver circuit external to a substrate, can now be made by driver circuits formed on the same substrate as the pixels.

Various merits such as reduction of manufacturing cost, miniaturization of a display device, and increase of yield and reduction of throughput can be obtained from such an active matrix display device using a polycrystalline semiconductor film by forming various circuits and elements on the same substrate.

A research on active matrix EL display devices having an EL element as a self-luminous element is being actively carried out. The EL display device is also referred to as an organic EL display (OLED) or an organic light emitting diode (OLED).

The EL element has a structure composed of a pair of electrodes (anode and cathode) and an EL layer, which is usually a laminate structure, sandwiched therebetween. The laminate structure (hole transporting layer, light-emitting layer, electron transporting layer) proposed by Tang, et al. from Eastman Kodak Company can be cited as a typical laminate structure of the EL layer. This laminate structure has an extremely high luminescence efficiency, and therefore at present, most of the EL display devices in which research and development are proceeding adopt this laminate structure of the EL layer.

In addition to the above laminate structure, a structure in which the layers are laminated on the anode in the order of a hole injection layer, a hole transporting layer, a light-emitting layer, and an electron transporting layer or in the order of a hole injection layer, a hole transporting layer, a light-emitting layer, an electron transporting layer, and an electron injection layer may be formed. The light-emitting layer may be doped with a fluorescent pigment or the like.

The EL layer is a generic term in the present specification indicating all the layers formed between the cathode and anode. Therefore, the above-mentioned hole injection layer, the hole transporting layer, the light-emitting layer, the electron transporting layer, the electron injection layer, etc. are all included in the EL layer.

If a predetermined voltage from the pair of electrodes is applied to the EL layer having the above structure, a re-coupling of carriers in the light-emitting layer occurs to thereby emit light. It is to be noted that throughout the present specification, the emission of light by the EL element is called a drive by the EL element. In addition, a luminescent element formed of the anode, the EL layer, and the cathode is called the EL element in the present specification.

It is to be noted that an EL element as used herein includes one utilizing light emission from singlet excited state (fluorescence) and one utilizing light emission from triplet excited state (phosphorescence).

A driving method of the analog system (analog drive) can be cited as a driving method of the EL display device. An explanation regarding the analog drive of the EL display device will be made with references to FIGS. 18 and 19.

FIG. 18 is a diagram showing the structure of a pixel portion 1800 in the EL display device having the analog drive. A gate signal line (G1 to Gy) for inputting a selected signal from a gate signal line driver circuit is connected to a gate electrode of a switching TFT 1801 of the respective pixels. As to a source region and a drain region of the switching TFT 1801 of the respective pixels, one is connected to a source signal line (also called data signal line) (S1 to Sx) for inputting an analog video signal whereas the other is connected to a gate electrode of a driver TFT 1804 and a capacitor 1808 of each of the pixels, respectively.

A source region and a drain region of the driver TFT 1804 of each of the pixels is connected to power supply lines (V1 to Vx), and a drain region thereof is connected to an EL element 1806, respectively. An electric potential of the power supply lines (V1 to Vx) is called a power supply potential. Each of the power supply lines (V1 to Vx) is connected to the capacitor 1808 of the respective pixels.

The EL element 1806 is composed of an anode, a cathode, and an EL layer sandwiched therebetween. When the anode of the EL element 1806 is connected to either the source region or the drain region of the EL driver TFT 1804, the anode and the cathode of the EL element 1806 become a pixel electrode and an opposing electrode, respectively. Alternatively, if the cathode of the EL element 1806 is connected to either the source region or the drain region of the EL driver TFT 1804, then the anode of the EL element 1806 becomes the opposing electrode whereas the cathode thereof becomes the pixel electrode.

It is to be noted that the electric potential of an opposing electrode is herein referred to as opposing potential. It is to be noted that a power supply for giving opposing potential to an opposing electrode is herein referred to as an opposing power supply. The difference between the electric potential of a pixel electrode and the electric potential of an opposing electrode is the EL driving voltage, which is applied to the EL layer.

FIG. 19 is a timing chart illustrating the EL display shown in FIG. 18 when it is being driven by the analog system. A period from the selection of one gate signal line to the selection of a next different gate signal line is called a 1 line period (L). In addition, a period from the display of one image to the display of the next image corresponds to a 1 frame period (F). In the case of the EL display device of FIG. 18, there are y number of the gate signal lines and thus a y number of line periods (L1 to Ly) are provided in 1 frame period.

Because the number of line periods in 1 frame period increases as resolution becomes higher, driver circuits must be driven at a high frequency.

First of all, the power supply lines (V1 to Vx) are held at a constant power supply potential, and the opposing electric potential that is the electric potential of the opposing electrode is also held at a constant electric potential. There is a difference in electric potential between the opposing electric potential and the power supply potential to a degree that the EL element can emit light.

A selected signal from the gate signal line driver circuit is inputted to the gate signal line G1 in the first line period (L1). An analog video signal is then sequentially inputted to source signal lines (S1 to Sx). All the switching TFTs connected to the gate signal line G1 are turned on to thereby input the analog video signal that is inputted to the source signal lines to the gate electrode of the driver TFT through the switching TFT.

The amount of electric current through the channel forming region of a TFT for driving is controlled by its gate voltage.

Here, description is made with regard to, by way of example, a case where the source regions of the TFTs for driving are connected to the power supply lines and the drain regions of the TFTs for driving are connected to the EL elements.

Since the source regions of the TFTs for driving are connected to the power supply lines, the same electric potential is inputted to the respective pixels of the pixel portion. At this point, when an analog signal is inputted to a source signal line, the difference between the electric potential of the signal voltage and the electric potential of the source region of the TFT for driving becomes the gate voltage. The electric current through an EL element depends on the gate voltage of the TFT for driving. Here, the brightness of the emitted light from an EL element is proportional to the electric current between the electrodes of the EL element. In this way, the EL elements emit light under the control of the voltage of analog video signals.

The operation described in the above is repeated. When input of analog video signals to the source signal lines (S1-Sx) is completed, the first line period (L1) ends. It is to be noted that the period until the input of analog video signals to the source signal lines (S1-Sx) is completed combined with a horizontal retrace line period may be a one line period. Then, in the second line period (L2) that follows, a selection signal is inputted to the gate signal line G2. Similarly to the case of the first line period (L1), analog video signals are sequentially inputted to the source signal lines (S1-Sx).

When selection signals are inputted to all the gate signal lines (G1-Gy), all the line periods (L1-Ly) end. When all the line periods (L1-Ly) end, one frame period ends. In one frame period, all the pixels carries out display to form one image. It is to be noted that all the line periods (L1-Ly) combined with a vertical retrace line period may be a one frame period.

As described in the above, the amount of light emitted from an EL element is controlled by an analog video signal, and, by controlling the amount of light emission, gradation display is carried out. This is a so-called analog driving method, where gradation display is carried out by changing the voltage of analog video signals inputted to the source signal lines.

FIG. 20 is a graph illustrating characteristics of a TFT for driving. 401 is referred to as Id-Vg characteristics (or an Id-Vg curve), wherein Id is drain current and Vg is gate voltage. Using this graph, the amount of electric current with regard to arbitrary gate voltage can be known.

In driving an EL element, a region shown by a dotted line 402 of the above Id-Vg characteristics is normally used. The region surrounded by the dotted line 402 is referred to as a saturated region where the drain current Id greatly changes as the gate voltage Vg changes.

In the analog driving method, using the saturated region, the drain current of a TFT for driving is changed by changing its gate voltage.

When a TFT for switching is turned on, an analog video signal inputted from a source signal line to a pixel is applied to a gate electrode of a TFT for driving. In this way, the gate voltage of the TFT for driving is changed. Here, according to the Id-Vg characteristics illustrated in FIG. 20, the drain current with regard to a certain gate voltage is uniquely decided. In this way, predetermined drain current corresponding to the voltage of the analog video signal inputted to the gate electrode of the TFT for driving passes through the EL element, and the EL element emits light the amount of which corresponds to the amount of the electric current.

In this way, the amount of light emitted from the EL element is controlled by an analog video signal, and, by controlling the amount of light emission, gradation display is carried out.

Here, even when the same signal is inputted from the source signal line, the gate voltage of the TFT for driving of each pixel changes if the electric potential of the source region of the TFT for driving changes. Here, the electric potential of the source region of the TFT for driving is given from the power supply line. However, due to potential drop caused by wiring resistance, the electric potential of the power supply line changes depending on its position in the pixel portion.

In addition to the influence of the potential drop caused by wiring resistance of the power supply line in the pixel portion, there is also a problem of potential drop of the connection wiring portion (hereinafter referred to as a power supply line connection wiring portion) from an input portion of the power supply from the external (hereinafter referred to as an external input terminal) to the power supply line of the pixel portion.

More specifically, depending on the length of the wiring from the position of the external input terminal to the position of the power supply line of the pixel portion, the electric potential of the power supply line varies.

Here, this may not present a great problem in such a case where the wiring resistance of the power supply line is small, the display device is relatively small, or the amount of electric current passing through the power supply line is relatively small. Otherwise however, especially when the display device is relatively large, the change in the electric potential of the power supply line due to the wiring resistance becomes large.

In particular, as the display device becomes larger, the variation in the distance from the external input terminal to the power supply line of the pixel portion becomes larger, and the variation in the length of the wiring of the power supply line drawn-around portion becomes larger accordingly. Therefore, the change becomes larger in the electric potential of the power supply line due to the potential drop of the power supply line connection portion.

The variation in the electric potential of the power supply lines due to these factors affects the brightness of the emitted light from the EL elements of the pixels by changing the brightness of the display, and thus, is a cause of uneven display.

A specific example of such variation in the electric potential of the power supply lines is described in the following.

As illustrated in FIG. 23, when a white or black box is displayed on a display, a phenomenon referred to as cross talk arises. This is a phenomenon that difference in the brightness arises over or under the box compared with portions beside the box.

FIGS. 40 and 41 are a partial circuit diagram and a top surface view, respectively, of a pixel portion of a conventional display device where the phenomenon arises.

In FIG. 41, like reference numerals designate like parts in FIG. 40, and the description thereof is omitted.

Each pixel is fouled of a TFT 4402 for switching, a TFT 4406 for driving, a storage capacitor 4419, and an EL element 4414.

It is to be noted that, although the TFT 4402 for switching is of a double gate structure in FIGS. 40 and 41, it may be of the other structures.

Cross talk arises due to the difference in electric current through the TFT 4406 for driving between each pixel over and under the box and beside the box. The difference arises because the power supply lines V1 and V2 are disposed in parallel with the source signal lines S1 and S2.

For example, as shown in FIG. 23, when a white box is displayed in a part of the display in the power supply line corresponding to the pixel displaying the box, since current flows through the EL element between the source and the drain of the TFT for driving of the pixel displaying the box, the potential drop due to the wiring resistance of the power supply line is greater than that of the power supply line which supplies power only to pixels which do not display the box. Therefore, portions darker than other pixels which do not display the box are generated over and under the box.

Further, in a conventional active matrix EL display device, as shown in FIG. 24, the power supply line is drawn out from one direction of the display device, and power supply, signals, and the like are inputted from an input portion.

Here, even if the size of the display of the display device is small, no particular problem arises. However, as the size of the display of the display device becomes larger, the current consumption increases in proportion to the area of the display.

For example, the current consumption of a display device having a 20-inch display is 25 times as much as that of a display device having a 4-inch display.

Therefore, the potential drop described in the above is a big problem for a display device having a large-sized display.

Further, while the potential drop with regard to a power supply line near the input portion (a in FIG. 24) is not so great, with regard to a power supply line far from the input portion (b in FIG. 24), since the length of the wiring is large, the potential drop caused due to the wiring resistance is large. Therefore, voltage applied to EL elements of pixels having TFTs for driving which are connected to the power supply line (b in FIG. 24) is lowered to deteriorate the quality of the image.

For example, in a 20-inch display device, when the length of the wiring is 700 mm, the width of the wiring is 10 mm, and the sheet resistance is 0.1 ohm, if about 1 A of current passes, the potential drop is as much as 10 V, with which normal display is impossible.

SUMMARY OF THE INVENTION

The present invention is made in view of the above, and an object of the present invention is to provide an active matrix EL display device capable of vivid color display with multiple gradations. Another object of the present invention is to provide a high performance electronic apparatus (electronic device) using such an active matrix EL display device.

The present inventor conceived a method of alleviating potential drop due to wiring resistance of a power supply line, in particular, potential drop due to wiring resistance at a portion where the power supply line is drawn out.

Structures according to the present invention are described in the following.

According to the present invention, a display device is provided which comprises a plurality of source signal lines, a plurality of gate signal lines, a plurality of power supply lines, and a plurality of pixels disposed like a matrix, said source signal lines, said gate signal lines, said power supply lines, and said pixels being on an insulating surface, and said plurality of pixels being formed of thin film transistors for switching, thin film transistors for driving, and EL elements, characterized in that:

said display device has a plurality of drawing-out openings;

said plurality of power supply lines are drawn around to said plurality of drawing-out openings;

electric potential is given to said plurality of power supply lines at said plurality of drawing-out openings; and said drawing-out openings are provided in at least two directions of said display device.

According to the present invention, a display device is provided which comprises a plurality of source signal lines, a plurality of gate signal lines, a plurality of power supply lines, and a plurality of pixels disposed like a matrix, said source signal lines, said gate signal lines, said power supply lines, and said pixels being on an insulating surface, and said plurality of pixels being formed of thin film transistors for switching, thin film transistors for driving, and EL elements, characterized in that:

said display device has a drawing-out opening;

said drawing-out opening has a plurality of external input terminals;

five to fifty of said plurality of power supply lines are collected together in one unit and are drawn around to said plurality of external input terminals; and electric potential is given to said plurality of power supply lines at said plurality of external input terminals.

According to the present invention, a display device is provided which comprises a plurality of source signal lines, a plurality of gate signal lines, a plurality of power supply lines, and a plurality of pixels disposed like a matrix, said source signal lines, said gate signal lines, said power supply lines, and said pixels being on an insulating surface, and said plurality of pixels being formed of thin film transistors for switching, thin film transistors for driving, and EL elements, characterized in that:

said display device has an external input terminal;

said plurality of power supply lines are drawn around to said external input terminal; and an electric potential is given to said plurality of power supply lines through said external input terminal by a feedback amplifier in a feedback loop.

A display device may be characterized in that said plurality of power supply lines are disposed like a matrix.

A display device may be characterized in that said plurality of power supply lines are formed of a wiring layer forming said source signal lines and a wiring layer forming said gate signal lines.

A display device may be characterized in that said plurality of power supply lines are formed of a wiring layer different from a wiring layer forming said source signal lines, and a wiring layer forming said gate signal lines.

A display device may be characterized in that said plurality of power supply lines are formed of a wiring layer different from a wiring layer forming said gate signal lines, and a wiring layer forming said source signal lines.

A display device may be characterized in that said plurality of power supply lines are formed of a wiring layer different from both a wiring layer forming said gate signal lines and a wiring layer forming said source signal lines.

A display device may be characterized in that the number of said plurality of power supply lines in a column direction is smaller than the number of said plurality of pixels in a column direction.

A display device may be characterized in that the number of said plurality of power supply lines in a row direction is smaller than the number of said plurality of pixels in a row direction.

A display device may be characterized in that a diagonal line of a display portion of said display device is 20 inch or longer.

A personal computer, a telereceiver, a video camera, an image reproduction device, a heat mount display or a portable information terminal may be characterized by applying the display device.

BRIEF DESCRIPTION OF THE DRAWINGS

In the accompanying drawings:

FIGS. 13A to 13D show the manufacturing process of the display device of the present invention;

FIGS. 14A to 14C show the manufacturing process of the display device of the present invention;

FIG. 21A shows the top view of the display device of the present invention and FIG. 21B shows the cross section of the display device of the present invention;

FIGS. 25A to 25E show the manufacturing process of the display device of the present invention;

FIGS. 26A to 26E show the manufacturing process of the display device of the present invention;

FIGS. 29A to 29C show the manufacturing process of the display device of the present invention;

FIGS. 32A to 32D show the manufacturing process of the display device of the present invention;

FIGS. 33A to 33D show the manufacturing process of the display device of the present invention;

DETAILED DESCRIPTION OF THE PREFERRED EMBODIMENTS

Structures of display devices according to the present invention are now described in the following.

Embodiment Mode 1

Power supply lines of a pixel portion is drawn out to the external not in one direction but in a plurality of directions.

Embodiment Mode 1 is described with reference to FIG. 1.

Figure 1:
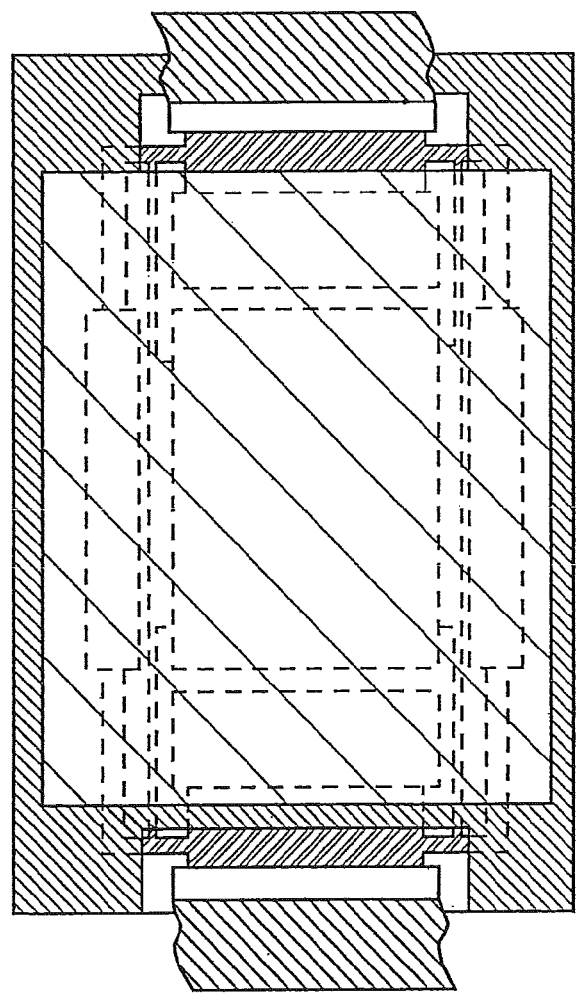
FIG. 1 shows the drawing out openings of the display device of the present invention.

As illustrated in FIG. 1, the power supply lines are drawn out in two directions, i.e., from a power supply line input portion 1 and a power supply line input portion 2.

An input portion as used herein shall mean a portion formed of a plurality of external input terminals and through which power supply potential, picture signals, and the like are inputted from the external to the display device.

By drawing out the power supply lines in two directions of the display device in this way, compared with a case where the power supply lines are drawn out in one direction, the length of the wiring from the power supply lines of the pixel portion to the external input terminals can be shorter and the variation in the length of the wiring can be decreased.

By the above structure, the influence of the potential drop at the drawn-around portion of the power supply lines around the pixel portion can be decreased.

Embodiment Mode 2

In the present embodiment mode, a small number of wirings of an input portion of power supply lines are collected together in a unit and the respective units are drawn out to a plurality of external input terminals which are not next to each other and which are at respective input portions.

Figure 4:
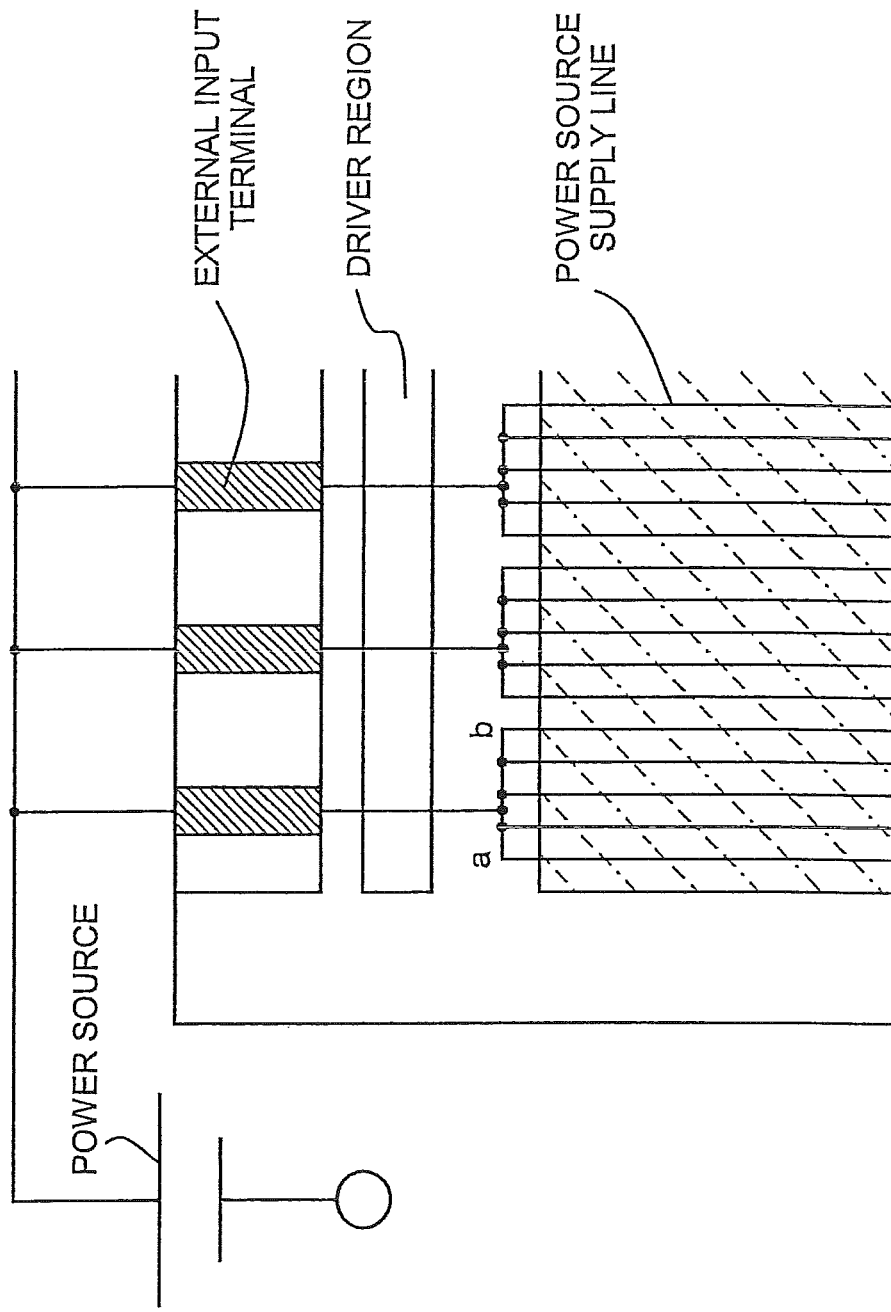
FIG. 4 shows the shape of the drawing out port of the power source supply line of the display device of the present invention.

A structure of the present embodiment mode is illustrated in FIG. 4.

In the present embodiment mode, compared with a case where all the power supply lines of a pixel portion are collected together in one unit to be drawn out to one external input terminal, the length of the wiring from the respective collected power supply lines to the external input terminals can be shorter and the variation in the length of the wiring can be decreased.

Figure 35:
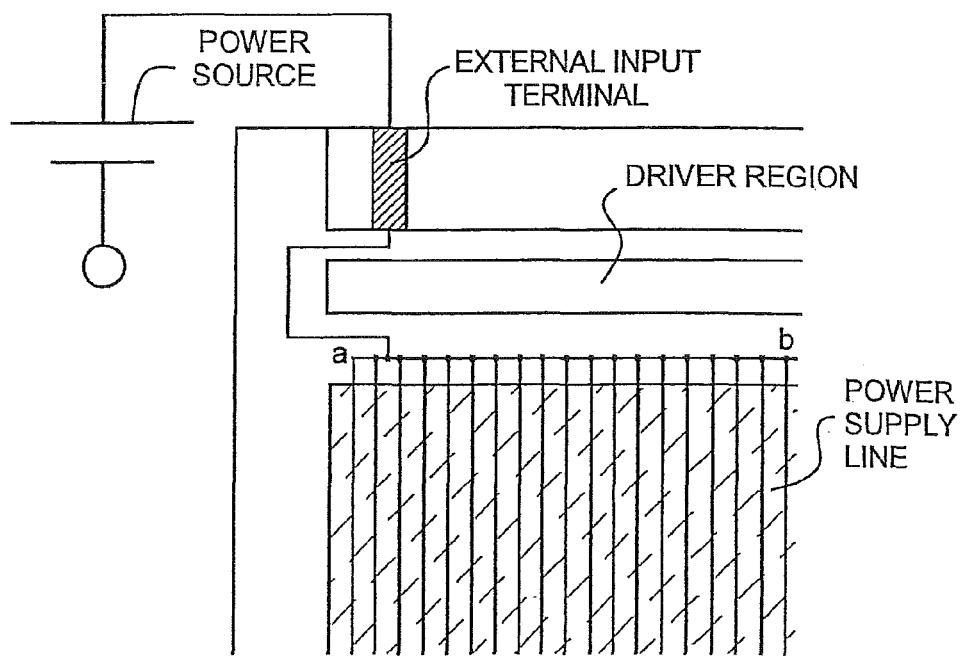
FIG. 35 shows the shape of the drawing out port of the power source supply line of the conventional display device of the present invention.

More specifically, the difference in length between wirings a and b in FIG. 4 is greatly decreased compared with the difference in length between wirings a and b in FIG. 35.

By the above structure, the influence of the potential drop at the drawn-around portion of the power supply lines around the pixel portion can be decreased.

Embodiment Mode 3

As described in the above, the amount of electric current through power supply lines can be large in a large-sized display device. In such a case, the influence of potential drop due to wiring resistance between a pixel region and external input terminals is not negligible.

One countermeasure for this would be increasing in advance the potential of an external power supply. However, since electric current through the power supply lines changes depending on what is displayed, it is not desirable to uniformly increase the potential of the external power supply. Therefore, in the present embodiment mode, it is proposed to use a feedback amplifier and to include wiring causing potential drop in a feedback loop.

Figure 5:
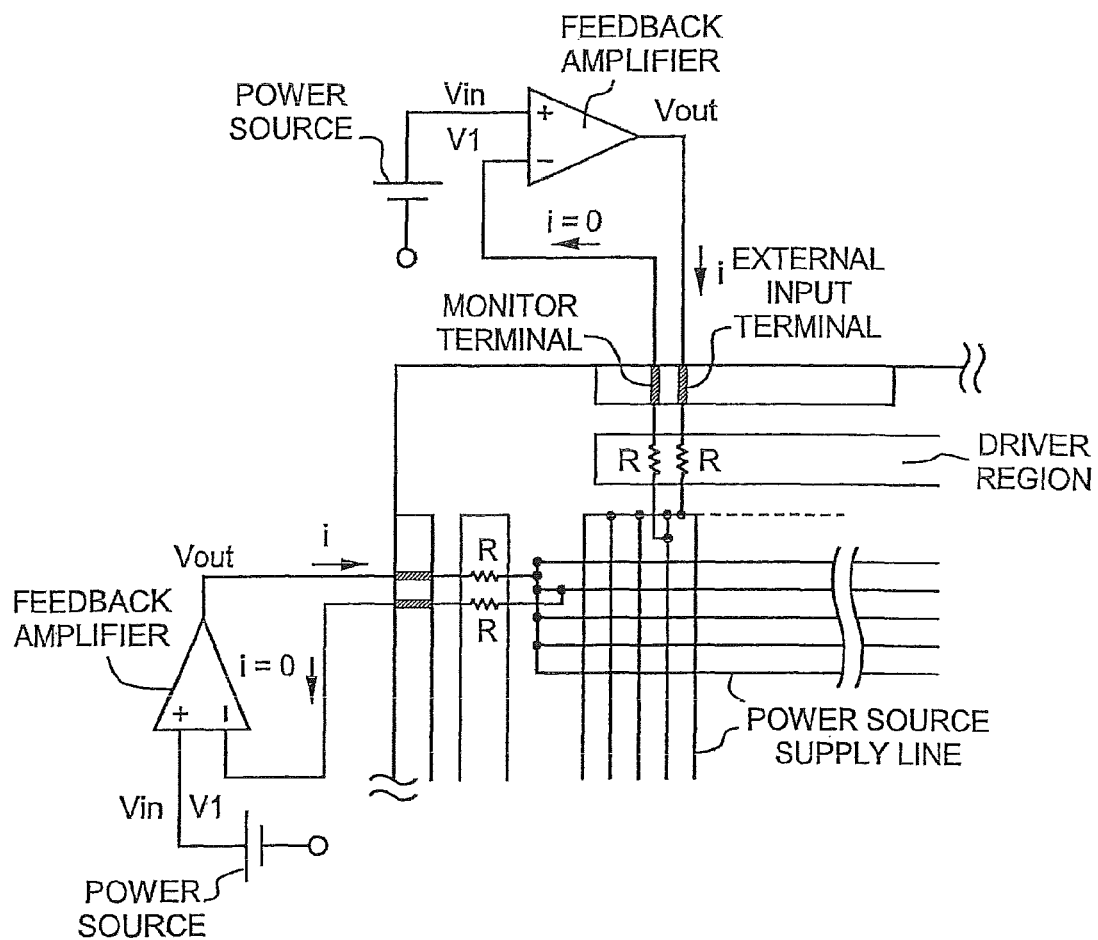
FIG. 5 shows the driving method of the display device of the present invention.

As illustrated in FIG. 5, an external input terminal is connected to an output of a feedback amplifier. Voltage to be applied to power supply lines is inputted to a noninverting input terminal (+) of a feedback amplifier. Electric potential of the power supply lines of the pixel portion is monitored and is applied to an inverting input terminal (−). According to the principle of the feedback amplifier, the noninverting input terminal and the inverting input terminal are operated to be at the same electric potential, and thus, electric potential higher by the potential drop is outputted from an output terminal of the feedback amplifier. As described in the above, potential compensation is carried out to cancel the gap in the electric potential.

When the wiring resistance of the power supply line input portion is R and the electric current is i, potential drop of Ri arises. However, at the monitor terminal, since almost no electric current passes through the monitor terminal, no potential drop arises.

Note that the feedback amplifier comprising an external IC is formed over an external substrate after forming a panel having the pixel region.

Embodiment Mode 4

Figure 2:
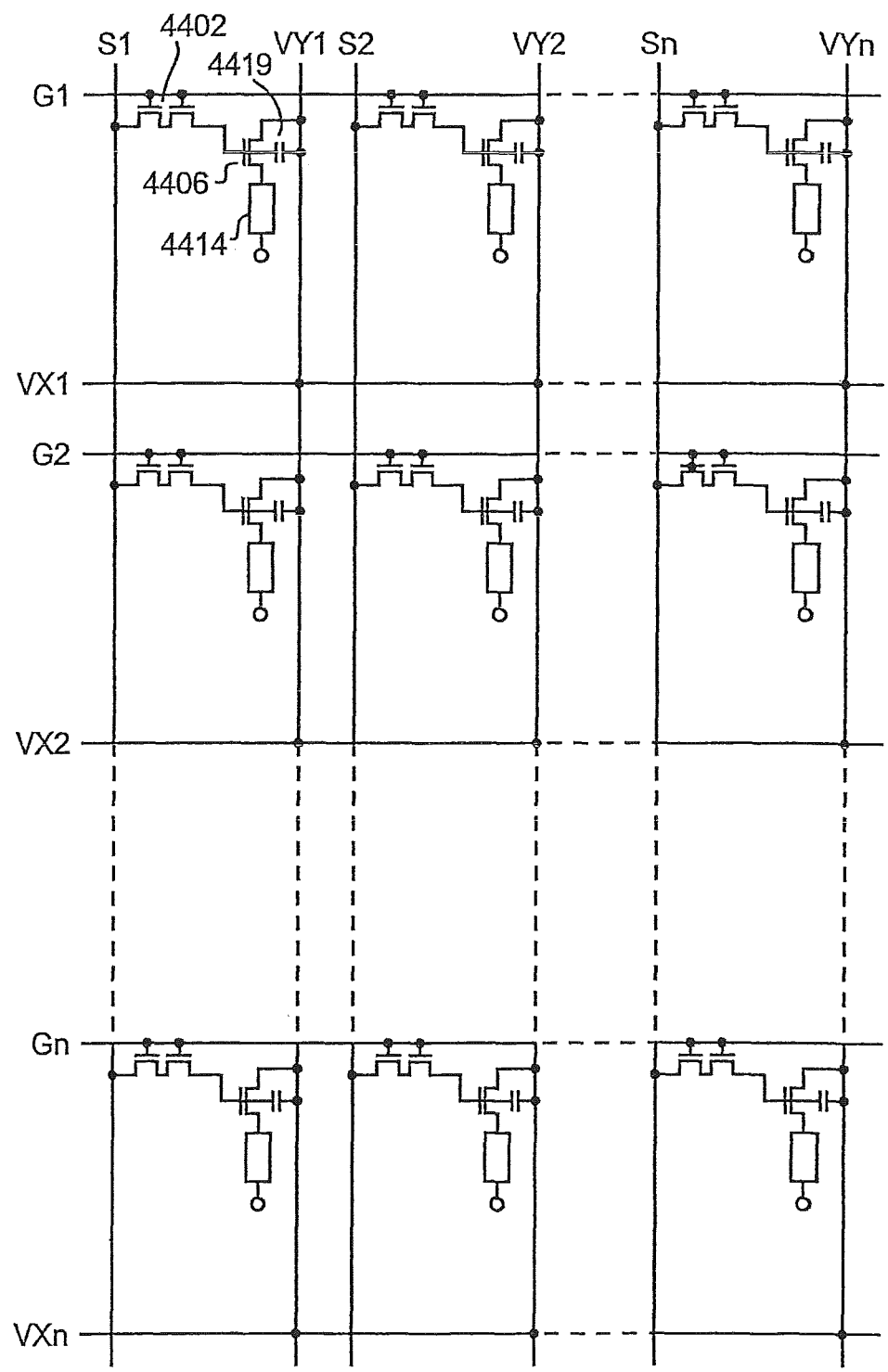
FIG. 2 shows the circuit structure of the pixel portion of the display device of the present invention.

FIG. 2 is a circuit diagram illustrating a structure of a pixel portion according to the present invention.

Each pixel of the pixel portion is formed of a TFT 4402 for switching, a TFT 4406 for driving, a storage capacitor 4419, and an EL element 4414. Power supply lines (VX1-VXn and VY1-VYn) are disposed not only in a direction in parallel with source signal lines (S1-Sn) but also in a direction perpendicular to them. Therefore, voltage is supplied to either a source region or a drain region of the TFT 4406 for driving of the pixel from the respective directions. Since electric current through the EL element 4414 is supplied not only from the direction in parallel with the source signal lines S1-Sn but from the direction perpendicular to them, occurrence of conventional cross talk can be suppressed.

Here, the power supply lines are shared between pixels next to each other. This can decrease the area occupied by the power supply lines in the respective pixels. Therefore, the opening ratio can be improved even with regard to a pixel having a structure where power supply lines are disposed both vertically and horizontally (like a matrix).

Embodiment Modes 1 to 4 can be freely combined with each other to be implemented.

EMBODIMENTS

Embodiments of the present invention are described in the following.

Embodiment 1

FIG. 4 illustrates an example where a small number of power supply lines are collected together in one unit and are connected to an external input terminal, which is described in Embodiment 2.

Since the potential drop becomes larger as the size of the display becomes larger, it is necessary to make the wirings as short as possible which draw out the power supply lines.

According to the present invention, a small number of power supply lines are collected together in one unit, and are outputted to an adjacent external input terminal.

In the example illustrated in FIG. 4, a small number of power supply lines are collected together in one unit, and are connected to an external input terminal through a driver region. In this way, the wiring resistance is decreased.

It is desirable that about five to fifty power supply lines are collected together in one unit.

Embodiment 2

Figure 3:
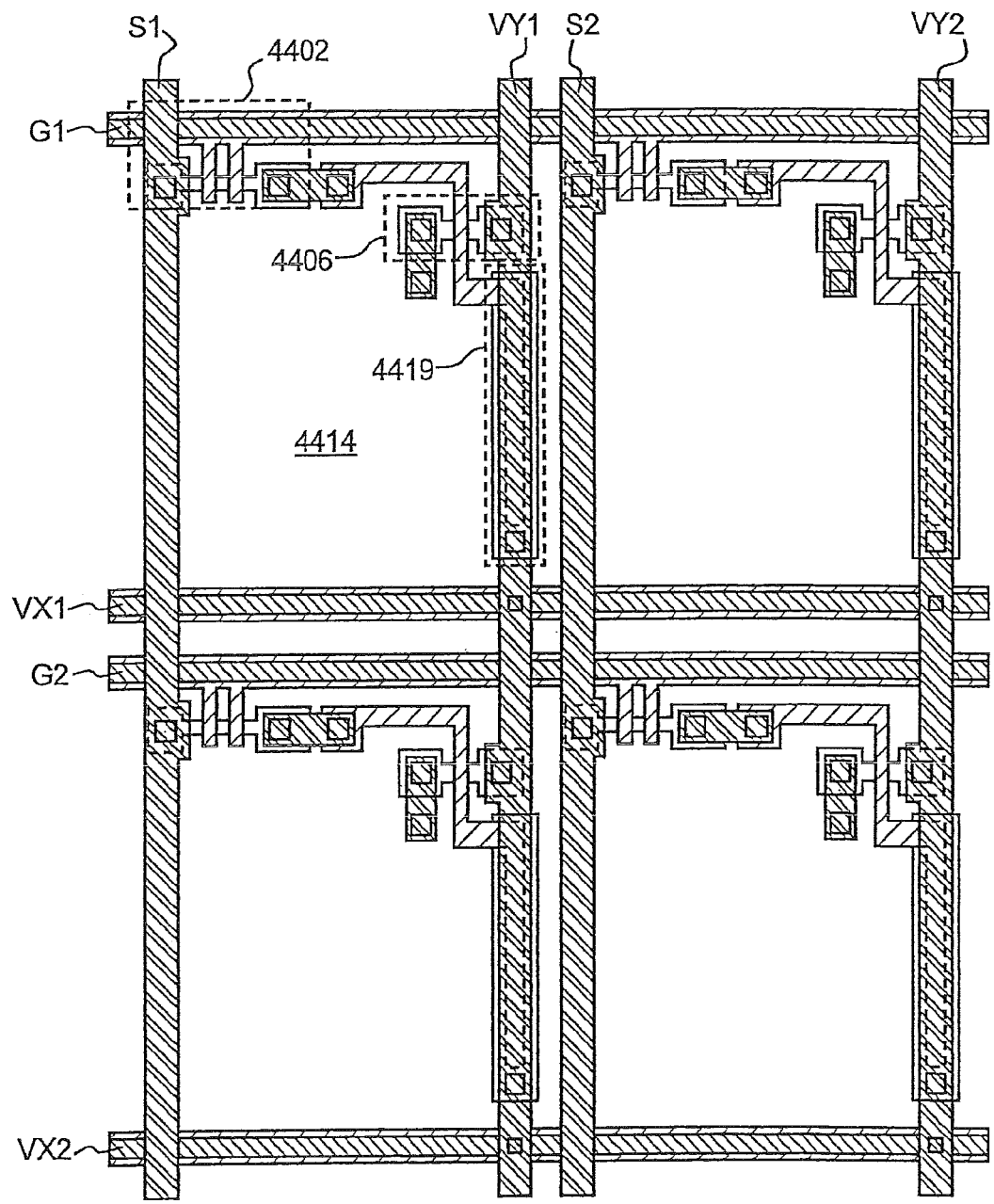
FIG. 3 shows the top view of the pixel portion of the display device of the present invention.

FIG. 3 is a top view of a part (four pixels) of the pixel portion of the circuit diagram illustrated in FIG. 2 as an embodiment of the present invention.

It is to be noted that like reference numerals designate like parts in FIG. 2.

Each pixel is formed of a TFT 4402 for switching, a TFT 4406 for driving, a capacitor 4419, and an EL element 4414. In this embodiment, power supply lines VX1 and VX2 are disposed in parallel with gate signal lines G1 and G2 using a wiring material similar to that of the gate signal lines G1 and G2. The power supply lines VX1 and VX2 are connected through contact holes to conventional power supply lines VY1 and VY2 in parallel with the source signal lines S1 and S2.

A structure where power supply lines in parallel with the gate signal lines are formed using a wiring layer forming the gate signal lines as the present embodiment is herein referred to as Embodiment 1 of a pixel structure according to the present invention.

Figure 40:
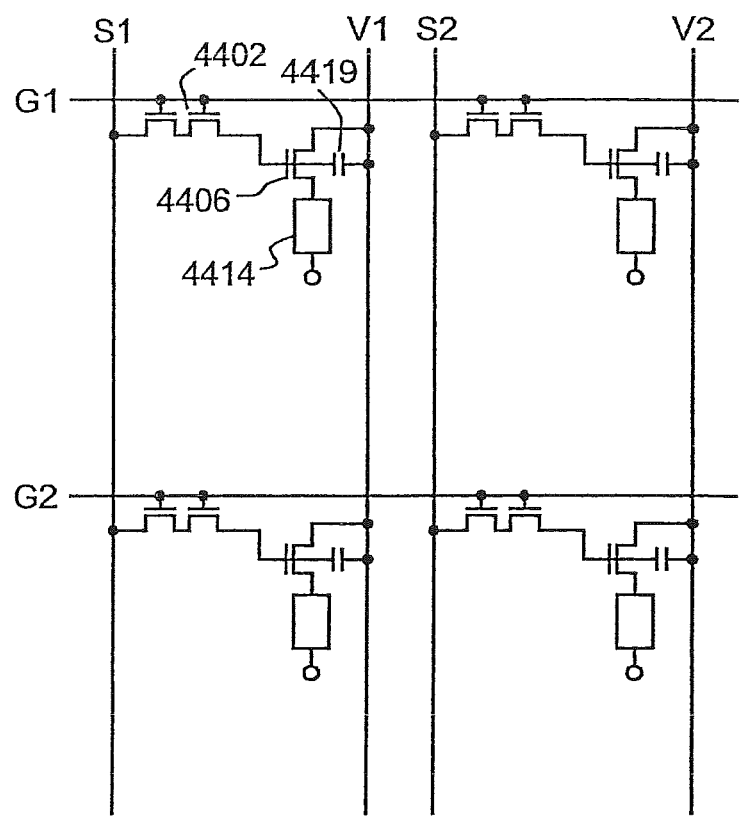
FIG. 40 shows the circuit diagram of the pixel portion of the conventional display device.
Figure 41:
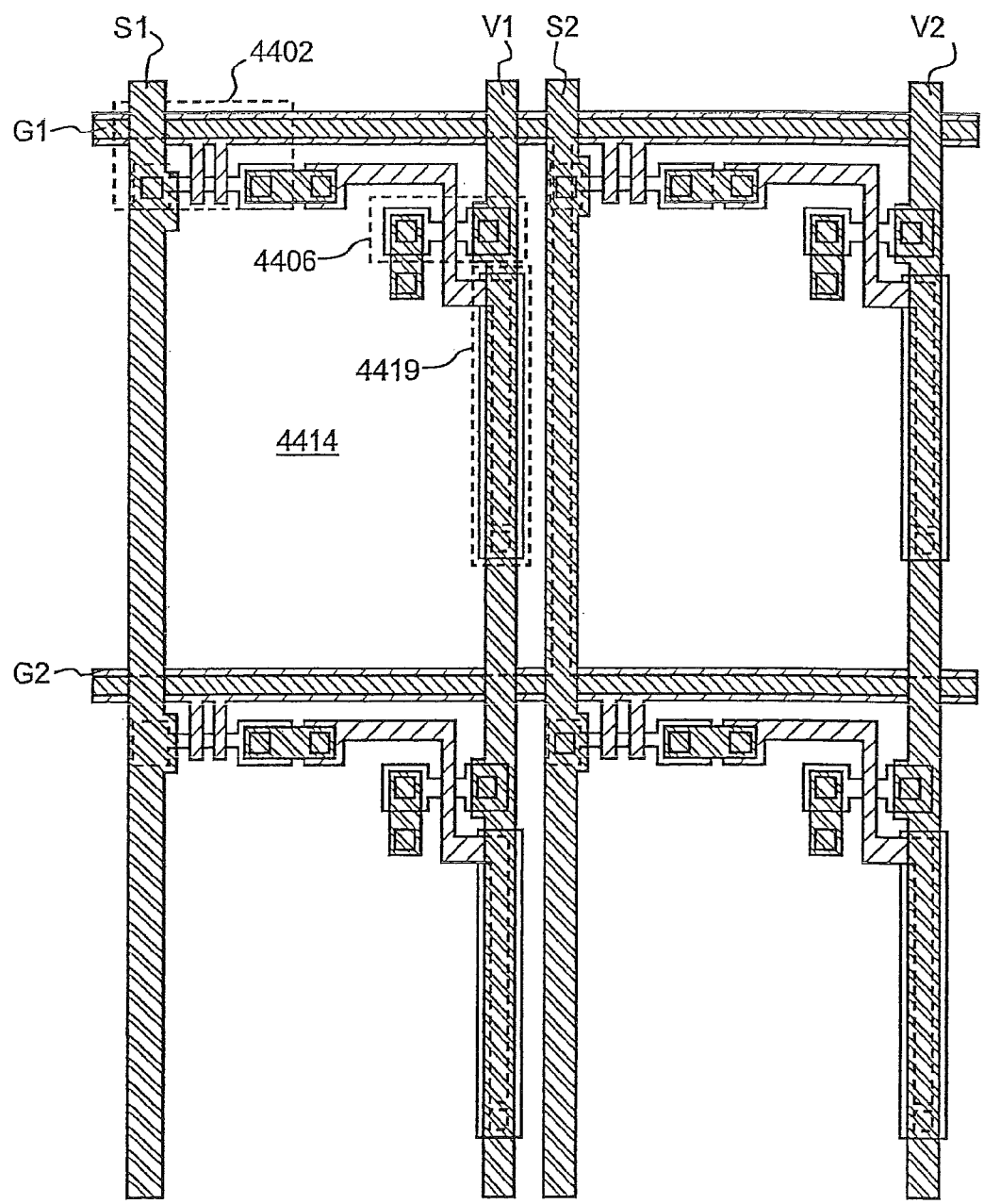
FIG. 41 shows the top view of the pixel portion of the conventional display device.

In Embodiment 1 of the pixel structure according to the present invention, compared with a conventional case where the pixels illustrated in FIGS. 40 and 41 are actually formed, matrix-like power supply lines can be formed without increasing the number of masks.

The present embodiment can be freely combined with Embodiment 1 to be implemented.

Embodiment 3

In the present embodiment, a case where power supply lines are shared between pixels next to each other described in Embodiment 4 is described with reference to FIGS. 10 and 42-44.

It is to be noted that, in the present embodiment, G1-G4 are gate wirings (a part of gate signal lines) of a TFT 4402 for switching, S1-S3 are source wirings (a part of source signal lines) of the TFT 4402 for switching, 4406 is a TFT for driving, 4414 is an EL element, VY1-VY2 are power supply lines in parallel with the source wirings, VX1-VX2 are power supply lines in parallel with the gate wirings, and 4419 is a storage capacitor.

Figure 10:
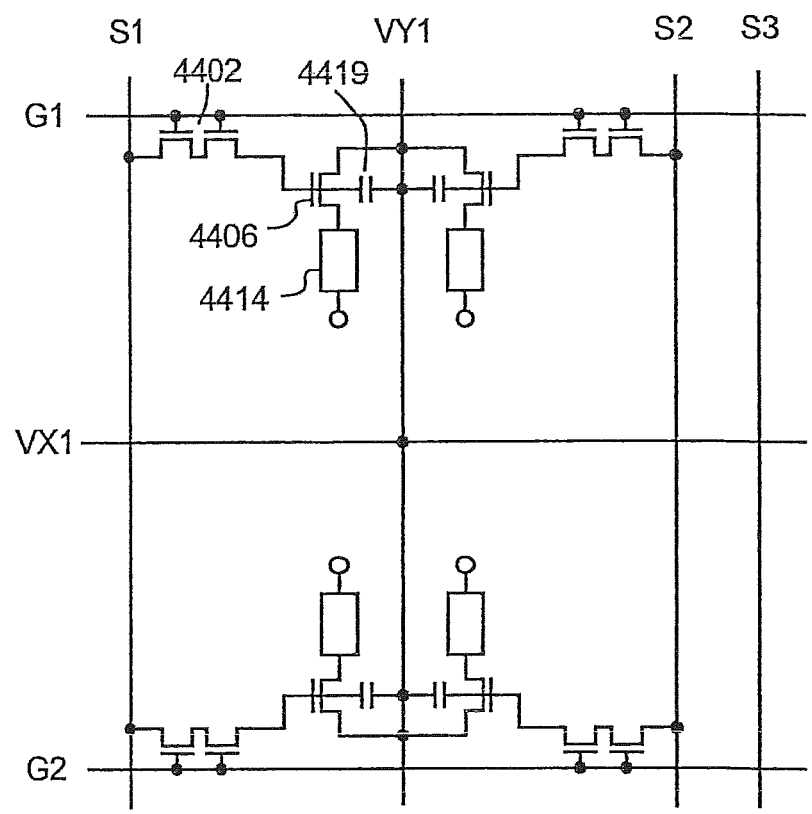
FIG. 10 shows the circuit diagram of the pixel portion of the display device of the present invention.

FIG. 10 illustrates a case where the power supply lines VY1 and VX1 are shared between two pixels next to each other. It is characteristic that the two pixels are formed so as to be symmetrical with respect to the power supply lines VY1 and VX1. In this case, since the number of the power supply lines can be decreased, the aperture ratio of the display device can be improved and the pixel portion can be made highly precise.

Figure 42:
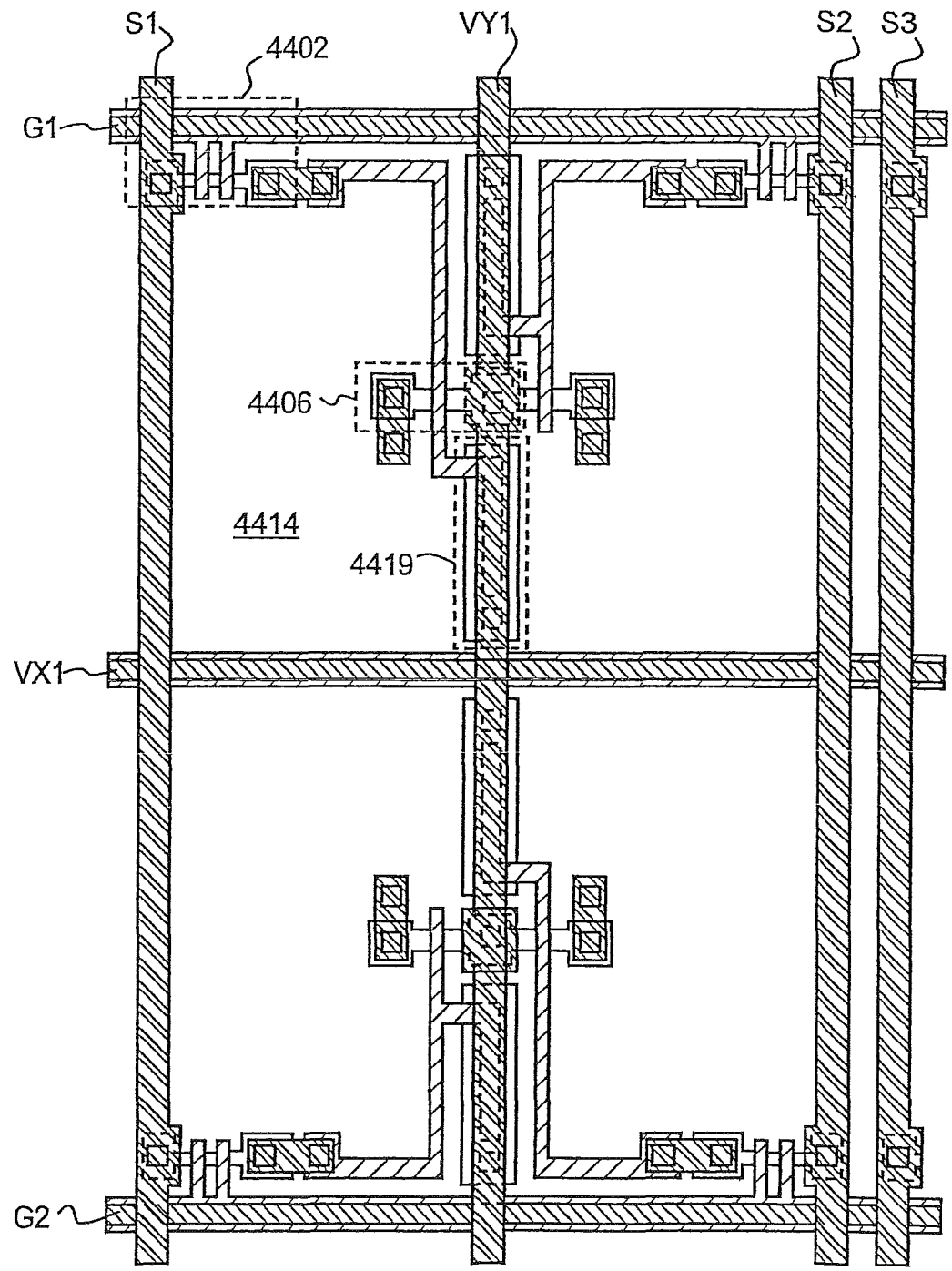
FIG. 42 shows the top view of the pixel portion of the display device of the present invention.

FIG. 42 is a top view of FIG. 10. It is to be noted that like reference numerals designate like parts in FIG. 10, and the description thereof is omitted.

Figure 43:
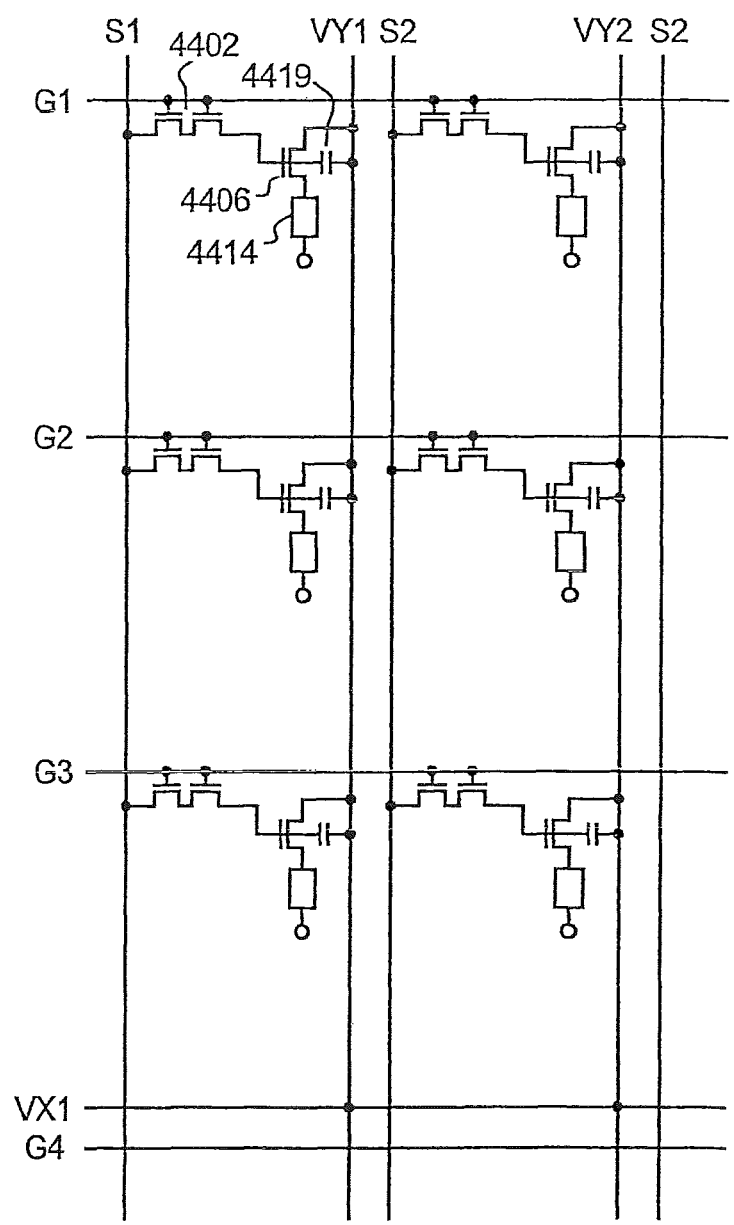
FIG. 43 shows the circuit diagram of the pixel portion of the display device of the present invention.

FIG. 43 illustrates another embodiment of the present invention. In the present Embodiment, power supply lines in an X direction are not disposed with regard to all pixel rows, and are 1/n of the number of the pixel rows, wherein n is a natural number which is 2 or larger. Here, a case where n=3 is illustrated.

Figure 44:
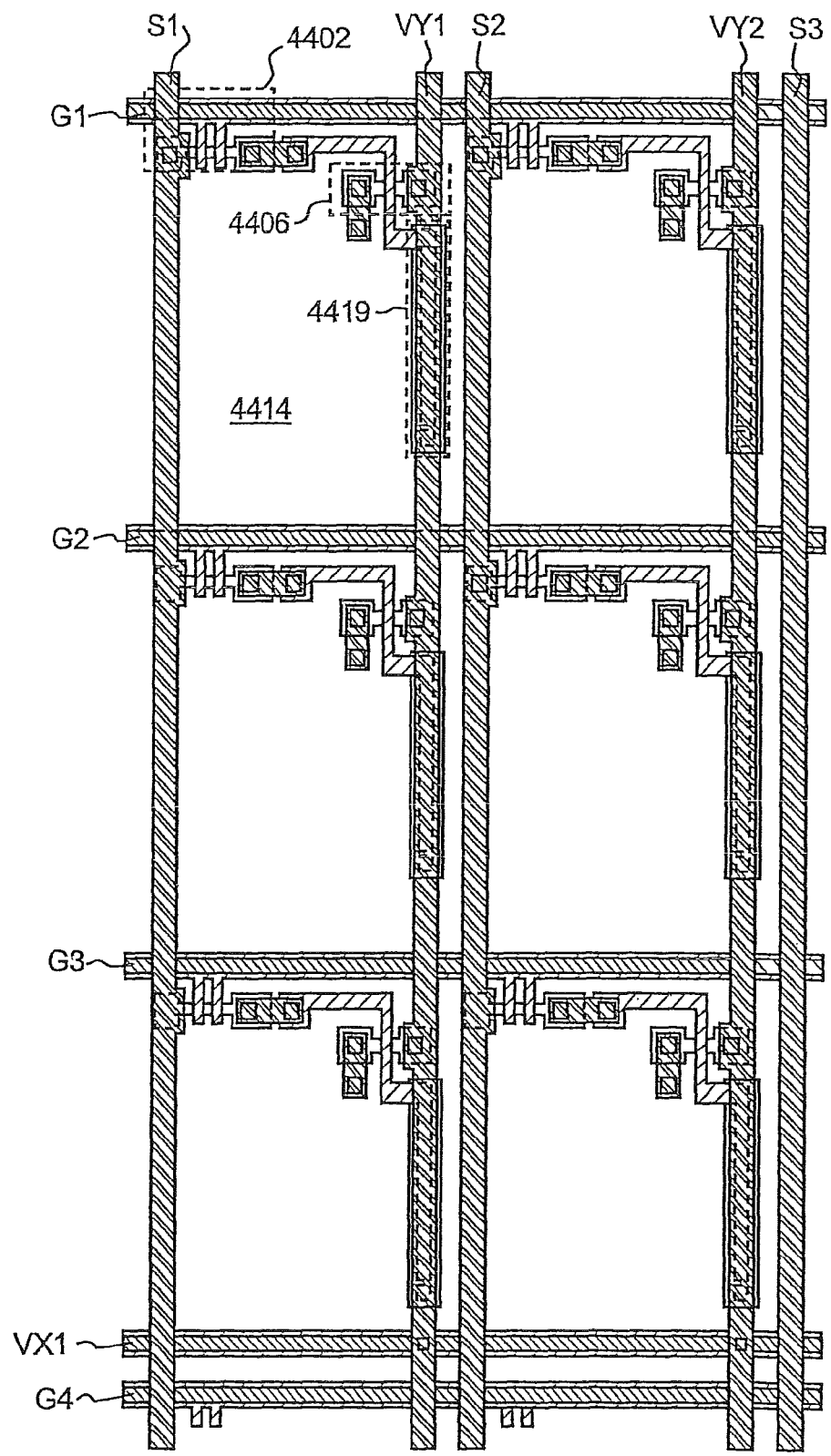
FIG. 44 shows the top view of the pixel portion of the display device of the present invention.

FIG. 44 is a top view of FIG. 43. It is to be noted that like reference numerals designate like parts in FIG. 43, and the description thereof is omitted.

The present embodiment can be freely combined with Embodiments 1 and 2 to be implemented.

Embodiment 4

Though, according to the present invention, both n-channel type TFTs and p-channel type TFTs can be used as TFTs for driving of pixels, in case anodes of EL elements are pixel electrodes while their cathodes are opposing electrodes, it is preferable that the TFTs for driving are p-channel type TFTs. On the contrary, in case the anodes of the EL elements are the opposing electrodes while their cathodes are the pixel electrodes, it is preferable that the TFTs for driving are n-channel type TFTs.

The present embodiment can be freely combined with Embodiments 1 to 3 to be implemented.

Embodiment 5

An example of manufacturing an EL display device of the present invention is explained in this embodiment.

Figure 6A:
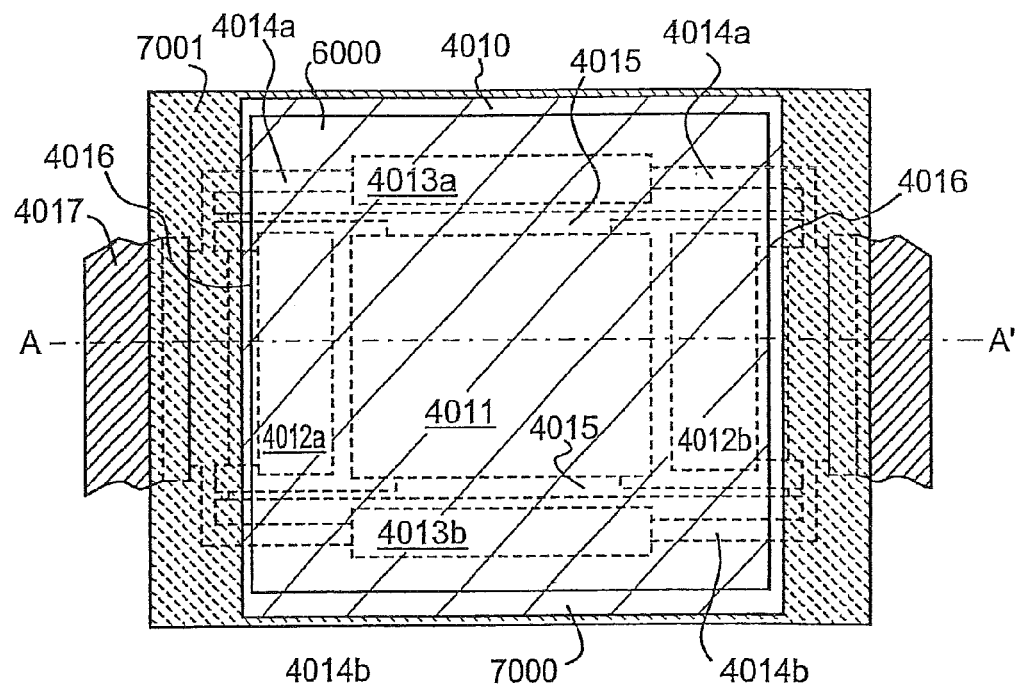
FIG. 6A shows the top view of the display device of the present invention and FIG. 6B shows the cross section view of the display device of the present invention.
Figure 6B:
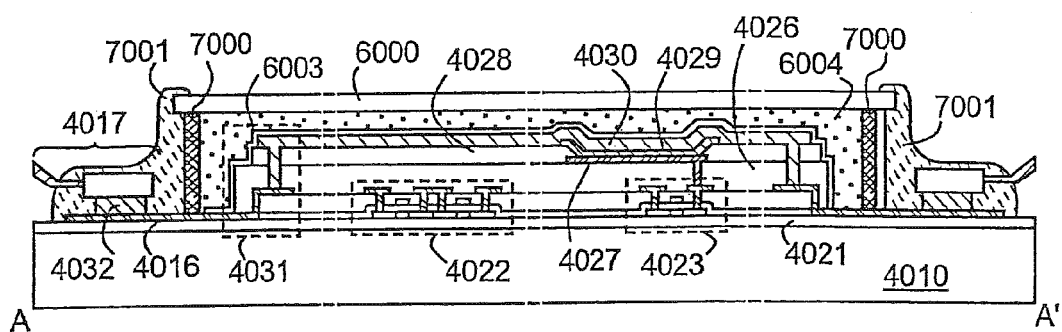

FIG. 6A is a top view of an EL display device using the present invention. FIG. 6B shows a cross sectional view which is cut along the line A-A' in FIG. 6A

In FIG. 6A, reference numeral 4010 is a substrate, reference numeral 4011 is a pixel portion, reference numerals 4012a and 4012b are source signal line driver circuits, and reference numerals 4013a and 4013b are gate signal line driver circuits. Each driver circuit is connected to external equipment, through an FPC 4017, via wirings 4014a, 4014b, 4015 and 4016.

A cover member 6000, a sealing material (also referred to as a housing material) 7000, and an airtight material (a second sealing material) 7001 are formed so as to enclose at least the pixel portion 4011, preferably the driver circuits 4012a, 4012b, 4013a, and 4013b and the pixel portion 4011, at this point.

Further, FIG. 6B is a cross sectional structure of the EL display device of the Embodiment 5. A driver circuit TFT 4022 (note that a CMOS circuit in which an n-channel TFT and a p-channel TFT are combined is shown in the figure here), a pixel portion TFT 4023 (note that only a driver TFT for controlling the current flowing to an EL element is shown here) are formed on a base film 4021 on a substrate 4010. The TFTs may be formed using a known structure (a top gate structure or a bottom gate structure).

After the driver circuit TFT 4022 and the pixel portion TFT 4023 are completed, a pixel electrode 4027 is formed on an interlayer insulating film (leveling film) 4026 made from a resin material. The pixel electrode 4027 is formed from a transparent conductive film for electrically connecting to a drain of the pixel TFT 4023. An indium oxide and tin oxide compound (referred to as ITO) or an indium oxide and zinc oxide compound can be used as the transparent conductive film. An insulating film 4028 is formed after forming the pixel electrode 4027, and an open portion is formed on the pixel electrode 4027.

An EL layer 4029 is formed next. The EL layer 4029 may be formed having a lamination structure, or a single layer structure, by freely combining known EL materials (such as a hole injecting layer, a hole transporting layer, a light emitting layer, an electron transporting layer, and an electron injecting layer). A known technique may be used to determine which structure to use. Further, EL materials exist as low molecular weight materials and high molecular weight (polymer) materials. Evaporation is used when using a low molecular weight material, but it is possible to use easy methods such as spin coating, printing, and ink jet printing when a high molecular weight material is employed.

In this embodiment, the EL layer is formed by evaporation using a shadow mask. Color display becomes possible by forming emitting layers (a red color emitting layer, a green color emitting layer, and a blue color emitting layer), capable of emitting light having different wavelengths, for each pixel using a shadow mask. In addition, methods such as a method of combining a charge coupled layer (CCM) and color filters, and a method of combining a white color light emitting layer and color filters may also be used. Of course, the EL display device can also be made to emit a single color of light.

After forming the EL layer 4029, a cathode 4030 is formed on the EL layer. It is preferable to remove as much as possible any moisture or oxygen existing in the interface between the cathode 4030 and the EL layer 4029. It is therefore necessary to use a method of continuously depositing the EL layer 4029 and the cathode 4030 in vacuum, or a method of depositing the EL layer 4029 in an inert gas atmosphere and depositing the cathode 4030 without exposure to the atmosphere. The above film deposition becomes possible in this embodiment by using a multi-chamber method (cluster tool method) film deposition apparatus.

Note that a lamination structure of a LiF (lithium fluoride) film and an Al (aluminum) film is used in this embodiment as the cathode 4030. Specifically, a 1 nm thick LiF (lithium fluoride) film is formed by evaporation on the EL layer 4029, and a 300 nm thick aluminum film is formed on the LiF film. An MgAg electrode which is a known cathode material, may of course also be used. The wiring 4016 is then connected to the cathode 4030 in a region denoted by reference numeral 4031. The wiring 4016 is an electric power supply line for imparting a predetermined voltage to the cathode 4030, and is connected to the FPC 4017 through a conducting paste material 4032.

In order to electrically connect the cathode 4030 and the wiring 4016 in the region denoted by reference numeral 4031, it is necessary to form a contact hole in the interlayer insulating film 4026 and the insulating film 4028. The contact holes may be formed at the time of etching the interlayer insulating film 4026 (when forming a contact hole for the pixel electrode) and at the time of etching the insulating film 4028 (when forming the opening portion before forming the EL layer). Further, when etching the insulating film 4028, etching may be performed all the way to the interlayer insulating film 4026 at one time. A good contact hole can be formed in this case, provided that the interlayer insulating film 4026 and the insulating film 4028 are the same resin material.

A passivation film 6003, a filler material 6004, and the cover member 6000 are formed covering the surface of the EL element thus made.

In addition, the sealing material 7000 is formed between the cover member 6000 and the substrate 4010, so as to surround the EL element portion, and the airtight material (the second sealing material) 7001 is formed on the outside of the sealing material 7000.

The filler material 6004 functions as an adhesive for bonding the cover member 6000 at this point. PVC (polyvinyl chloride), epoxy resin, silicone resin, PVB (polyvinyl butyral), and EVA (ethylene vinyl acetate) can be used as the filler material 6004. If a drying agent is formed on the inside of the filler material 6004, then it can continue to maintain a moisture absorbing effect, which is preferable.

Further, spacers may be contained within the filler material 6004. The spacers may be a powdered substance such as BaO, giving the spacers themselves the ability to absorb moisture.

When using spacers, the passivation film 6003 can relieve the spacer pressure. Further, a film such as a resin film can be formed separately from the passivation film to relieve the spacer pressure.

Furthermore, a glass plate, an aluminum plate, a stainless steel plate, an FRP (fiberglass-reinforced plastics) plate, a PVF (polyvinyl fluoride) film, a Mylar film, a polyester film, and an acrylic film can be used as the cover member 6000. Note that if PVB or EVA is used as the filler material 6004, it is preferable to use a sheet with a structure in which several tens of μm of aluminum foil is sandwiched by a PVF film or a Mylar film.

However, depending upon the light emission direction from the EL element (the light radiation direction), it is necessary for the cover member 6000 to have light transmitting characteristics.

Further, the wiring 4016 is electrically connected to the FPC 4017 through a gap between the sealing material 7000, the airtight material 7001 and the substrate 4010. Note that although an explanation of the wiring 4016 has been made here, the wirings 4014a, 4014b and 4015 are also electrically connected to the FPC 4017 by similarly passing underneath the sealing material 7000, the airtight material 7001 and the substrate 4010.

In this embodiment, the cover member 6000 is bonded after forming the filler material 6004, and the sealing material 7000 is attached so as to cover the lateral surfaces (exposed surfaces) of the filler material 6004, but the filler material 6004 may also be formed after attaching the cover member 6000 and the sealing material 7000. In this case, a filler material injection opening is formed through a gap formed by the substrate 4010, the cover member 6000, and the sealing material 7000. The gap is set into a vacuum state (a pressure equal to or less than $10^{-2}$ Torr), and after immersing the injection opening in the tank holding the filler material, the air pressure outside of the gap is made higher than the air pressure within the gap, and the filler material fills the gap.

The present embodiment can be freely combined with Embodiments 1 to 4 to be implemented.

Embodiment 6

An example of an EL display device in accordance with the present invention, manufactured in a form different from that of Embodiment 5 according to the present invention, will be described with reference to FIGS. 7A and 7B. It is to be noted that like reference numerals designate like parts in FIGS. 6A and 6B, and the description thereof is omitted.

Figure 7A:
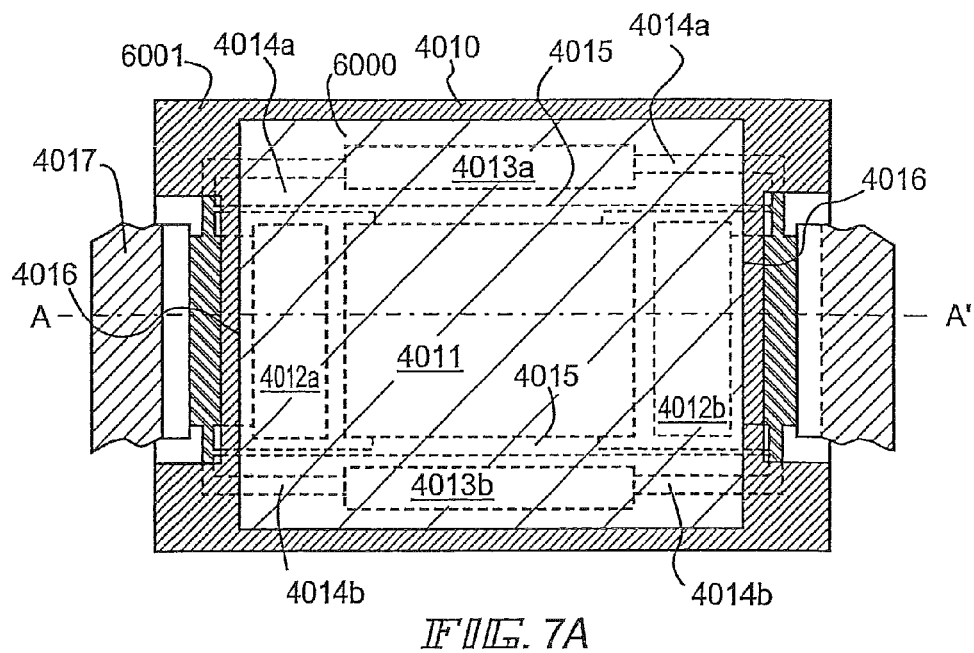
FIG. 7A shows the top view of the display device of the present invention and FIG. 7B shows the cross section view of the display device of the present invention.
Figure 7B:
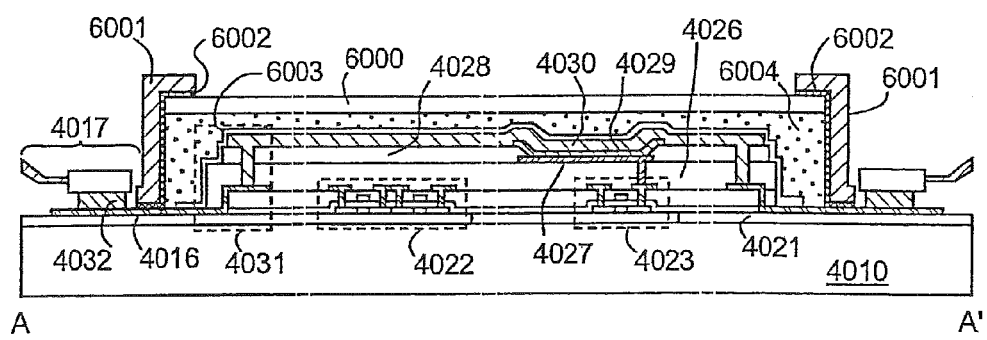

FIG. 7A is a top view of the EL display device of Embodiment 6, and FIG. 7B is a cross-sectional view taken along the line A-A' in FIG. 7A.

In accordance with Embodiment 5, a passivation film 6003 is formed by covering the surface of an EL element.

Further, a filler material 6004 is provided so as to cover the EL element. The filler material 6004 also functions as an adhesive for bonding a cover member 6000. As the filler material 6004, polyvinyl chloride (PVC), epoxy resin, silicone resin, polyvinyl butyral (PVB) or ethylene-vinyl acetate (EVA) may be used. Preferably, a desiccant is provided in the filler material 6004 to maintain a moisture absorbing effect.

The filler material 6004 may also contain a spacer. The spacer may be particles of BaO or the like such that the spacer itself has a moisture absorbing effect.

If a spacer is provided, the passivation film 6003 can reduce the influence of the spacer pressure. A resin film or the like may also be provided independently of the passivation film to reduce the influence of the spacer pressure.

As the cover member 6000, a glass sheet, an aluminum sheet, a stainless steel sheet, a fiberglass-reinforced plastics (FRP) sheet, polyvinyl fluoride (PVF) film, Mylar film, polyester film, acrylic film, or the like may be used. If PVB or EVA is used as the filler material 6004, it is preferable to use a sheet having a structure in which an aluminum foil having a thickness of several tens of μm is sandwiched between PVF films or Mylar films.

Some setting of the direction of luminescence from the EL element (the direction of light emission) necessitates making the cover member 6000 transparent.

Next, the cover member 6000 is bonded by using the filler material 6004. Thereafter, a frame member 6001 is attached so as to cover side surfaces (exposed surfaces) formed by the filler material 6004. The frame member 6001 is bonded by a sealing material 6002 (functioning as an adhesive). Preferably, a photo-setting resin is used as sealing material 6002. However, a thermosetting resin may be used if the heat resistance of the EL layer is high enough to allow use of such a resin. It is desirable that the sealing material 6002 has such properties as to inhibit permeation of moisture and oxygen as effectively as possible. A desiccant may be mixed in the sealing material 6002.

Also wiring 4016 is electrically connected to a flexible printed circuit (FPC) 4017 by being passed through a gap between the sealing material 6002 and the substrate 4010. While the electrical connection of the wiring 4016 is described, other wirings 4014a, 4014b, and 4015 are also connected electrically to the FPC 4017 by being passed through the gap between the sealing material 6002 and the substrate 4010.

In Embodiment 6, after the filler material 6004 has been provided, the cover member 6000 is bonded and the frame member 6001 is attached so as to cover the side surfaces (exposed surfaces) of the filler material 6004. However, the filler material 6004 may be provided after attachment of the cover member 6000 and the frame member 6001. In such a case, a filler injection hole is formed which communicates with a gap formed by the substrate 4010, the cover member 6000 and the frame member 6001. The gap is evacuated to produce a vacuum (at $10^{-2}$ Torr or lower), the injection hole is immersed in the filler material in a tank, and the air pressure outside the gap is increased relative to the air pressure in the gap, thereby filling the gap with the filler material.

The present embodiment can be freely combined with Embodiments 1 to 5 to be implemented.

Embodiment 7

Figure 8:
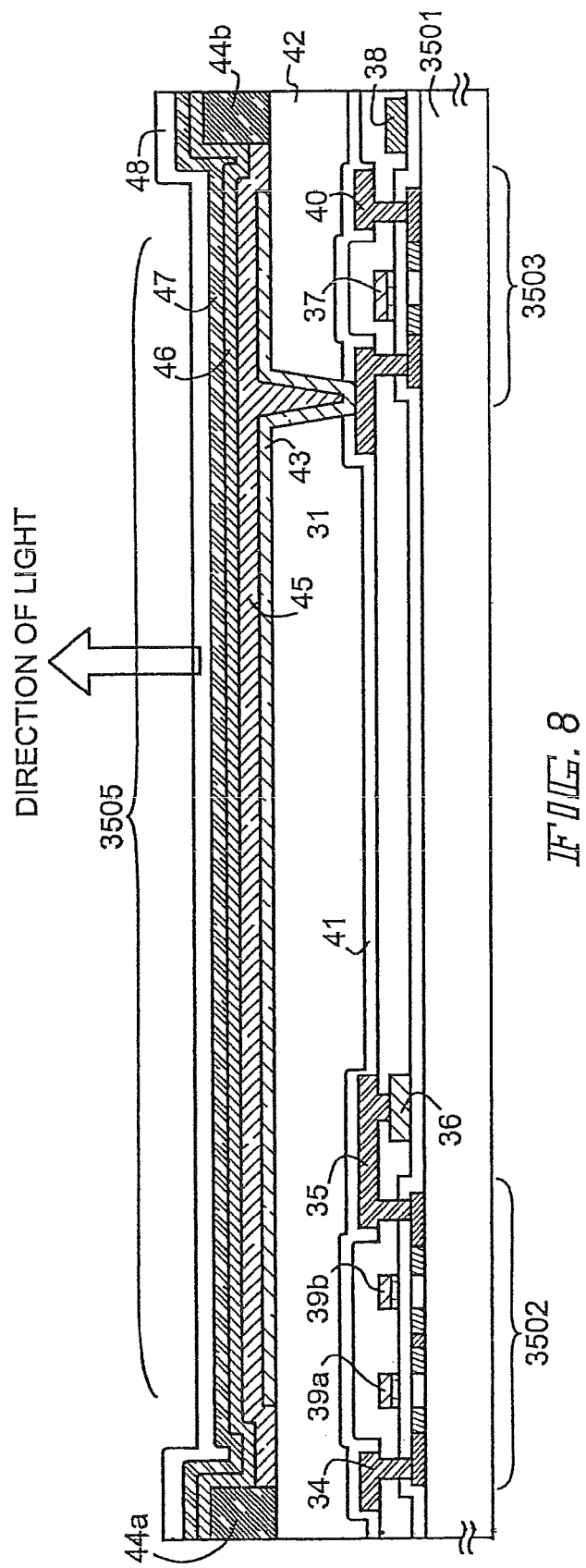
FIG. 8 shows the cross section view of the display device of the present invention.

Here, FIG. 8 illustrates a further detailed structure in cross section of a pixel portion of an EL display device.

It is to be noted that the present embodiment illustrates a pixel structure of Embodiment 1 of a pixel structure according to the present invention which corresponds to a case where power supply lines in parallel with source signal lines are formed in a layer forming the source signal lines and power supply lines in parallel with gate signal lines are formed in a layer forming the gate signal lines.

In FIG. 8, a TFT 3502 for switching provided on a substrate 3501 is an n-channel type TFT formed conventionally. In the present embodiment, the TFT 3502 is of a double gate structure having gate electrodes 39a and 39b. By adopting the double gate structure, two TFTs are substantially connected in series, and thus, there is an advantage that an off current value can be decreased. It is to be noted that, though the double gate structure is adopted in the present embodiment, a single gate structure, a triple gate structure, or a multiple gate structure having more than three gates may also be adopted. Further, a p-channel type TFT formed conventionally may also be used.

In the present embodiment, a TFT 3503 for driving is an n-channel type TFT formed conventionally. A gate electrode 37 of the TFT 3503 for driving is electrically connected to a drain wiring 35 of the TFT 3502 for switching via a wiring 36. 34 is a source signal line.

Since the TFT for driving is an element for controlling the amount of electric current through the EL element, a lot of electric current passes through it, and thus, it is highly liable to deterioration due to heat or due to hot carrier. Therefore, a structure where an LDD region is provided on the side of a drain of the TFT for driving so as to overlap the gate electrode through a gate insulating film is quite effective.

Further, a single gate structure of the driver TFT 3503 is shown in the figures in this embodiment, but a multi-gate structure in which a plurality of TFTs are connected in series may also be used. In addition, a structure in which a plurality of TFTs are connected in parallel, effectively partitioning into a plurality of channel forming regions, and which can perform radiation of heat with high efficiency, may also be used.

Further, a source wiring 40 is connected to a power supply line 38 formed in a layer forming the gate electrodes 37 and 39, and constant voltage is always applied to the source wiring 40. Here, a power supply line is formed also in a layer forming the source wiring 40 and the source signal line 34, and is electrically connected through a contact hole to the power supply line 38, though not shown in the figure.

A first passivation film 41 is formed on the switching TFT 3502 and the driver TFT 3503, and a leveling film 42 comprising an insulating resin film is formed on the first passivation film 41. It is extremely important to level the step due to the TFTs using the leveling film 42. An EL layer formed later is extremely thin, so there are cases in which defective light emissions occur. Therefore, to form the EL layer with as level a surface as possible, it is preferable to perform leveling before forming a pixel electrode.

Furthermore, reference numeral 43 denotes a pixel electrode (EL element cathode in this case) made from a conducting film with high reflectivity, and this is electrically connected to a drain region of the driver TFT 3503. It is preferable to use a low resistance conducting film, such as an aluminum alloy film, a copper alloy film, and a silver alloy film, or a laminate of such films. Of course, a lamination structure with another conducting film may also be used.

In addition, a light emitting layer 45 is formed in the middle of a groove (corresponding to a pixel) formed by banks 44a and 44b, which are formed by insulating films (preferably resins). Note that only one pixel is shown in the figures here, but the light emitting layer may be divided to correspond to each of the colors R (red), G (green), and B (blue). A π conjugate polymer material is used as an organic EL material. Polyparaphenylene vinylenes (PPVs), polyvinyl carbazoles (PVKs), and polyfluoranes can be given as typical polymer materials.

Note that there are several types of PPV organic EL materials, and materials recorded in Shenk, H., Becker, H., Gelsen, O., Kluge, E., Kreuder, W., and Spreitzer, H., "Polymers for Light Emitting Diodes", Euro Display Proceedings, 1999, pp. 33-7, and in Japanese Patent Application Laid-open No. Hei 10-92567, for example, may be used.

As specific light emitting layers, cyano-polyphenylene vinylene may be used as a red light emitting layer, polyphenylene vinylene may be used as a blue light emitting layer, and polyphenylene vinylene or polyalkylphenylene may be used as a red light emitting layer. The film thickness may be between 30 and 150 nm (preferably between 40 and 100 nm).

However, the above example is one example of the organic EL materials which can be used as luminescence layers, and it is not necessary to limit use to these materials. An EL layer may be formed by freely combining light emitting layers, electric charge transporting layers, and electric charge injecting layers.

For example, embodiment 4 shows an example of using a polymer material as a light emitting layer, but a low molecular weight organic EL material may also be used. Further, it is possible to use inorganic materials such as silicon carbide, as an electric charge transporting layer or an electric charge injecting layer. Known materials can be used for these organic EL materials and inorganic materials.

A laminate structure EL layer, in which a hole injecting layer 46 made from PEDOT (polythiophene) or PAni (polyaniline) is formed on the light emitting layer 45, is used in embodiment 4. An anode 47 is then formed on the hole injecting layer 46 from a transparent conductive film. The light generated by the light emitting layer 45 is radiated toward the upper surface (opposite the direction to the substrate 3501 where TFT is formed) in this embodiment, and therefore the anode must have a conductive property and be formed of a material having a property of being transparent to light. An indium oxide and tin oxide compound, or an indium oxide and zinc oxide compound can be used as the transparent conductive film. However, because it is formed after forming the low heat resistance light emitting and hole injecting layers, it is preferable to use a material which can be deposited at as low a temperature as possible.

An EL element 3505 is complete at the point where the anode 47 is formed. Note that what is called the EL element 3505 here is formed by the pixel electrode (anode) 43, the light emitting layer 45, the hole injecting layer 46, and the anode 47. The pixel electrode 43 is nearly equal in area to the pixel, and consequently the entire pixel functions as an EL device. Therefore, the light emitting efficiency is extremely high, and a bright image display becomes possible.

In addition, a second passivation film 48 is then formed on the anode 47 in this embodiment. It is preferable to use a silicon nitride film or an oxidized silicon nitride film as the second passivation film 48. The purpose of this is the isolation of the EL element from the outside, and this is meaningful in preventing degradation due to oxidation of the organic EL material, and in controlling gaseous emitted from the organic EL material. The reliability of the EL display can thus be raised.

The EL display device of the present invention has a pixel portion made from pixels structured as in FIG. 8, and has a switching TFT with a sufficiently low off current value, and a current control TFT which is strong with respect to hot carrier injection. An EL device having high reliability, and in which good image display is possible, can therefore be obtained.

Note that it is possible to implement the constitution of this embodiment by freely combining it with the constitutions of any of Embodiments 1 to 6.

Embodiment 8

In this embodiment, there will be described a structure in which the structure of the EL element 3505 is reversed in the pixel portion illustrated in Embodiment 7. Explanation will be given with reference to FIG. 9. Note that since the points of difference from the structure shown in FIG. 8 lie only in parts of the EL element 3701 and the driver TFT 3553, the others shall be omitted from description.

Figure 9:
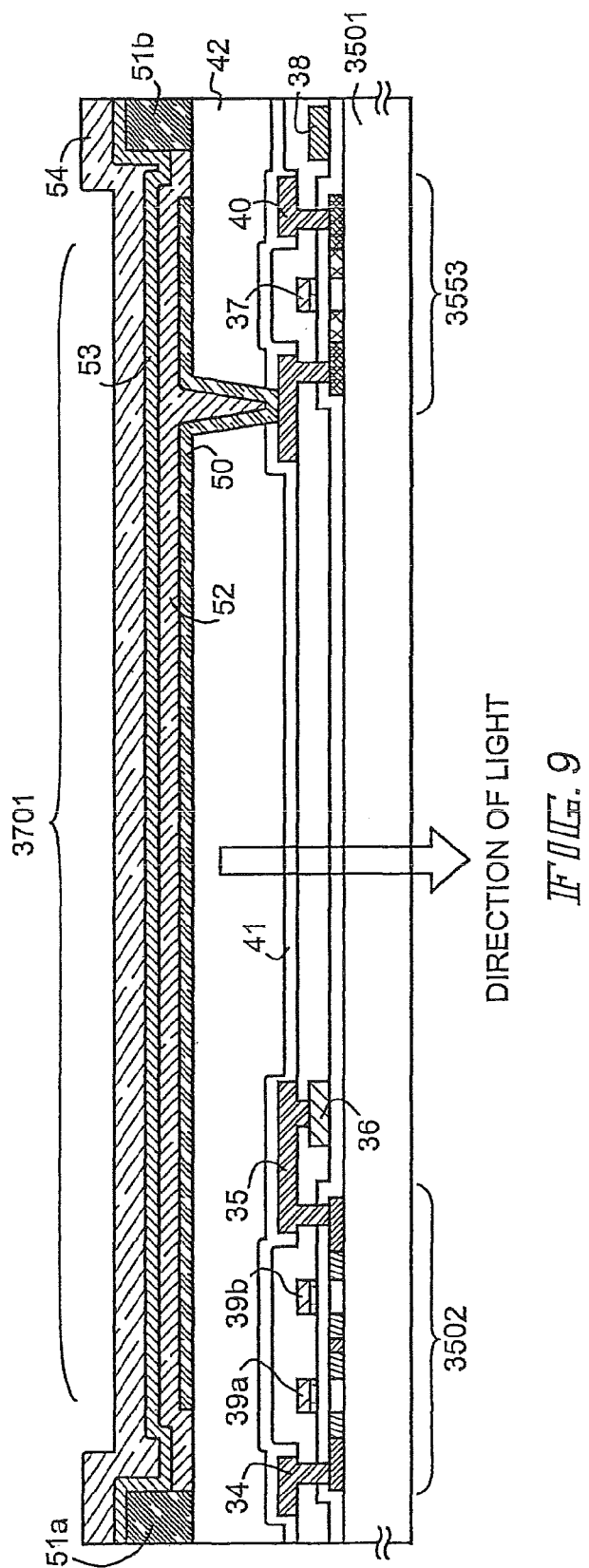
FIG. 9 shows the cross section view of the display device of the present invention.

Referring to FIG. 9, a driver TFT 3553 is formed using the p-channel TFT manufactured by known method. Note that the driver TFT is not limited to a p-channel TFT and n-channel 1 ET may be used.

In this embodiment, a transparent conductive film is employed as a pixel electrode (anode) 50. Concretely, the conductive film is made of a compound of indium oxide and zinc oxide. Of course, a conductive film made of a compound of indium oxide and tin oxide may well be employed.

Besides, after banks 51a and 51b made of an insulating film have been formed, a light emitting layer 52 made of polyvinylcarbazole is formed on the basis of the application of a solution. The light emitting layer 52 is overlaid with an electron injection layer 53 made of potassium acetylacetonate (expressed as acacK), and a cathode 54 made of an aluminum alloy. In this case, the cathode 54 functions also as a passivation film. Thus, an EL element 3701 is formed.

In the case of this embodiment, light generated by the light emitting layer 52 is radiated toward a substrate 3501 formed with TFTs as indicated by an arrow.

The present embodiment can be freely combined with Embodiments 1 to 6 to be implemented.

Embodiment 9

Although FIGS. 2, 3, 10 and 42 to 44 show the structure in which the storage capacitor is provided to hold the voltage applied to the gate electrode of the driver TFT, the storage capacitor can also be omitted.

In the case where the n-channel TFT used as a driver TFT has the LDD region which is provided so as to overlap with the gate electrode through the gate insulating film. Although a parasitic capacitance generally called a gate capacitance is formed in this overlapping region, this embodiment is characterized in that this parasitic capacitance is positively used as a capacitor to hold a voltage applied to a gate electrode of the driver TFT.

Since the capacity of this parasitic capacitance is changed by the overlapping area of the gate electrode and the LDD region, it is determined by the length of the LDD region contained in the overlapping region.

The present embodiment can be freely combined with Embodiments 1 to 8 to be implemented.

Embodiment 10

In this embodiment, a method of manufacturing the pixel portion of an EL display device in accordance with the present invention and a TFT of a driver circuit portion which is provided in the periphery of the pixel portion. Note that a CMOS circuit is shown in the figures as a basic unit for a driving circuit in order to simplify the explanation.

Figure 11A:
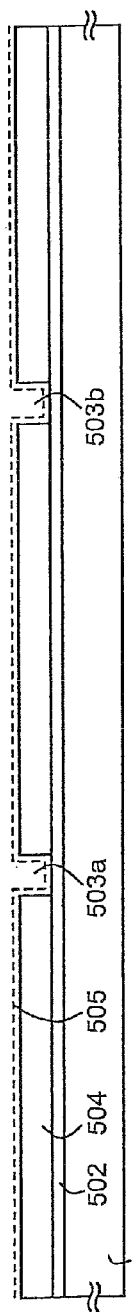
FIGS. 11A to 11E show the manufacturing process of the display device of the present invention.

First, as shown in FIG. 11A, a substrate 501, on the surface of which a base film (not shown in the figures) is formed, is prepared. A 100 nm thick silicon nitride oxide film and a 200 nm thick silicon nitride oxide film are laminated and used as the base film on crystallized glass in Embodiment 10. At this point it is appropriate to set the nitrogen concentration of the film contacting the crystallized glass substrate to between 10 and 25 wt %. Elements may also, of course, be formed directly on top of a quartz substrate without forming the base film.

Next, an amorphous silicon film 502 with a thickness of 45 nm is formed on the substrate 501 by a known film deposition method. Note that it is not necessary to limit this to the amorphous silicon film, and any other film, provided that it is a semiconductor film having an amorphous structure (including a microcrystalline semiconductor film) may also be used. In addition, a compound semiconductor film containing an amorphous structure, such as an amorphous silicon germanium film, may also be used.

Figure 11B:
Figure 11C:
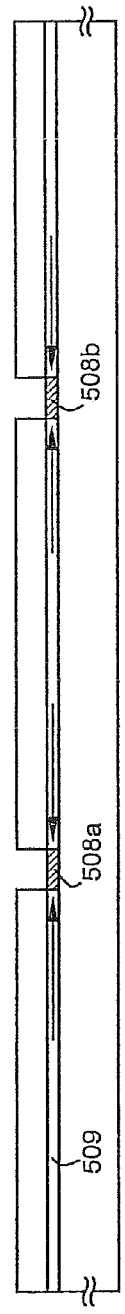

The process from here to FIG. 11C may be completely cited from Japanese Patent Application Laid-open No. Hei 10-247735 of the present applicant. In this publication, a technique regarding a method of crystallizing a semiconductor film by using an element such as Ni or the like, as a catalyst is disclosed.

First, a protecting film 504 having opening portions 503a and 503b is formed. A 150 nm thick silicon oxide film is used in Embodiment 10. A layer containing nickel (Ni) 505 (Ni containing layer) is then formed on the protecting film 504 by spin coating. The above publication may be referred to regarding the formation of the Ni containing layer.

Next, as shown in FIG. 11B, the amorphous silicon film 502 is crystallized by heat treatment for 14 hours at 570° C. in an inert atmosphere. Crystallization proceeds roughly parallel to the substrate with regions in contact with Ni (hereafter referred to as Ni added regions) 506a and 506b as origins, forming a polysilicon film 507 having a crystal structure in which bar-shaped crystals are lined up together.

An element residing in periodic table group 15 (preferably phosphorous) is then added to the Ni added regions 506a and 506b with the protecting film 504 left in place as a mask, as shown in FIG. 11C. Regions in which a high concentration of phosphorous is added (hereafter referred to as phosphorous added regions) 508a and 508b are thus formed.

Next, as shown in FIG. 11C, a heat treatment is added for 12 hours at 600° C. in an inert atmosphere. The Ni which exists in the polysilicon film 507 migrates due to the heat treatment, and finally, is nearly completely captured in the phosphorous added regions 508a and 508b, as shown by the arrows. This can be considered to be a phenomenon of a gettering effect of the metal element (Ni in embodiment 10) by phosphorous.

The concentration of Ni remaining in the polysilicon film 509 by this process is reduced at least to $2 \times 10^{17}$ atoms/cm$^3$, as measured by SIMS (secondary ion mass spectroscopy). Ni is a lifetime killer for the semiconductor, and if the concentration of Ni is reduced to this level, then there is no harmful influence imparted to the characteristics of a TFT. Further, this concentration is nearly at the limit of measurability by current SIMS, and therefore it is anticipated that there is an even lower actual concentration (not more than $2 \times 10^{17}$ atoms/cm$^3$).

Figure 11D:

The polysilicon film 509, crystallized by using a catalyst, and in which the catalyst is then reduced to a level at which it does not cause damage to the function of the TFT, is thus obtained. Active layers 510 to 513 using only the polysilicon film 509 are formed afterward by patterning. Note that a marker for performing mask alignment during later patterning may be formed at this time using the above polysilicon film. (See FIG. 11D.)

Figure 11E:
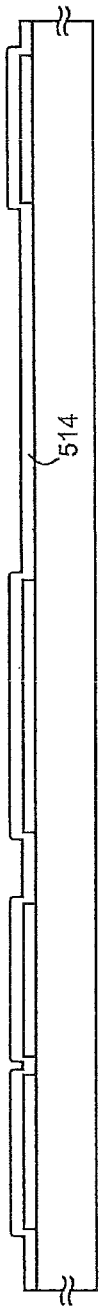

A 50 nm thick silicon nitride oxide film is formed next by plasma CVD, as shown in FIG. 11E, and moreover, a thermal oxidation step is performed by heat treatment for 1 hour at 950° C. in an oxidizing atmosphere. Note that the oxidizing environment may be an oxygen atmosphere, or an oxygen atmosphere in which a halogen element is added.

Oxidation proceeds in the interface of the active layers and the above silicon nitride oxide film by the above thermal oxidation step, and an approximately 15 nm thickness of the polysilicon film is oxidized, forming an approximately 30 nm thick silicon oxide film. In other words, a gate insulating film 514 with a thickness of 80 nm is formed from a lamination of the 30 nm thick silicon oxide film and the 50 nm thick silicon nitride oxide film.

Figure 12A:
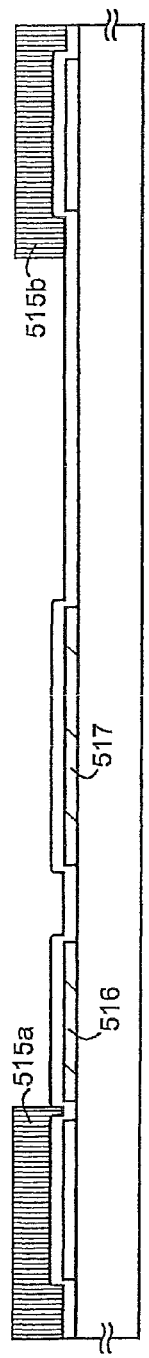
FIGS. 12A to 12D show the manufacturing process of the display device of the present invention.

A resist masks 515a and 515b is formed next, as shown in FIG. 12A, and an impurity element which imparts p-type conductivity (hereafter referred to as a p-type impurity element) is added through the gate insulating film 514. An element residing in periodic table group 13, typically boron or gallium, can be used as the p-type impurity element. This process is (referred to as a channel doping process) is a process for controlling the threshold voltage of the TFT.

Note that boron is added in Embodiment 10 by plasma excited ion doping, without separation of mass, of diborane (B$_2$H$_6$). Ion implantation, which performs separation of mass, may of course also be used. Impurity regions 516 and 517, containing boron at a concentration of $1 \times 10^{15}$ to $1 \times 10^{18}$ atoms/cm$^3$ (typically between $5 \times 10^{16}$ and $5 \times 10^{17}$ atoms/cm$^3$), are formed by this process.

Figure 12B:
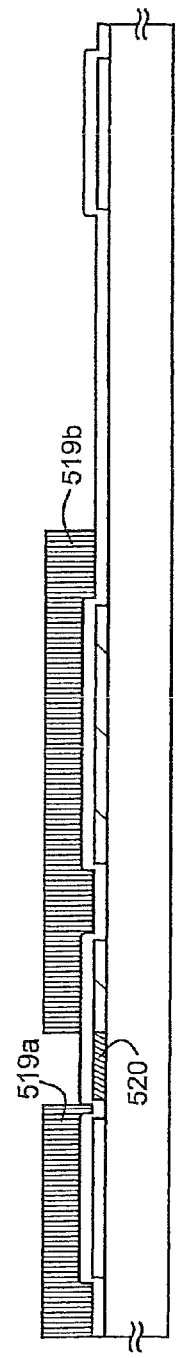

Resist masks 519a and 519b are formed next, as shown in FIG. 12B, and an impurity element which imparts n-type conductivity (hereafter referred to as an n-type impurity element) is added, through the gate insulating film 514. An element residing in periodic table group 15, typically phosphorous or arsenic, can be used as the n-type impurity element. Note that phosphorous is added at a concentration of $1 \times 10^{18}$ atoms/cm$^3$ in Embodiment 10 by plasma excited plasma doping, without separation of mass, of phosphine (PH$_3$). Ion implantation, which performs separation of mass, may also be used, of course.

The dosage is regulated so that the n-type impurity element is contained in an n-type impurity region 520 formed as above at a concentration of $2 \times 10^{16}$ to $5 \times 10^{19}$ atoms/cm$^3$ (typically between $5 \times 10^{17}$ and $5 \times 10^{18}$ atoms/cm$^3$).

Figure 12C:
Figure 12D:
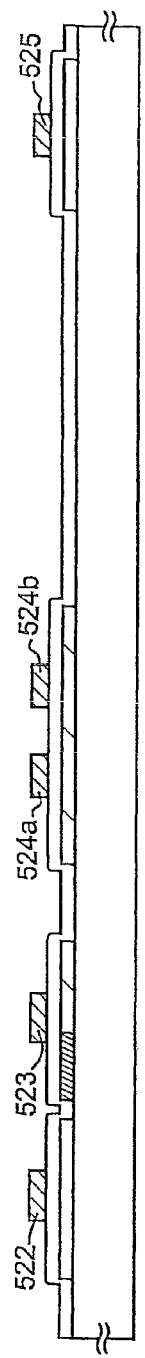

A process of activating the added n-type impurity elements and p-type impurity elements is then performed, as shown in FIG. 12C. It is not necessary to place any limitations on the means of activation, but a furnace annealing process using an electric furnace is preferable because the gate insulating film 514 has been formed. Further, there is a possibility of damage being imparted to the interface of the active layers and the gate insulating film of the portion which becomes a channel forming region in the process of FIG. 12A, and therefore it is preferable to perform heat treatment at as high a temperature as possible.

Crystallized glass having a high resistance to heat is used in Embodiment 10, and therefore the activation process is performed by furnace annealing at 800° C. for 1 hour. Note that thermal oxidation may be performed by making the process environment into an oxidizing atmosphere, and that heat treatment may be performed by using an inert atmosphere.

The edge portion of the n-type impurity region 520, namely, the boundary (junction portion) with a region in the periphery of the n-type impurity region 520 in which the n-type impurity element is not added (the p-type impurity region formed by the process of FIG. 12A) are defined by the above process. This means that an extremely good junction portion between an LDD region and the channel forming region can be formed at the point when the TFT is later completed.

A 200 to 400 nm thick conductive film is formed next and patterned, forming gate electrodes 522 to 525. The line width of the gate electrodes 522 to 525 determine the channel length of each TFT Note that a single layer conductive film may be formed for the gate electrode, but when necessary, it is preferable to use a two layer or a three layer lamination film. A known conductive film can be used as the gate electrode material. Specifically, a film of an element chosen from among the group consisting of tantalum (Ta), titanium (Ti), molybdenum (Mo), tungsten (W), chromium (Cr), and silicon (Si); or a film of a nitrated compound of the above elements (typically a tantalum nitride film, a tungsten nitride film, or a titanium nitride film); or an alloy film of a combination of the above elements (typically a Mo—W alloy or a Mo—Ta alloy); or a silicide film of the above elements (typically a tungsten silicide film or a titanium silicide film) can be used. A single layer film or a lamination may be used, of course.

A lamination film made from a 50 nm thick tungsten nitride (WN) film and a 350 nm thick tungsten (W) film is used in Embodiment 10. This film may be formed by sputtering. Furthermore, if an inert gas such as xenon (Xe) or neon (Ne) is added as a sputtering gas, then film peeling due to stress can be prevented.

The gate electrode 523 is formed at this time so as to overlap portion of the n-type impurity region 520, with the gate insulating film 514 interposed therebetween. The overlapping portions later become LDD regions overlapping the gate electrode. Note that two gate electrodes 524*a* and 524*b* can be seen in cross section, but they are actually connected electrically.

Next, an n-type impurity element (phosphorous is used in Embodiment 10) is added in a self-aligning manner with the gate electrodes 522 to 525 as masks, as shown in FIG. 13A. The addition is regulated so that phosphorous is added to impurity regions 526 to 533 thus formed at a concentration of $\frac{1}{10}$ to $\frac{1}{2}$ (typically between $\frac{1}{4}$ and $\frac{1}{3}$) that of the n-type impurity region 520. Specifically, a concentration of $1\times10^{16}$ to $5\times10^{18}$ atoms/cm$^3$ (typically between $3\times10^{17}$ and $3\times10^{18}$ atoms/cm$^3$) is preferable.

Resist masks 534*a* to 534*d* are formed next, in a shape so as to cover the gate electrodes, as shown in FIG. 13B, and an n-type impurity element (phosphorous is used in Embodiment 10) is added, forming impurity regions 535 to 539 containing a high concentration of phosphorous. Ion doping using phosphine (PH$_3$) is also performed here, and the phosphorous concentration of these regions is regulated to be from $1\times10^{20}$ to $1\times10^{21}$ atoms/cm$^3$ (typically between $2\times10^{20}$ and $5\times10^{20}$ atoms/cm$^3$).

A source region or a drain region of the n-channel TFT is formed by this process, and in the switching TFT, a portion of the n-type impurity regions 528 to 531 formed by the process of FIG. 13A remains. These remaining regions correspond to the LDD regions of the switching TFT.

Next, as shown in FIG. 13C, the resist masks 534*a* to 534*d* are removed, and a new resist mask 542 is formed. A p-type impurity element (boron is used in Embodiment 10) is then added, forming impurity regions 540, 541, 543 and 544 containing a high concentration of boron. Boron is added here to a concentration of $3\times10^{20}$ to $3\times10^{21}$ atoms/cm$^3$ (typically between $5\times10^{20}$ and $1\times10^{21}$ atoms/cm$^3$) by ion doping using diborane (B$_2$H$_6$).

Note that phosphorous has already been added to the impurity regions 540, 541, 543 and 544 at a concentration of $1\times10^{20}$ to $1\times10^{21}$ atoms/cm$^3$, but boron is added here at a concentration of at least 3 times that of the phosphorous. Therefore, the n-type impurity regions already formed completely invert to p-type, and function as p-type impurity regions.

Next, after removing the resist mask 542, as shown in FIG. 13D, a first interlayer insulating film 546 is formed. A single layer insulating film containing silicon is used as the first interlayer insulating film 546, but a lamination film of the same may also be used. Further, a film thickness of between 400 nm and 1.5 μm is appropriate. A lamination structure of an 800 nm thick silicon oxide film on a 200 nm thick silicon nitride oxide film is used in Embodiment 10.

The n-type impurity elements and the p-type impurity elements, added at their respective concentrations, are activated afterward. Furnace annealing is preferable as a means of activation. Heat treatment is performed using an electric furnace for 4 hours at 550° C. in an inert atmosphere in Embodiment 10.

In addition, a heat treatment is also performed for 1 to 12 hours at 300° C. to 450° C. in an atmosphere containing between 3 and 100% hydrogen, performing hydrogenation. This process is one of hydrogen termination of dangling bonds in the semiconductor film by hydrogen which has been thermally excited. Plasma hydrogenation (using hydrogen excited by a plasma) may also be performed as another means of hydrogenation.

Note that the hydrogenation step may also be conducted during the formation of the first interlayer insulating film 546. Namely, hydrogen processing may be performed as above after forming the 200 nm thick silicon nitride oxide film, and then the remaining 800 nm thick silicon oxide film may be formed.

As shown in FIG. 14A, contact holes are formed next in the first interlayer insulating film 546 and the gate insulating film 514, thereby forming source wirings 547 to 550 and drain wirings 551 to 553. In Embodiment 10, a lamination film with a three layer structure of a 100 nm titanium film, a 300 nm aluminum film containing titanium, and a 150 nm titanium film, formed successively by sputtering, is used as the electrodes. Other conductive films may also be used, of course.

A first passivation film 554 is formed next with a thickness of 50 to 500 nm (typically between 200 and 300 nm). A 300 nm thick silicon nitride oxide film is used as the first passivation film 554 in Embodiment 10. A silicon nitride film may also be substitute for the silicon nitride oxide film.

It is effective to perform plasma processing at this point using a gas containing hydrogen, such as H$_2$ or NH$_3$, before the formation of the silicon nitride oxide film. Hydrogen excited by this preprocess is supplied to the first interlayer insulating film 546, and the film quality of the first passivation film 554 is improved by performing heat treatment. At the same time, the hydrogen added to the first interlayer insulating film 546 diffuses to the lower side, and the active layers can be effectively hydrogenated.

A second interlayer insulating film 555 made of an organic resin is formed next, as shown in FIG. 14B. Materials such as polyimide, acrylic, and BCB (benzocyclobutane) can be used as the organic resin. In particular, it is necessary for the second interlayer insulating film 555 to level the step formed by the TFTs, and therefore it is preferable to use an acrylic film having superior leveling characteristics. A 2.5 μm thick acrylic film is formed in Embodiment 10.

A contact hole for reaching the drain wiring 553 is formed next in the second interlayer insulating film 555 and in the first passivation film 554, and a pixel electrode (anode) 556 is formed. In Embodiment 10, a 110 nm thick indium tin oxide (ITO) film is formed, and patterning is performed, forming the pixel electrode. Furthermore, a transparent conductive film in which between 2 and 20% zinc oxide (ZnO) is mixed into indium oxide, may also be used. The pixel electrode becomes an anode of the EL element 203.

A 500 nm thick insulating film containing silicon (a silicon oxide film in Embodiment 10) is formed next, and an opening portion is formed at the position corresponding to the pixel electrode 556, forming a third interlayer insulating film 557. By using wet etching when forming the opening portion, a sidewall having a tapered shape can easily be made. If the sidewall of the opening portion is not sufficiently gentle, then degradation of an EL layer due to the step becomes a conspicuous problem.

An EL layer 558 and a cathode (MgAg electrode) 559 are formed next in succession, without exposure to the atmosphere, using vacuum evaporation. The film thickness of the EL layer 558 may be set from 80 to 200 nm (typically between 100 and 120 nm) and the thickness of the cathode 559 may be set from 180 to 300 nm (typically between 200 and 250 nm).

In this step, the EL layer and the cathode are formed for the pixel corresponding to the color red, the pixel corresponding to the color green, and the pixel corresponding to the color blue, in order. Note that the EL layer has little resistance with respect to a solution, and therefore the EL layer for each color must be formed individually without using a photolithography technique. A metal mask or the like is then used to cover regions except for those of the desired pixels, and it is preferred that the EL layer and the cathode are selectively formed in necessary portions.

In other words, a mask is set to cover all of the regions except for the pixels corresponding to the color red, and the red color emitting EL layers and the cathodes are formed selectively using the mask. Next, a mask is set to cover all of the regions except for the pixels corresponding to the color green, and the green color emitting EL layers and the cathodes are formed selectively using the mask. A mask is next similarly set to cover all of the regions except for the pixels corresponding to the color blue, and the blue color emitting EL layers and the cathodes are formed selectively using the mask. Note that the use of all different masks is stated here, but the same mask may also be reused. Besides, it is preferable that the process is carried out without breaking a vacuum until the EL layers and the cathodes are formed for all the pixels.

Note that a known material can be used as the EL layer 558. Considering the driving voltage, it is preferable to use an organic material as the known material. For example, a 4 layer structure made from a hole injecting layer, a hole transporting layer, a light emitting layer, and an electron injecting layer may be used as the EL layer. Further, an example is shown of an MgAg electrode being used as the cathode of the EL element 203 in Embodiment 10, but another known material may also be used.

Further, it is appropriate that a conductive film comprising aluminum as its main constituent is used as a protective electrode 560. The protective electrode 560 may be formed with a vacuum evaporation method using the mask different from that used in the formation of the EL layer and the cathode. In addition, the protective electrode 560 is preferably formed in succession without exposure to the atmosphere after the formation of the EL layer and the cathode.

Finally, a second passivation film 561 made from a silicon nitride film is formed with a thickness of 300 nm. The EL layer is protected from things such as moisture by the protective electrode 560. Further, the second passivation film 561 further improves the reliability of the EL element 203.

An active matrix type EL display device having a structure as shown in FIG. 14C is thus completed. Reference numeral 201 is a switching TFT, 202 is a driver TFT, 204 is an n-channel TFT for a driver circuit, and 205 is a p-channel TFT for a driver circuit.

Note that, in practice, it is preferable to perform packaging (sealing), without exposure to the atmosphere, using a protecting film (such as a laminated film or an ultraviolet cured resin film) having good airtight properties, or a housing material such as a sealing can made of ceramic, after completing through to the state of FIG. 14C.

Embodiment 11

In this embodiment, the structure of a source signal side driver circuit when driving is not an analog gray-scale method but a digital time gray-scale method is described.

Figure 15:
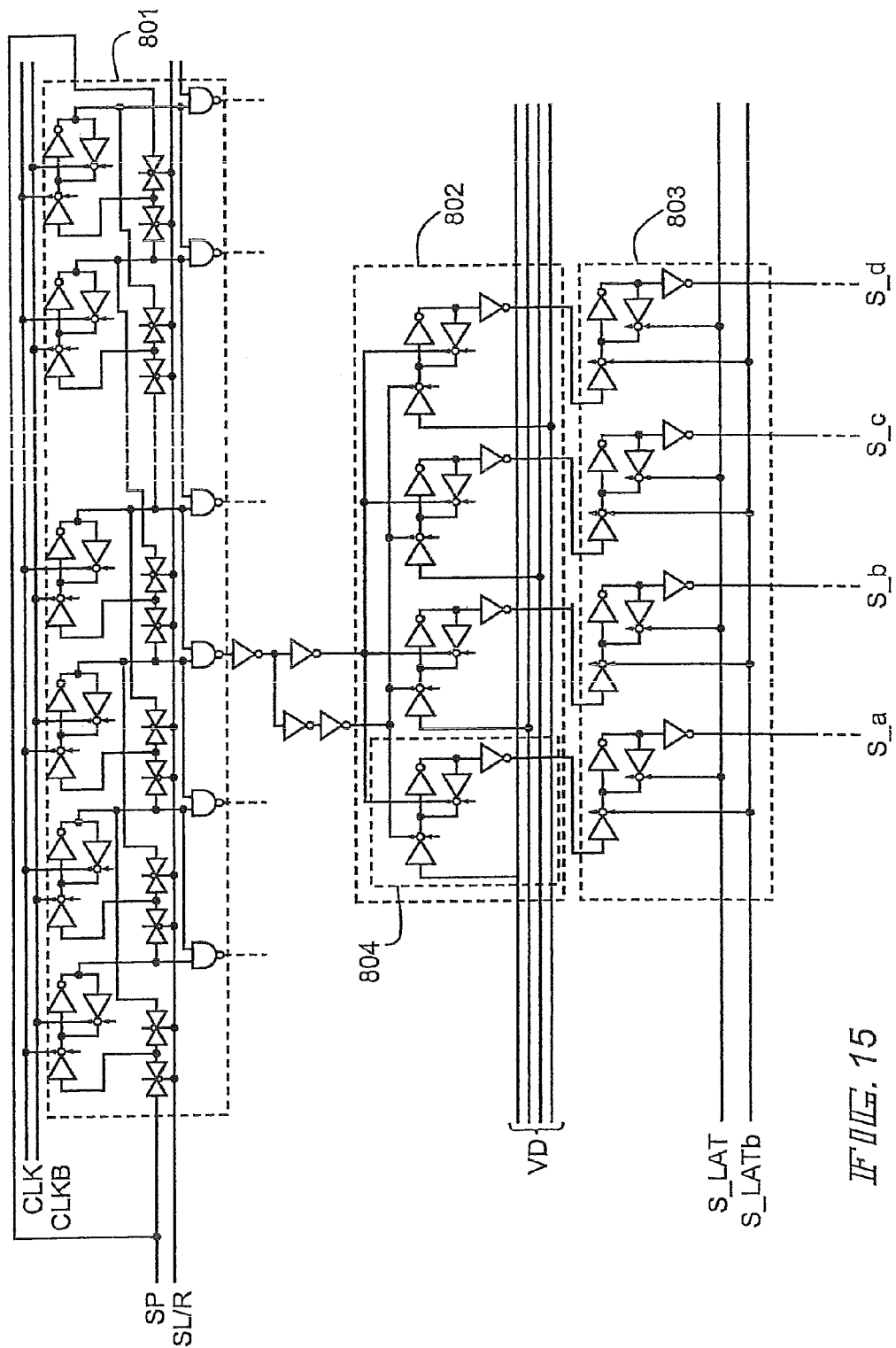
FIG. 15 shows the circuit diagram of the source signal side driver circuit of the display device of the present invention.

FIG. 15 shows a circuit diagram of an example of a source signal side driver circuit used in this embodiment. In this invention the driving method may be applied to such as any of an analog gray-scale method, a digital time gray-scale method, a digital area gray-scale method. Further, a method of combining the gray-scale methods may be used.

Shift registers 801, latches (A) 802, and latches (B) 803 are arranged as shown in the figure. Note that in this embodiment, one group of the latches (A) 802 and the latches (B) 803 correspond to four source signal lines S_a to S_d. Further, a level shifter for changing the width of the amplitude of the signal voltage is not formed in this embodiment, but it may also be suitably formed by a designer.

A clock signal CLK, a clock signal CLKB in which the polarity of CLK is inverted, a start pulse signal SP, and a driver direction changeover signal SL/R are each input to the shift registers 801 by the wirings shown in the figure. Further, a digital data signal VD input from the outside is input to the latches (A) 802 by the wirings shown in the figure. A latch signal S_LAT and a signal S_LATb, in which the polarity of S_LAT is inverted, are input to the latches (B) 803 by the wirings shown in the figure.

Regarding a detailed structure of the latches (A) 802, an example of a portion 804 of the latches (A) 802 which corresponding to the source signal line S_a is explained. The portion 804 of the latches (A) 802 has two clocked inverters and two inverters.

Figure 16:
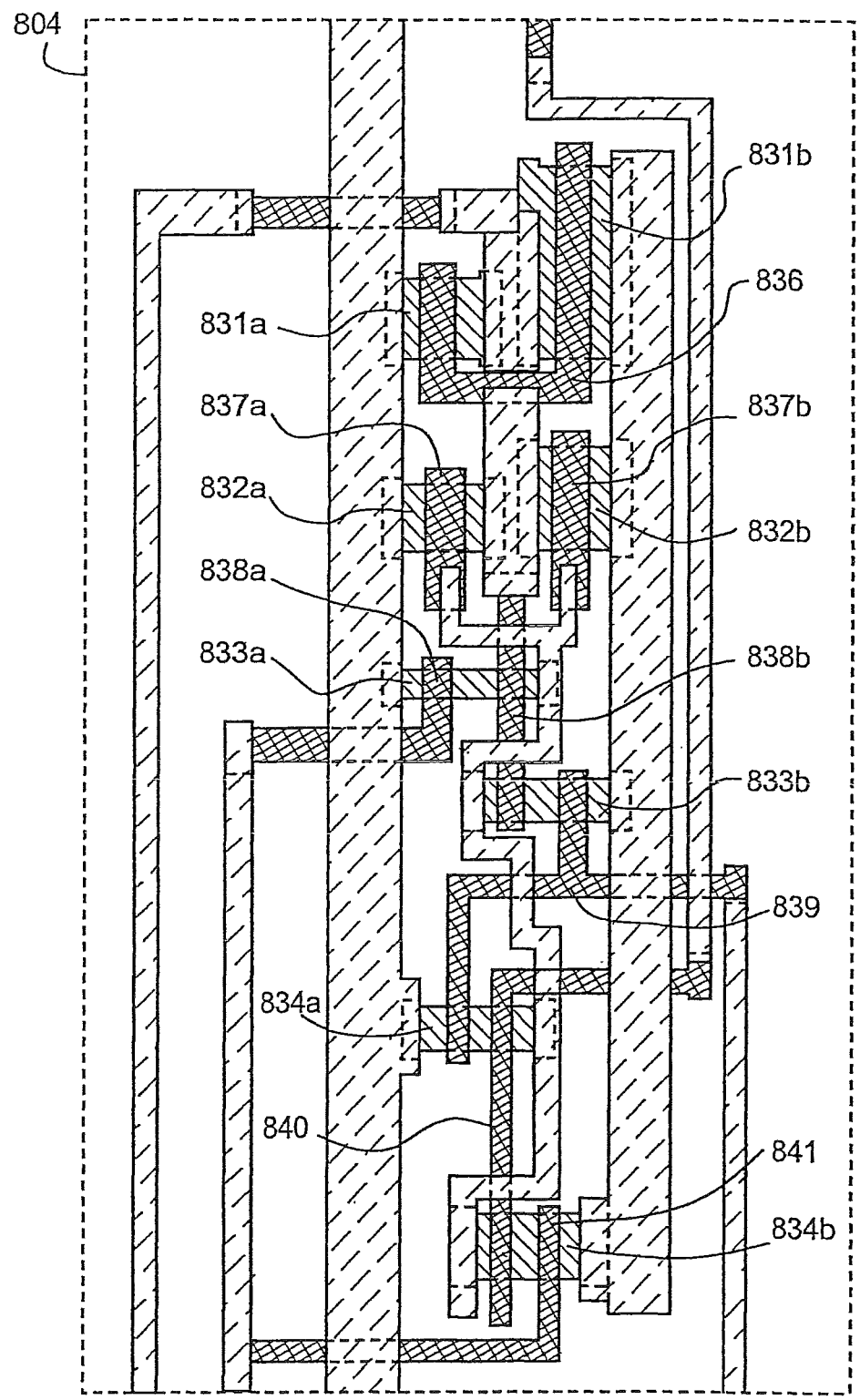
FIG. 16 shows the top view of the latch of the display device of the present invention.

A top view of the portion 804 of the latches (A) 802 is shown in FIG. 16. Reference numerals 831a and 831b each denote an active layer of a TFT forming one inverter of the portion 804 of the latches (A) 802, and reference numeral 836 denotes a common gate electrode of the TFT forming one inverter. Further, reference numerals 832a and 832b each denote an active layer of another TFT forming another inverter of the portion 804 of the latches (A) 802, and reference numerals 837a and 837b denote gate electrodes formed on the active layers 832a and 832b, respectively. Note that the gate electrodes 837a and 837b are electrically connected.

Reference numerals 833a and 833b each denote an active layer of a TFT forming one clock inverter of the portion 804 of the latches (A). Gate electrodes 838a and 838b are formed on the active layer 833a, becoming a double gate structure. Further, gate electrodes 838b and 839 are formed on the active layer 833b, becoming a double gate structure.

Reference numerals 834a and 834b each denote an active layer of a TFT forming another clocked inverter of the portion 804 of the latches (A) 802. Gate electrodes 839 and 840 are formed on the active layer 834a, becoming a double gate structure. Further, gate electrodes 840 and 841 are formed on the active layer 834b, becoming a double gate structure. A gray-scale characteristic when the above digital gray-scale is conducted is shown in FIG. 45.

Figure 45:
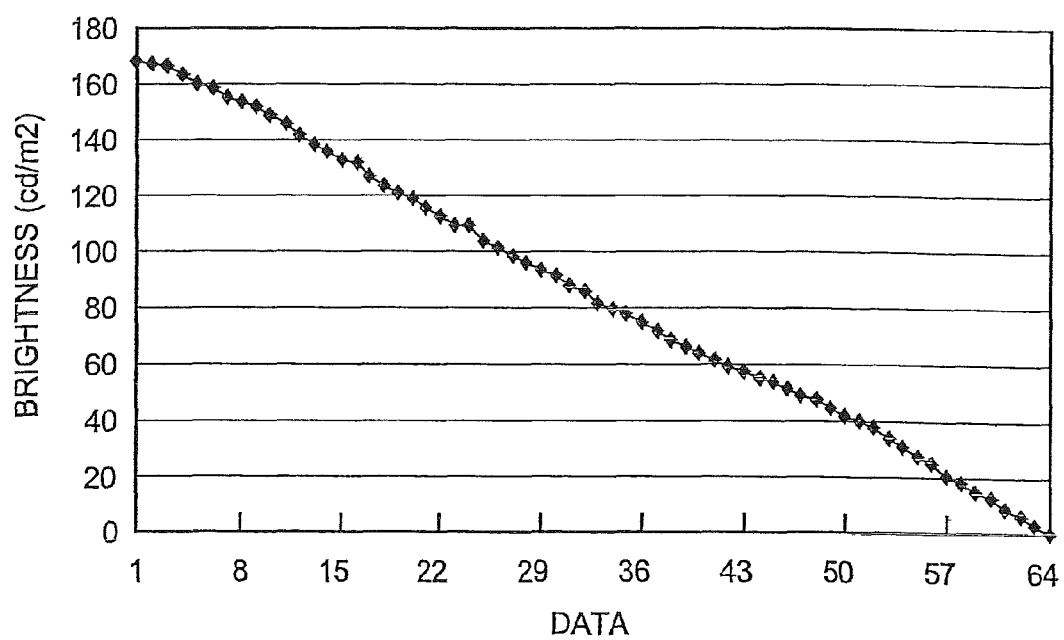
FIG. 45 is a diagram showing the gray-scale characteristics of the display device of the present invention.

By using the above digital time gray-scale method, as shown in FIG. 45, a 64 gray-scale may be expressed.

This embodiment may freely combine and implement any of Embodiments 1 to 10.

Embodiment 12

In the EL display device of the present invention, the material used for the EL layer of the EL element is not limited to organic EL material but may implement an inorganic EL material. However, since the inorganic EL material at present is high in driver voltage, a TFT having a resistance characteristic that may endure the driver voltage has to be used.

Further, if an inorganic EL material is developed in the future with a lower driver voltage, it may be applied to the present invention.

This embodiment may freely combine and implement any of Embodiments 1 to 11.

Embodiment 13

In the present invention, an organic substance used as an EL layer may be a low polymer organic substance or a polymer (high polymer) organic substance.

As a low polymer organic substance, a material with mainly such as Alq$_3$ (tris-8-quinolilyte-alminium) and TPD (triphenyl amine derivative) are known. As a polymer organic substance, there is a substance of a π conjugate polymer. Typically, there are such as PPV (polyparaphenylene vinylene), PVK (polyvinyl carbazole), or polycarbonate.

A polymer (high polymer) organic substance is formed by an easy thin film forming method such as a spin coating method (also referred to as solution application method), a dipping method, a printing method or an ink jet method, and has a higher heat resistance as compared to the low polymer organic substance.

Further, in the EL element of the EL display device of the present invention, if the EL layer of the EL element comprises an electron transporting layer and a hole transporting layer, the electron transporting layer and the hole transporting layer may be structured by an inorganic material, for example, an amorphous semiconductor of such as an amorphous Si and an amorphous $Si_{1-x}C_x$.

In the amorphous semiconductor there is a large amount of trap level, and there is also a large amount of surface level formed at the surface where the amorphous semiconductor contacts the other layers. Therefore, the EL element can emit light at a low voltage with high precision.

Further, a dopant (impurity) may be added to the organic EL layer to change the color of light emitted from the organic EL layer. As a dopant there are such as DCM1, nile red, rubrene, coumarin 6, TPB, quinacridon.

This embodiment may be freely combined with Embodiments 1 to 12 and implemented.

Embodiment 14

In this embodiment, the EL display device of the present invention is described using FIGS. 21A and 21B. FIG. 21A is a top view showing a TFT substrate formed with an EL element in which the filling of EL elements has been conducted. Reference numeral 6801 denotes source signal side driver circuits, reference numerals 6802a and 6802b denote gate signal side driver circuits, and reference numeral 6803 denotes a pixel portion. Further, reference numeral 6804 denotes a cover member, 6805 a first sealing material, and 6806 a second sealing material. A filler material 6807 is provided in between the inner cover member which is surrounded by the first sealing material 6805 and the TFT substrate (refer to FIG. 21B).

Note that, reference numeral 6808 is a connection wiring for transmitting a signal inputted to the source signal side driver circuit 6801, a gate signal side driver circuit 6802a and a pixel portion 403, and receives a video signal or a clock signal from a FPC (flexible print circuit) 409 to be a connecting terminal with an external equipment.

Here, FIG. 21B shows cross sectional diagram in which FIG. 21A is cut along the line A-A'. Note that in FIGS. 21A and 21B, parts having the same reference numerals indicate the same portions.

As shown in FIG. 21B, on the substrate 6800 is formed a pixel portion 6803 and a source signal side driver circuit 6801, and the pixel portion 6803 is formed by a plurality of pixels including the TFT (hereinbelow referred to as driver TFTs) 6851 for controlling the current flowing in the EL element and the pixel electrode 6852 electrically connected to the drain. In this embodiment, the driver TFT 6851 may be a p-channel TFT. Further, the source side driver circuit 6801 is formed using a CMOS circuit in which an n-channel TFT 6853 and a p-channel TFT 6854 are complementarily combined.

Each pixel comprises below the pixel electrode a color filter (R) 6855, a color filter (G) 6856 and a color filter (B) (not shown). Here a color filter (R) is a color filter for extracting a red light, color filter (G) is a color filter for extracting green light, and a color filter (B) is a color filter for extracting blue light. Note that, the color filter (R) 6855 is provided for a red color light emitting pixel, color filter (G) 6856 is provided for a green color light emitting pixel, and the color filter (B) is provided for a blue color light emitting pixel.

As an effect when providing the color filters, there is first an aspect that the color purity of the light emitting color improves. For example, from a pixel with a red color light emission, a red light irradiated (in this embodiment light is irradiated toward the pixel electrode side), however when this red light is passed through the color filter extracting the red light, the purity of the red color is improved. This is the same in the case of the other green and blue lights.

Further, in a conventional structure in which the color filter is not used, the visible light penetrating from the outside of the EL display device excites the light emitting layer of the EL element resulting in a problem that a desired color is not obtained. However, by providing a color filter, only particular wavelength of light can enter the EL element. That is, a problem that the EL element is excited by a light from the outside may be prevented.

Note that, a structure of providing the color filter has been proposed but the EL element which emits white light was used. In this case, since light of other wavelength was cut to extract the red light, a decrease in brightness occurred. However, in this embodiment, for example, since a red light emitted from the EL element is passed through a color filter which extracts red light, the brightness is not decreased.

Next, a pixel electrode 6852 is formed of a transparent conductive film and functions as an anode of an EL element. Further, on both ends of the pixel electrode 6852 is formed an insulating film 6857, and further a light emitting layer 6858 which emits red light and a light emitting layer 6859 which emits green light are also formed. Further, although not shown, a light emitting layer which emits a blue color is provided in the adjacent pixel, and a color display is performed by pixels corresponding to red, green and blue. Of course, the pixel provided with the light emitting layer which emits the blue color is provided with a color filter which extracts the blue color.

Note that, as the material for the light emitting layers 6858 and 6859, not only an organic material but also an inorganic material may be used. Further, the structure may be a laminated structure of not only the light emitting layer but also a combination of an electron injecting layer, an electron transporting layer, a hole transporting layer and a hole injecting layer.

Further, above each light emitting layer, a cathode 6860 of the EL element is formed of a conductive film with a light shielding property. The cathode 6860 is common to all the pixels and is electrically connected to the FPC 6809 through a connection wiring 6808.

Next, the first sealing material 6805 is formed by a dispenser or the like, and sprinkled with a spacer (not shown) to adhere the cover member 6804. Then, a region surrounded by the TFT substrate, the cover member 6804 and the first sealing material 6805 is filled with a filler 6807 by vacuum injection.

Further, barium oxide is added as a hygroscopic substance 6861 to the filler 6807 in advance. Note that, in this embodiment, the hygroscopic substance is added to the filler and used, but it may be filled in the filler by dispersing it as clusters. Further, although not shown, a hygroscopic substance may be used as a material for a spacer.

Next, after hardening the filler 6807 by irradiating ultraviolet light and heating, the opening (not shown) need in the first sealing material 6805 is closed. When the opening of the first sealing material 6805 is closed, the connection wiring 6808 and the FPC 6809 are electrically connected using the conductive material 6862. Further, a second sealing material 6806 is provided so as to cover the exposed portion of the first sealing material 6805 and a portion of the FPC 6809. The second sealing material 6806 may use the same material as the first sealing material 6805.

Using the above method to fill the EL element into the filler 6807, the EL element may be completely shielded from the outside, to prevent penetration of substances that cause oxidation of organic material such as moisture or oxygen from the outside. Therefore, an EL display device with high reliability may be manufactured.

Further, with the use of the present invention, the manufacturing line of the existing liquid crystal display device may be converted to largely reduce the cost for maintenance investment, and a plurality of light emitting devices may be produced from one substrate with a process of high yield so that the manufacturing cost may be largely reduced.

Embodiment 15

Figure 22:
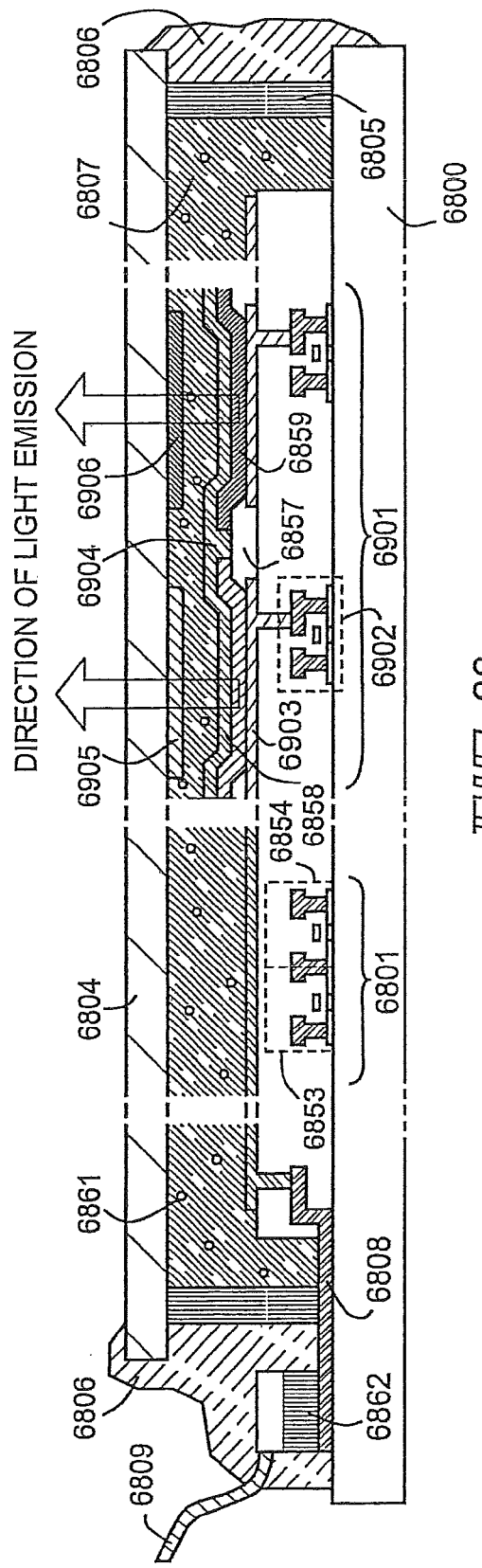
FIG. 22 shows the cross section of the display device of the present invention.
Figure 23:
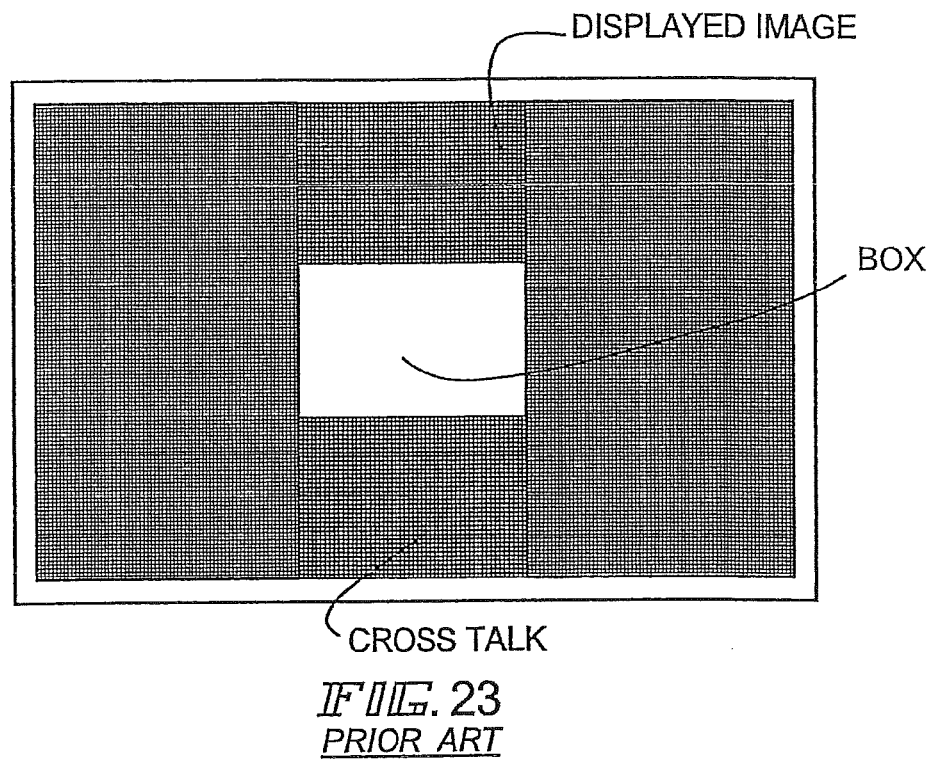
FIG. 23 shows an example of the generation of cross talk.
Figure 24:
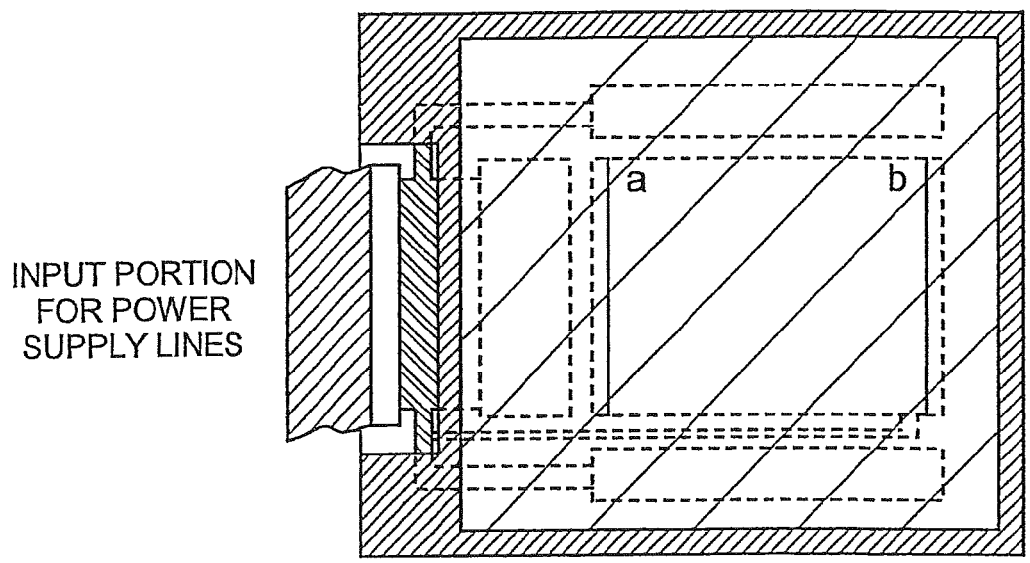
FIG. 24 shows the diagram of a drawing out port of the display device of the present invention.

The EL display device shown in Embodiment 14 of this embodiment in an example where the irradiation direction of light emitted from the EL element is different to the arrangement of the color filter is described. FIG. 22 is used for the explanation but the basic structure is the same as that of FIG. 21B, therefore changed portions will be described with new characters.

In this embodiment, an n-channel TFT is used as a driver TFT 6902 in the pixel portion 6901. Further, the drain of the driver TFT 6902 is electrically connected to the pixel electrode 6903 and the pixel electrode 6903 is formed by a conductive film having a light shielding property. In this embodiment, the pixel electrode 6903 is a cathode of an EL element.

Further, a transparent conductive film 6904, common to all pixels, is formed on the light emitting layer 6858 emitting red light and the light emitting layer 6859 emitting green light are formed using the present invention.

Further, this embodiment is featured in that the color filter (R) 6905, the color filter (G) 6906 and the color filter (B) (not shown) are formed into the cover member 6804. In the case that the structure is that of the EL element of this embodiment, the direction of the light emitted from the light emitting layer is irradiated towards the cover member side, therefore a color filter may be provided in the light path if the structure of FIG. 22 is used.

If color filter (R) 6905, color filter (G) 6906 and color filter (B) (not shown) are provided on the cover member 6804, the processes for the TFT substrate may be lessened, so that there is an advantage that yield and throughput may be improved.

Embodiment 16

Figure 36:
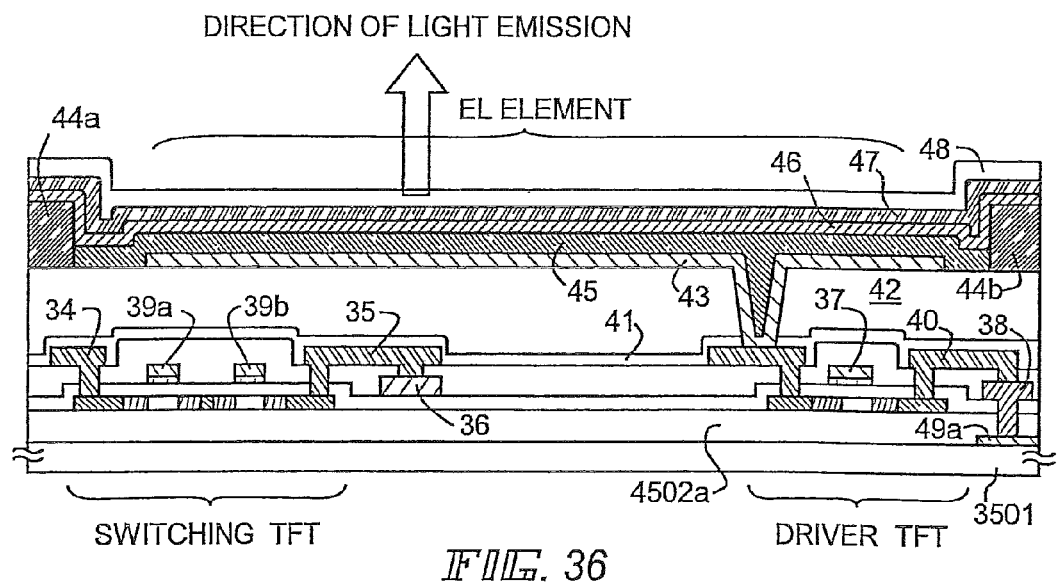
FIG. 36 shows the cross section view of the display device of the present invention.
Figure 38:
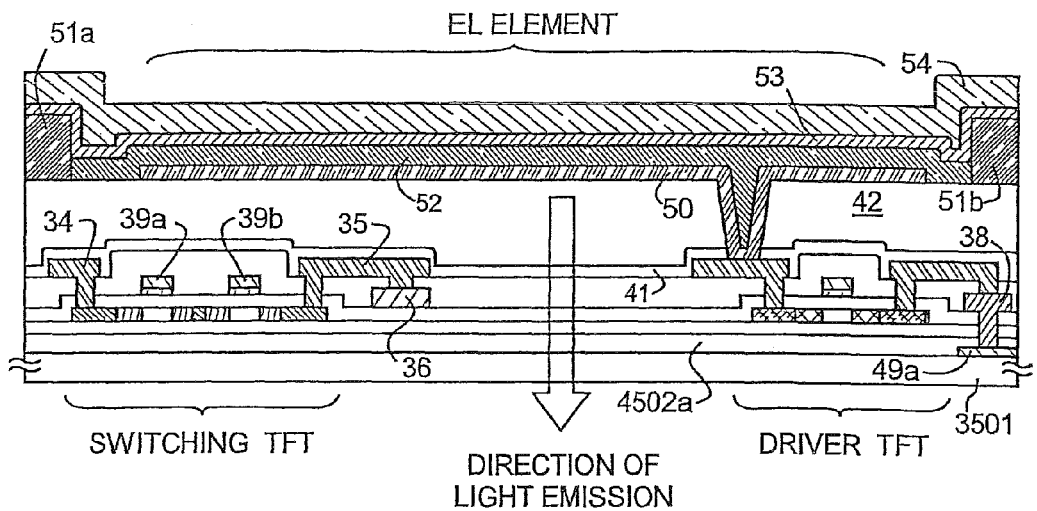
FIG. 38 shows the cross section view of the display device of the present invention.

FIGS. 36 and 38 are Embodiment 2 of the pixel structure of the present invention. This embodiment is an example where a wiring layer different to that of the source signal line and the gate signal line are added to form the power supply line.

Note that, in FIG. 36, the same portions as that shown in FIG. 7 in Embodiment 7 are shown with the same reference numerals and the description thereof is omitted.

Note that, in FIG. 38, the same portions as that shown in FIG. 9 in Embodiment 8 are shown with the same reference numerals and the description thereof is omitted.

A wiring layer 4502*a* is provided at the lower side of the semiconductor layer, thereby to form a power supply line 49*a*. In this way, by providing a different layer, the prevention of lowering of the opening ratio by adding wiring is possible.

Figure 37:
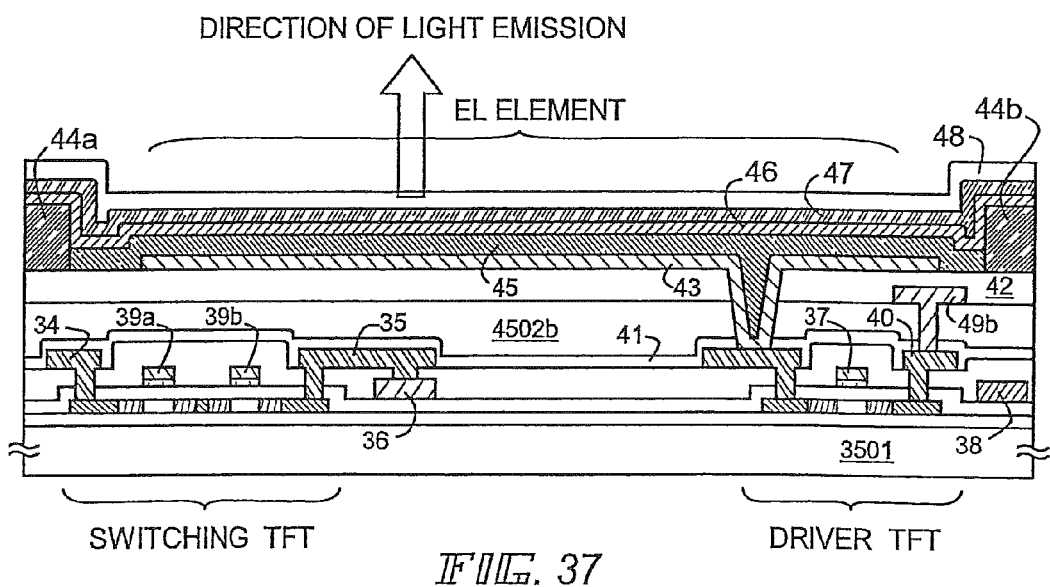
FIG. 37 shows the cross section view of the display device of the present invention.
Figure 39:
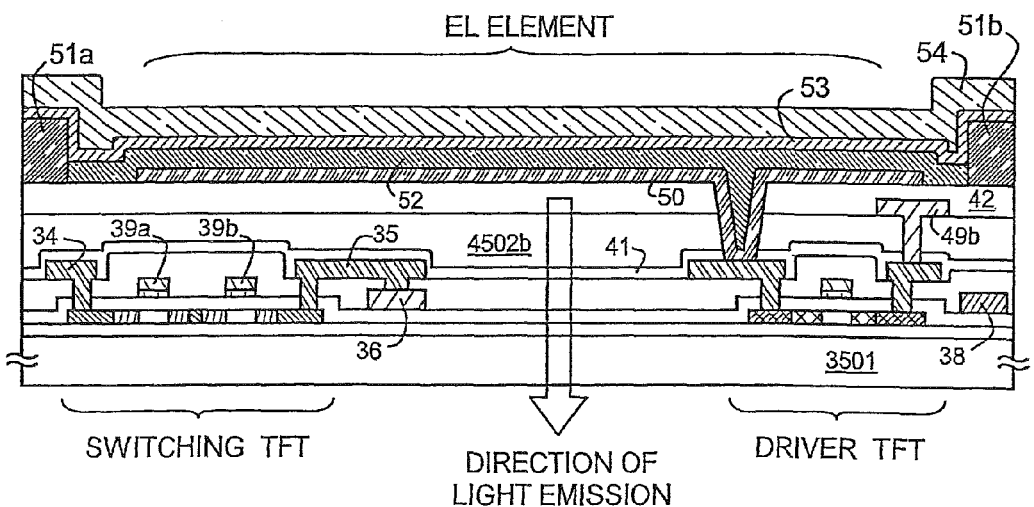
FIG. 39 shows the cross section view of the display device of the present invention.

FIGS. 37 and 39 show Embodiment 3 of the present invention. In this Embodiment, the power supply line 49*b* is brought to a different layer to that of Embodiment 2, a layer 4502*b*.

Note that, in FIG. 37, the same portions as that shown in FIG. 8 in Embodiment 7 are shown by the same reference numerals and the description thereof is omitted.

Note that, in FIG. 39, the same portions as that shown in FIG. 9 in Embodiment 8 are shown by the same reference numerals and the description thereof is omitted.

In FIGS. 37 and 39, the power source supply lines 49*b* are formed above the signal line 34, but it may be formed not in this position but on a layer between the gate signal line and the source signal line, or on the layer below the gate signal.

Embodiment 17

In this embodiment, a case is described where the irradiation direction of light of the EL display device is to the lower surface direction (the substrate side) in Embodiment 10, and the power source supply line is provided at the lower side of the semiconductor layer. However, for simplification of explanation, the CMOS circuit which is a basic unit regarding the driver circuit is shown. Here, the driver circuit TFT may be manufactured using the manufacturing method described in Embodiment 10, therefore the description is omitted here.

First, as shown in FIG. 25A, the substrate 600 is prepared. In this Embodiment, a crystalline glass is used. A 200 to 400 nm thick conductive film is formed on the substrate 600, patterned by a resist mask 601, and etching is performed to form a power source supply line 602. The etching performed may be dry etching or wet etching.

Next, as shown in FIGS. 25B and 25C, an oxide film is formed. In this embodiment, a silicon nitride oxide film 603 with a thickness of 100 nm and a silicon nitride oxide film 604 with a thickness of 200 nm are laminated. At this time, it is preferable that the nitrogen concentration of the silicon nitride oxide film 603 that contacts the crystalline glass substrate is 10 to 25 wt %. After forming the silicon nitride oxide film 604, the leveling of the surface is performed. Specifically a CMP or a surface polishing is performed.

Next, as shown in FIG. 25D, an amorphous silicon film 605 with a thickness of 45 nm is formed by a known film formation method. Note that, it is not necessary to limit the film to an amorphous silicon film, and may be a semiconductor film including a non-crystalline structure (including a microcrystalline semiconductor film). Further, it may be a compound semiconductor film including an amorphous structure such as an amorphous silicon germanium film.

The process from here to FIG. 26C may be completely cited from Japanese Patent Application Laid-open No. Hei 10-247735 of the present applicant. In this publication, a technique regarding a cystallization method of a semiconductor film using an element Ni or the like as a catalyst is disclosed.

As shown in FIG. 25E, a protecting film 607 having opening portions 606a and 606b is formed. In this embodiment, a silicon oxide film with a thickness of 150 nm is used. Then, as shown in FIG. 26A, a layer 608 (a Ni containing layer) including nickel (Ni) is formed on the protecting film 607 by a spin coating method. Regarding the formation of this Ni containing layer, the above publication may be referred.

Next, as shown in FIG. 26B, a heating process is performed in an inert atmosphere at 570° C. for 14 hours to crystallize the amorphous silicon film 605. At this time, the regions 609a and 609b where Ni contacts (hereinafter referred to as Ni added region) are the starting points to progress the crystallization substantially in parallel to the substrate, in order to form a polysilicon film 610 having a crystal structure in which bar-shaped crystals are gathered and lined.

Next, as shown in FIG. 26C, an element of group 15 of the periodic table (preferably phosphorous) is added to Ni added regions 609a and 609b with the protecting film 607 as a mask. In this way, the regions 611a and 611b added with a high concentration of phosphorous is formed (hereinbelow referred to as phosphorous added region).

Next, as shown in FIG. 26C, a heating process is performed in an inert atmosphere at 600° C. for 12 hours. With this heating process the Ni in the polysilicon film 610 moves so that in the end almost all of the Ni is captured in the phosphorous added regions 611a and 611b as shown by the arrows. This is considered as a phenomenon due to a gettering effect of the metal element (Ni in this embodiment) by the phosphorous.

With this process the concentration of Ni remaining in the polysilicon film 612 is lowered to a measurement value measured by the SIMS (secondary ion mass spectroscopy) of at least $2\times10^{17}$ atoms/cm$^3$. The Ni is a life time killer to the semiconductor, but if it is lowered to this degree, there is no adverse influence to the TFT characteristic. Further, this concentration is the limit of measurement of the current SIMS analysis, so that in actuality it is considered to be a lower density ($2\times10^{17}$ atoms/cm$^3$).

Thus, the polysilicon film 612 which is crystallized by using the catalyst and in which the level of the catalyst is lowered so that it does not inhibit the function of the TFT is obtained. Thereafter, the active layers 613a and 613b with only the polysilicon film 612 is patterned and formed. Further, at this time, a marker for performing mask alignment in the patterning thereafter may be formed using the polysilicon film (FIG. 26D).

Next, as shown in FIG. 26E, a silicon nitride oxide film with a thickness of 50 nm is formed by a plasma CVD method, and above that is performed a heating process in an oxide atmosphere at 950° C. for one hour, to perform a thermal oxidization process. Note that, the oxidizing atmosphere may be an oxygen atmosphere or an oxygen atmosphere added with a halogen element.

In this thermal oxidation process, oxidation progresses at the interface of the active layer and the nitride oxide silicon film, thereby oxidizing the polysilicon film with a thickness of approximately 15 nm to form the silicon oxide film with a thickness of approximately 30 nm. That is, a gate insulating film 614 with a thickness of approximately 80 nm is formed laminated with a silicon oxide film with a thickness of approximately 50 nm and a silicon nitride oxide film with a thickness of approximately 30 nm. Note that, the thickness of the active layers 613a and 613b become 30 nm with this thermal oxidation process.

Figure 27A:
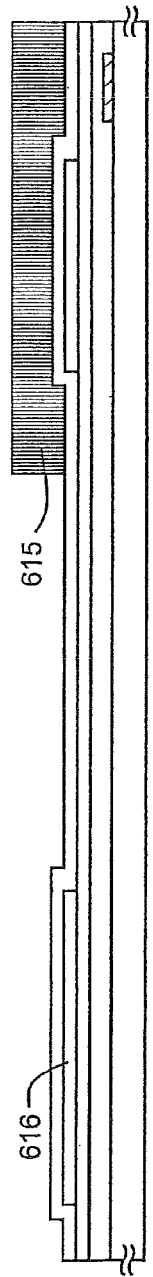
FIGS. 27A to 27D show the manufacturing process of the display device of the present invention.

Next, as shown in FIG. 27A, the resist mask 615 is formed and an impurity element imparting the p-type conductivity (hereinafter referred to as p-type impurity element) is added through the gate insulating film 614. As the p-type impurity element, typically an element belonging to group 13 of the periodic table, typically boron or gallium may be used. This process (referred to as a channel doping process) is a process for controlling the threshold voltage of the TFT.

Note that, in this embodiment boron is added by an ion doping method by plasma excitation without mass separation of diborane ($B_2H_6$). Of course, an ion implantation method performing mass separation may be conducted. With this process an impurity region 616 including boron at a concentration of $1\times10^{15}$ to $1\times10^{18}$ atoms/cm$^3$ (typically $5\times10^{16}$ to $5\times10^{17}$ atoms/cm$^3$) is formed.

Figure 27B:
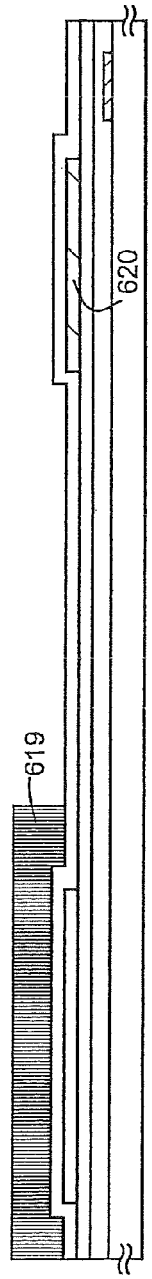
Figure 27C:

Next, as shown in FIG. 27B, the resist mask 619 is formed and an impurity element imparting the n-type conductivity (hereinafter referred to as n-type impurity element) is added through the gate insulating film 614. As the n-type impurity element, typically an element belonging to group 15 of the periodic table, typically phosphorus or arsenic may be used. Note that, in this embodiment phosphorus is added at a concentration of $1\times10^{18}$ atoms/cm$^3$ by an plasma doping method by plasma excitation without mass separation of phosphine ($PH_3$). Of course, an ion implantation method performing mass separation may be conducted.

In the n-type impurity region 620 formed with this process, the dosage of n-type impurity elements is controlled so as to be contained at a concentration of $2\times10^{16}$ to $5\times10^{19}$ atoms/$cm^3$ (typically $5\times10^{17}$ to $5\times10^{18}$ atoms/$cm^3$).

Next as shown in FIG. 27B, the activation processes of the added n-type impurity element and the p-type impurity element are conducted. The activation means is not limited, but a furnace annealing process using an electric furnace is preferable since a gate insulating film 614 is provided therewith. Note that, in the process of FIG. 27A, the interface of the active layer and the gate insulating film of the portion to be the channel forming region may be damaged, so that it is preferable to perform heat processing at as high a temperature as possible.

In this embodiment, since a high heat resistant crystallized glass is used, the activation process may be performed by a furnace annealing process at 800° C. for one hour. Note that, thermal oxidation may be performed with a process atmosphere of an oxidized atmosphere, or a heating process may be performed in an inert atmosphere.

Figure 27D:
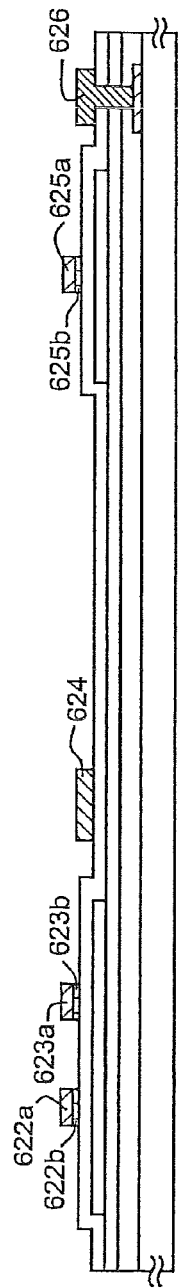

Next, a conductive film with a thickness of 200 to 400 nm is formed and patterned to form the gate electrodes 622, 623 and 625 and the source signal electrode 624 and the power source electrode 626. The line width of the gate electrodes 622, 623 and 625 determine the channel length of each TFT (FIG. 27D).

Note that, the gate electrode may be formed of a single layer conductive film, but accordingly may preferably be made as a laminate film of two or three layers. As a material for the gate electrode, a known conductive film may be used. Specifically, a film made of an element chosen from tantalum (Ta), titanium (Ti), molybdebum (Mo), tungsten (W), chromium (Cr) or silicon (Si), a film made from a nitride of the above elements (typically a tantalum nitride film, a tungsten nitride film or a titanium nitride film), an alloy film combining the above elements (typically Mo—W alloy, Mo—Ta alloy), or a silicide film of the above elements (typically a tungsten silicide film, a titanium silicide film) may be used. Of course, a single layer or a laminate layer may be used.

In this embodiment, a laminate film made of a tungsten nitride (WN) film 622b, 623b and 625b with a thickness of 50 nm, and a tungsten (W) film 622a, 623a, 625a with a thickness of 350 nm is used. This may be formed by a sputtering method. Further, if inert gas such as xenon (Xe) and neon (Ne) is added as a sputtering gas, the peeling of the film due to stress may be prevented.

Note that, the gate electrodes 622a (622b) and 623a (623b) are shown to be separated in two at the cross section but are in actuality electrically connected.

Figure 28A:
FIGS. 28A to 28D show the manufacturing process of the display device of the present invention.

Next, as shown in FIG. 28A, n-type impurity element (in this embodiment phosphorus) is added in a self aligning manner with the gate electrodes 622, 623 and 625, the source signal electrode 624 and the power source electrode 626 as masks. The impurity regions 627 to 631 formed in this way are added with phosphorus to be adjusted to a concentration of ½ to ¹⁄₁₀ (typically ⅓ to ¼) as that in the n-type impurity region 620. Specifically, the concentration is preferably $1\times10^{16}$ to $5\times10^{18}$ atoms/$cm^3$ (typically $3\times10^{17}$ to $3\times10^{18}$ atoms/$cm^3$).

Figure 28B:
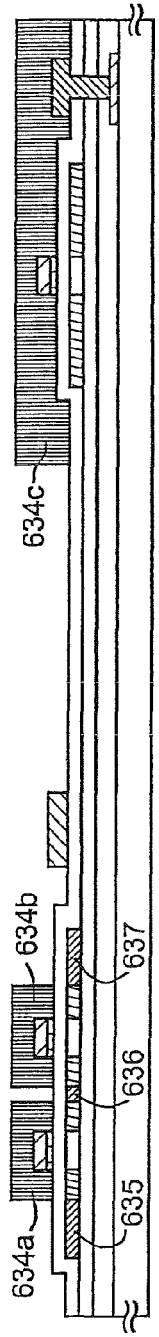

Next as shown in FIG. 28B, resist masks 634a to 634c are formed as to cover the gate electrodes and the like, and the n-type impurity element (in this embodiment, phosphorus) is added to thereby form impurity regions 635 to 637 containing phosphorus at a high concentration. Here, an ion doping method using phosphine ($PH_3$) is performed so that the density of phosphorus in this region is adjusted to be $1\times10^{20}$ to $1\times10^{21}$ atoms/$cm^3$ (typically $2\times10^{20}$ to $5\times10^{21}$ atoms/$cm^3$).

In this process the source region and the drain region of the n-channel TFT are formed, but a portion of the n-type impurity regions 627 to 631 formed in the process of FIG. 28A remains in the switching TFT. The remaining region becomes the LDD region of the switching TFT.

Figure 28C:
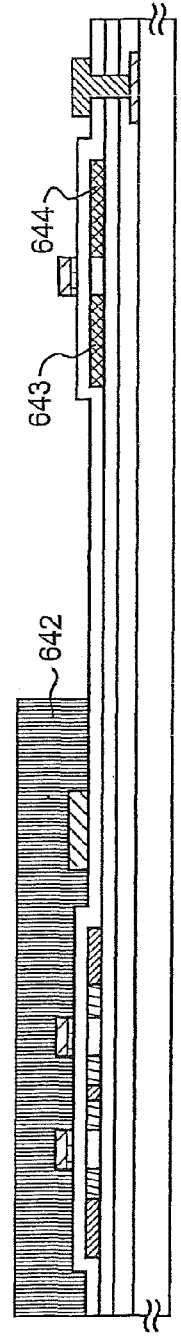

Next, as shown in FIG. 28C, resist masks 634a to 634c are removed to form a new resist mask 642. Then, a p-type impurity element (in this embodiment boron) is added to form impurity regions 643 and 644 including boron at a high concentration. Here boron is added by an ion doping method using diborane ($B_2H_6$) at a concentration of $3\times10^{20}$ to $3\times10^{21}$ atoms/$cm^3$ (typically $5\times10^{20}$ to $1\times10^{21}$ atoms/$cm^3$).

Note that, the impurity regions 643 and 644 are already added with phosphorus at a concentration of $1\times10^{20}$ to $1\times10^{21}$ atoms/$cm^3$, but boron to be added here is added at a concentration of at least 3 times or more. Therefore, the n-type impurity region formed in advance completely reverses to a p-type to thereby function as a p-type impurity region.

Figure 28D:
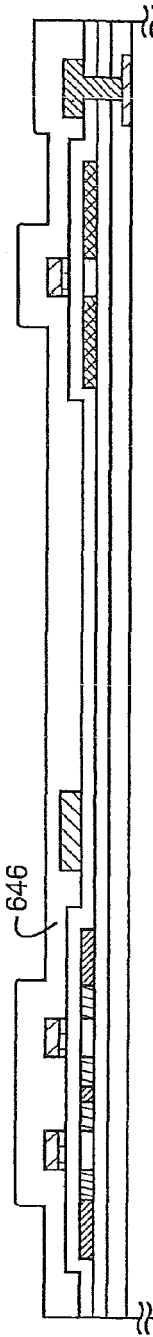

Next, as shown in FIG. 28D, after the resist mask 642 is removed, a first interlayer insulating film 646 is formed. As the first interlayer insulating film 646, an insulating film including silicon is used as a single layer or a laminate film with a combination thereof may be used. Note that, the film thickness may be 400 nm to 1.5 µm. This embodiment has a structure where the silicon oxide film with a thickness of 800 nm is laminated on the silicon nitride oxide film with a thickness of 200 nm.

Thereafter, the n-type or p-type impurity element added at each concentration is activated. As an activation means, a furnace annealing method is preferable. In this embodiment, a heating process is performed in an electric furnace in a nitrogen atmosphere at 550° C. for 4 hours.

Further, in an atmosphere including 3 to 100% of hydrogen, a heating process at 300 to 450° C. for 1 to 12 hours and hydrogenation process is performed. This process is a step for terminating dangling bonds of the semiconductor film with thermally excited hydrogen. As other means for hydrogenation, plasma hydrogenation (using hydrogen excited by plasma) may be performed.

Note that, the hydrogenation process may be conducted while forming the first interlayer insulating film 646. That is, the hydrogenation process may be performed as above after forming the silicon nitride oxide film with a thickness of 200 nm, and then forming the rest of the silicon oxide film with a thickness of 800 nm.

Next, as shown in FIG. 29A, a contact hole is formed with respect to the first interlayer insulating film 646 and the gate insulating film 614, and the source wirings 647, 650 and the drain wirings 652, 653 are formed. Note that, in this embodiment, the electrode is a laminate film of a three-layered structure forming a Ti film with a thickness of 100 nm, an aluminum film containing Ti with a thickness of 300 nm, and a Ti film with a thickness of 150 nm consecutively by a sputtering method. Of course, other conductive films may be used.

Next, a first passivation film 654 is formed with a thickness of 50 to 500 nm (typically 200 to 300 nm). In this embodiment, a silicon oxide nitride film with a thickness of 300 nm is used as a first passivation film 654. This may be substituted by a silicon nitride film.

At this time, before the formation of the silicon nitride oxide film, it is effective to perform plasma processing using gas including hydrogen such as $H_2$ or $NH_3$. Hydrogen excited by this pre-process is supplied to the first interlayer insulating film 646, and by performing heat processing, the quality of the first passivation film 654 is improved. At the same time, hydrogen added to the first interlayer insulating film 646 is dispersed at the lower layer side so that hydrogenation of the active layer can be conducted effectively.

Next, as shown in FIG. 29B, a second interlayer insulating film 655 of an organic resin is formed. As an organic resin, polyimide, acryl, BCB (benzocyclobutylene) or the like may be used. Particularly, in the second interlayer insulating film 655, the leveling of the step formed by the TFT has to be conducted, so that an acrylic film excellent for leveling is preferred. In this embodiment, an acrylic film with a thickness of 2.5 μm is formed.

Next, a contact hole which reaches the drain wiring 653 is formed in the second interlayer insulating film 655 and the first passivation film 654, and then a pixel electrode (anode) 656 is formed. In this embodiment, an indium tin oxide (ITO) film is formed to a thickness of 110 nm, and patterning is performed to make a pixel electrode. Further, a transparent conductive film with 2 to 20% of zinc oxide (ZnO) mixed in the indium oxide may be used. This pixel electrode becomes the anode of the EL element.

Next, resins 661a and 661b are formed with a thickness of 500 nm and an opening portion is formed at the positions corresponding to the pixel electrode 656.

Next, an EL layer 658 and a cathode (MgAg electrode) 659 are formed in succession without exposure to the atmosphere using a vacuum evaporation method. Note that the thickness of the EL layer 658 may be set to between 80 to 200 nm (typically between 100 and 120 nm) and the thickness of the cathode 659 may be set to between 180 and 300 nm (typically between 200 and 250 nm).

In this process, the EL layer and the cathode are formed one after another with respect to pixels corresponding to the color red, pixels corresponding to the color green, and pixels corresponding to the color blue. However, the EL layer is weak with respect to a solution, and therefore the EL layer and the cathode must be formed with respect to each of the colors without using a photolithography technique. It is preferable to cover areas outside of the desired pixels using a metal mask, and selectively form the EL layer and the cathode only in the necessary locations.

In other words, a mask is first set so as to cover all pixels except for those corresponding to the color red, and the EL layer for emitting red color light and the cathode are selectively formed using the mask. Next, a mask is set so as to cover all pixels except for those corresponding to the color green, and the EL layer for emitting green color light and the cathode are selectively formed using the mask. Similarly, a mask is set so as to cover all pixels except for those corresponding to the color blue, and the EL layer for emitting blue color light and the cathode are selectively formed using the mask. Note that the use of all different masks is stated here, but the same mask may also be reused. Besides, it is preferable that the process is carried out without breaking a vacuum until the EL layers and the cathodes are formed for all the pixels.

A known material can be used as the EL layer 658. Considering the driver voltage, it is preferable to use an organic material as the known material. For example, a four layer structure constituted of a hole injecting layer, a hole transporting layer, a light emitting layer and an electron injecting layer may be adopted as the EL layer. Further, in Embodiment 17, although the MgAg electrode is used as the cathode of the EL element, the present invention is not limited to this. Other known materials may be used for the cathode.

Further, it is appropriate that a conductive film comprising aluminum as its main constituent is used as a protective electrode 660. The protective electrode 660 may be formed with a vacuum evaporation method using the mask different from that used in the formation of the EL layer and the cathode. In addition, the protective electrode 660 is preferably formed in succession without exposure to the atmosphere after the formation of the EL layer and the cathode.

In this way, the active matrix EL display device with the structure as shown in FIG. 29C is completed.

Note that, in practice, it is preferable to perform packaging (sealing), without exposure to the atmosphere, using a protecting film (such as a laminated film or an ultraviolet cured resin film) having good airtight properties, or a housing material such as a sealing can made of ceramic, after completing through to the state of FIG. 29C.

Embodiment 18

In Embodiment 18, a method, in which the light radiation direction of an EL display device is set to the direction toward the lower surface (substrate side) and a current supply line is manufactured at the upper portion of a signal line in Embodiment 10, is explained. However, in order to simplify the explanation, a CMOS circuit, which is the basic circuit for the driver circuit, is shown in the figures. Here, a driver circuit TFT can be manufactured by using the manufacturing method described in Embodiment 10, and the explanation thereof is omitted.

Figure 30A:
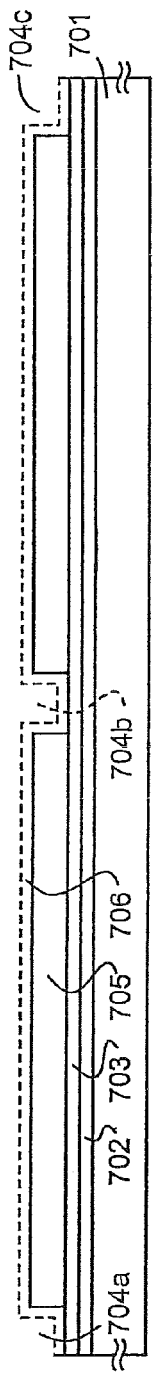
FIGS. 30A to 30E show the manufacturing process of the display device of the present invention.

First, as shown in FIG. 30A, a substrate 701 provided with a base film 702 on the surface is prepared. In Embodiment 18, a lamination film of a silicon nitride oxide film with a thickness of 100 nm and a silicon nitride oxide film with a thickness of 200 nm is used as the base film on a crystallized glass. At this time, the nitrogen concentration at the side in contact with the crystallized glass may be set to between 10 to 25 wt %. Of course, an element may be directly formed on a quartz substrate without the provision of the base film.

Next, an amorphous silicon film 703 with a thickness of 45 nm is formed on a base film 702 by a known film formation method. Note that, it is not necessary to limit the film to an amorphous silicon film, and it may be a semiconductor film including a non-crystalline structure (including a microcrystalline semiconductor film). Further, it may be a compound semiconductor film including a non-crystalline structure such as a non-crystalline silicon geranium film.

Figure 30B:
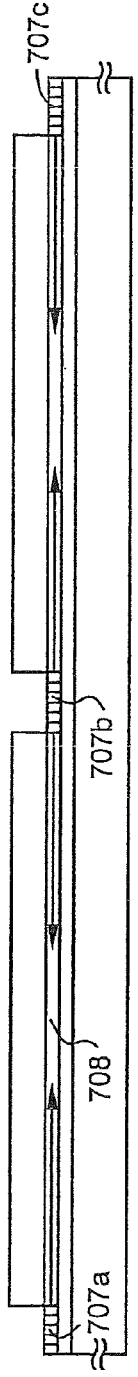
Figure 30C:
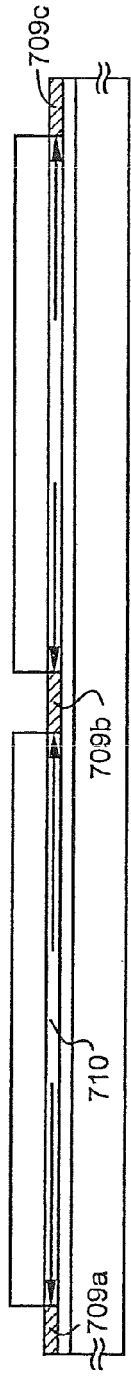

The process from here to FIG. 30C may be completely cited from Japanese Patent Application Laid-open No. Hei 10-247735 of the present applicant. In this publication, a technique regarding a cystallization method of a semiconductor film using an element Ni or the like as a catalyst is disclosed.

A protecting film 705 having opening portions 704a, 704b and 704c is formed first. In this embodiment, a silicon oxide film with a thickness of 150 nm is used. Then, a layer 706 (a Ni containing layer) including nickel (Ni) is formed on the protecting film 705 by a spin coating method. Regarding the formation of this Ni containing layer, the above publication may be referred.

Next, as shown in FIG. 30B, a heating process is performed in an inert atmosphere at 570° C. for 14 hours to crystallize the amorphous silicon film 703. At this time, the regions 707a, 707b and 707c where Ni contacts (hereinafter referred to as Ni added regions) are the starting points to progress the crystallization substantially in parallel to the substrate, in order to form a polysilicon film 708 of a crystal structure where bar-like crystals are gathered and lined.

Next, as shown in FIG. 30C, an element of group 15 of the periodic table (preferably phosphorous) is added to Ni added regions 707a, 707b and 707c with the protecting film 705 as a mask. In this way, the regions 709a, 709b, and 709c added with a high concentration of phosphorous is formed (hereinbelow referred to as phosphorous added regions).

Next, as shown in FIG. 30C, a heating process is performed in an inert atmosphere at 600° C. for 12 hours. With this heating process the Ni in the polysilicon film 708 moves so that in the end almost all of the Ni is captured in the phosphorous added regions 709a, 709b and 709c as shown by the arrows. This is considered as a phenomenon due to a gettering effect of the metal element (Ni in this embodiment) by the phosphorous.

With this process the concentration of Ni remaining in the polysilicon film 710 is lowered to a measurement value measured by the SIMS (secondary ion mass spectrometer) of at least $2 \times 10^{17}$ atoms/cm$^3$. The Ni is a life time killer to the semiconductor, but if it is lowered to this degree, there is no adverse influence to the TFT characteristic. Further, this concentration is almost the limit of measurement of the current SIMS analysis, so that in actuality it is considered to be a lower density ($2 \times 10^{17}$ atoms/cm$^3$).

Figure 30D:

Thus, the polysilicon film 710 which is crystallized using the catalyst and in which the level of the catalyst is lowered so that it does not inhibit the function of the TFT is obtained. Thereafter, the active layers 711a and 711b with only the polysilicon film 710 are patterned and formed. Further, at this time, a marker for performing mask alignment in the patterning thereafter may be formed using the polysilicon film (FIG. 30D).

Figure 30E:
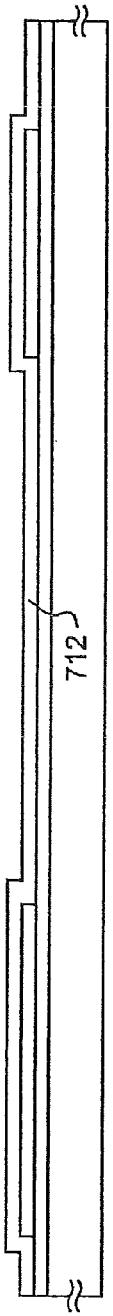

Next, as shown in FIG. 30E, a silicon nitride oxide film with a thickness of 50 nm is formed by a plasma CVD method, and above that is performed a heating process in an oxide atmosphere at 950° C. for one hour, to perform a thermal oxidization process. Note that, the oxidizing atmosphere may be an oxygen atmosphere or an oxygen atmosphere added with a halogen element.

In this thermal oxidation process, oxidation progresses at the interface of the active layer and the silicon nitride oxide film, thereby oxidizing the polysilicon film with a thickness of approximately 15 nm to form the silicon oxide film with a thickness of approximately 30 nm. That is, a gate insulating film 712 with a thickness of approximately 80 nm is formed laminated with a silicon oxide film with a thickness of approximately 50 nm and a silicon nitride oxide film with a thickness of approximately 30 nm. Note that, the thickness of the active layers 711a and 711b become 30 nm with this thermal oxidation process.

Figure 31A:
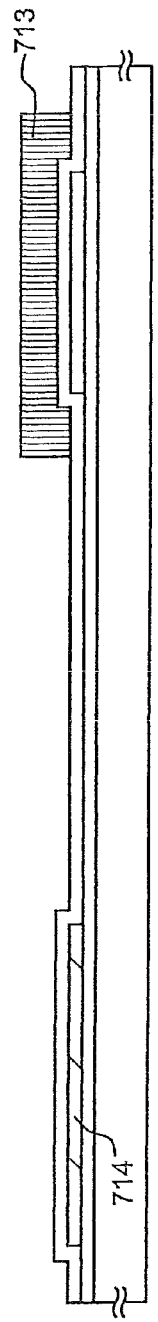
FIGS. 31A to 31D show the manufacturing process of the display device of the present invention.

Next, as shown in FIG. 31A, the resist mask 713 is formed and an impurity element imparting the p-type conductivity (hereinafter referred to as p-type impurity element) is added through the gate insulating film 712. As the p-type impurity element, typically an element belonging to group 13 of the periodic table, typically boron or gallium may be used. This process (referred to as a channel doping process) is a step for controlling the threshold voltage of the TFT.

Note that, in this embodiment boron is added by an ion doping method by plasma excitation without mass separation of diborane ($B_2H_6$). Of course, an ion implantation method performing mass separation may be conducted. With this process an impurity region 714 including boron at a concentration of $1 \times 10^{15}$ to $1 \times 10^{18}$ atoms/cm$^3$ (typically $5 \times 10^{16}$ to $5 \times 10^{17}$ atoms/cm$^3$) is formed.

Figure 31B:
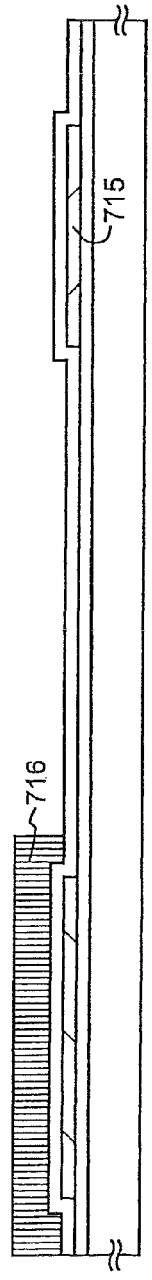

Next, as shown in FIG. 31B, the resist mask 716 is formed and an impurity element imparting the n-type conductivity (hereinafter referred to as n-type impurity element) is added through the gate insulating film 712. As the n-type impurity element, typically an element belonging to group 15 of the periodic table, typically phosphorus or arsenic may be used. Note that, in this embodiment phosphorus is added at a concentration of $1 \times 10^{18}$ atoms/cm$^3$ by a plasma doping method by plasma excitation without mass separation of phosphine ($PH_3$). Of course, an ion implantation method performing mass separation may be conducted.

In the n-type impurity region 715 formed with this process, the dosage of n-type impurity elements is controlled so as to be contained at a concentration of $2 \times 10^{16}$ to $5 \times 10^{19}$ atoms/cm$^3$ (typically $5 \times 10^{17}$ to $5 \times 10^{18}$ atoms/cm$^3$).

Figure 31C:

Next, as shown in FIG. 31C, the activation processes of the added n-type impurity element and the p-type impurity element are conducted. The activation means is not limited, but a furnace annealing process using an electric furnace is preferable since a gate insulating film 712 is provided. Note that, in the process of FIG. 31A, the interface of the active layer and the gate insulating film of the portion to be the channel forming region may be damaged, so that it is preferable to perform heat processing at as high a temperature as possible.

In this embodiment, since a high heat resistant crystallized glass is used, the activation process may be performed by a furnace annealing process at 800° C. for one hour. Note that, thermal oxidation may be performed with a process atmosphere of an oxidized atmosphere, or a heating process may be performed in an inert atmosphere.

Figure 31D:
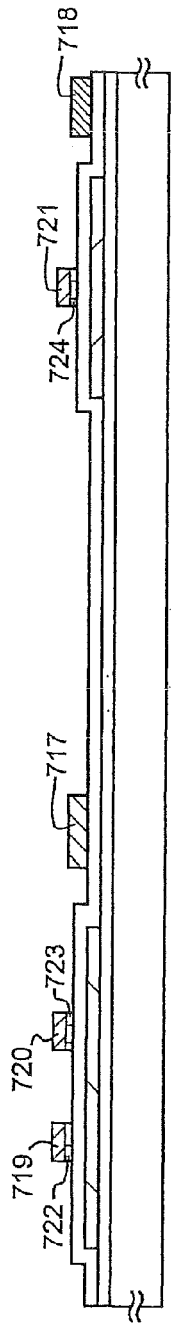

Next, a conductive film with a thickness of 200 to 400 nm is formed and patterned to form the gate electrodes 622, 719 to 724 and the wirings 717 and 718. The line width of the gate electrodes 719 to 724 determine the channel lengths of each TFT (FIG. 31D).

Note that, the gate electrode may be formed of a single layer conductive film, but accordingly may preferably be made as a laminate film of two or three layers. As a material for the gate electrode, a known conductive film may be used. Specifically, a film made of an element chosen from tantalum (Ta), titanium (Ti), molybdebum (Mo), tungsten (W), chromium (Cr) or silicon (Si), a film made from a nitride of the above elements (typically a tantalum nitride film, a tungsten nitride film or a titanium nitride film), an alloy film combining the above elements (typically Mo—W alloy, Mo—Ta alloy), or a silicide film of the above elements (typically a tungsten silicide film, a titanium silicide film) may be used. Of course a single layer or a laminate layer may be used.

In this embodiment, a laminate film made of a tungsten nitride (WN) film 722 to 724 with a thickness of 50 nm, and a tungsten (W) film 719 to 721 with a thickness of 350 nm is used. This may be formed by a sputtering method. Further, if inert gas such as xenon (Xe) and neon (Ne) is added as a sputtering gas, the peeling of the film due to stress may be prevented.

The gate electrodes 719 (722), 720 (723) are shown to be separated in two at the cross section but are in actuality electrically connected.

Next, as shown in FIG. 32A, n-type impurity element (in this embodiment phosphorus) is added in a self-aligning manner with the gate electrodes 719 to 724 and the wirings 717 and 718 as masks. The impurity regions 725 to 729 formed in this way are added with phosphorus to be adjusted to a concentration of ½ to ¹⁄₁₀ (typically ⅓ to ¼) as that in the n-type impurity region 715. Specifically, the concentration is preferably $1\times10^{16}$ to $5\times10^{18}$ atoms/cm³ (typically $3\times10^{17}$ to $3\times10^{18}$ atoms/cm³).

Next, as shown in FIG. 32B, resist masks 730a to 730c are formed as to cover the gate electrodes and the like, and the n-type impurity element (in this embodiment, phosphorus) is added to thereby form impurity regions 731 to 733 containing phosphorus at a high concentration. Here, an ion doping method using phosphine ($PH_3$) is performed so that the density of phosphorus in the region is adjusted to be $1\times10^{20}$ to $1\times10^{21}$ atoms/cm³ (typically $2\times10^{20}$ to $5\times10^{21}$ atoms/cm³).

In this process the source region and the drain region of the n-channel TFT are formed, but a portion of the n-type impurity regions 725 to 727 formed in the process of FIG. 32A remains in the switching TFT. The remaining region becomes the LDD region of the switching TFT.

Next, as shown in FIG. 32C, resist masks 730a to 730c are removed to form a new resist mask 34. Then, a p-type impurity element (in this embodiment, boron) is added to form impurity regions 735 and 736 including boron at a high concentration. Here boron is added by an ion doping method using diborane ($B_2H_6$) at a concentration of $3\times10^{20}$ to $3\times10^{21}$ atoms/cm³ (typically $5\times10^{20}$ to $1\times10^{21}$ atoms/cm³).

Note that, the impurity regions 735 and 736 are already added with phosphorus at a concentration of $1\times10^{20}$ to $1\times10^{21}$ atoms/cm³, but boron to be added here is added at a concentration of at least three times or more. Therefore, the n-type impurity region formed in advance completely reverses to a p-type to thereby function as a p-type impurity region.

Next, as shown in FIG. 32D, after the resist mask 734 is removed, the first interlayer insulating film 737 is formed. As the first interlayer insulating film 737, an insulating film including silicon is used as a single layer or a laminate film with a combination thereof is used. Note that, the film thickness may be 400 nm to 1.5 μm. This embodiment has a structure where the silicon oxide film with a thickness of 800 nm is laminated on the silicon nitride oxide film with a thickness of 200 nm.

Thereafter, the n-type or p-type impurity element added at each concentration is activated. As an activation means, a furnace annealing method is preferable. In this embodiment, a heating process is performed in an electric furnace in a nitrogen atmosphere at 550° C. for 4 hours.

Further, in an atmosphere including 3 to 100% of hydrogen, a heating process for 1 to 12 hours at 300 to 450° C. and hydrogenation process is performed. This process is a step for terminating dangling bonds of the semiconductor film with thermally excited hydrogen. As other means for hydrogenation, plasma hydrogenation (using hydrogen excited by plasma) may be performed.

Note that, the hydrogenation process may be conducted while forming the first interlayer insulating film 737. That is, the hydrogenation process may be performed as above after forming the silicon nitride oxide film with a thickness of 200 nm, and then forming the rest of the silicon oxide film with a thickness of 800 nm.

Next, as shown in FIG. 33A, a contact hole is formed with respect to the first interlayer insulating film 737 and the gate insulating film 712, and the source wirings 738, 739 and the drain wirings 740, 741 are formed. Note that, in this embodiment, the electrode is a laminate film of a three-layered structure made of a Ti film with a thickness of 100 nm, an aluminum film containing Ti with a thickness of 300 nm and a Ti film with a thickness of 150 nm formed in succession by a sputtering method. Of course, other conductive films may be used.

Next, a first passivation film 742 is formed with a thickness of 50 to 500 nm (typically 200 to 300 nm). In this embodiment, a silicon oxide nitride film with a thickness of 300 nm is used as a first passivation film 742. This may be substituted by a silicon nitride film.

At this time, before the formation of the silicon nitride oxide film, it is effective to perform plasma processing using gas including hydrogen such as $H_2$ or $NH_3$. Hydrogen excited by this pre-process is supplied to the first interlayer insulating film 737, and by performing heat processing, the quality of the first passivation film 742 is improved. At the same time, hydrogen added to the first interlayer insulating film 737 is dispersed at the lower layer side so that hydrogenation of the active layer can be conducted effectively.

Next, as shown in FIG. 33B, an insulating film 743 is formed. In this embodiment, a silicon nitride oxide film is used as the insulating film 743. Thereafter a contact hole which reaches the wiring 739 is formed in the insulating film 743, the first passivation film 742 and the first interlayer insulating film 737, to form a power source supply line 744. Note that, in this embodiment, the power source supply line 744 is a laminate film formed of a tungsten nitride film and a tungsten film. Of course, other conductive films may be used.

Next, as shown in FIG. 33C, a second interlayer insulating film 745 of an organic resin is formed. As an organic resin, polyimide, acryl, BCB (benzocyclobutylene) or the like may be used. Particularly, in the second interlayer insulating film 745, the leveling of the step formed by the TFT has to be conducted, so that an acrylic film excellent for leveling is preferred. In this embodiment, an acrylic film with a thickness of 2.5 μm is formed.

Next, as shown in FIG. 33D, a contact hole which reaches the drain wiring 741 is formed in the second interlayer insulating film 745, the insulating film 743 and the first passivation film 742, and then a pixel electrode (anode) 746 is formed. In this embodiment, an indium tin oxide (ITO) film if formed to a thickness of 110 nm, and patterning is performed to make a pixel electrode. Further, a transparent conductive film with 2 to 20% of zinc oxide (ZnO) mixed in the indium oxide may be used. This pixel electrode becomes the anode of the EL element.

Figure 34:
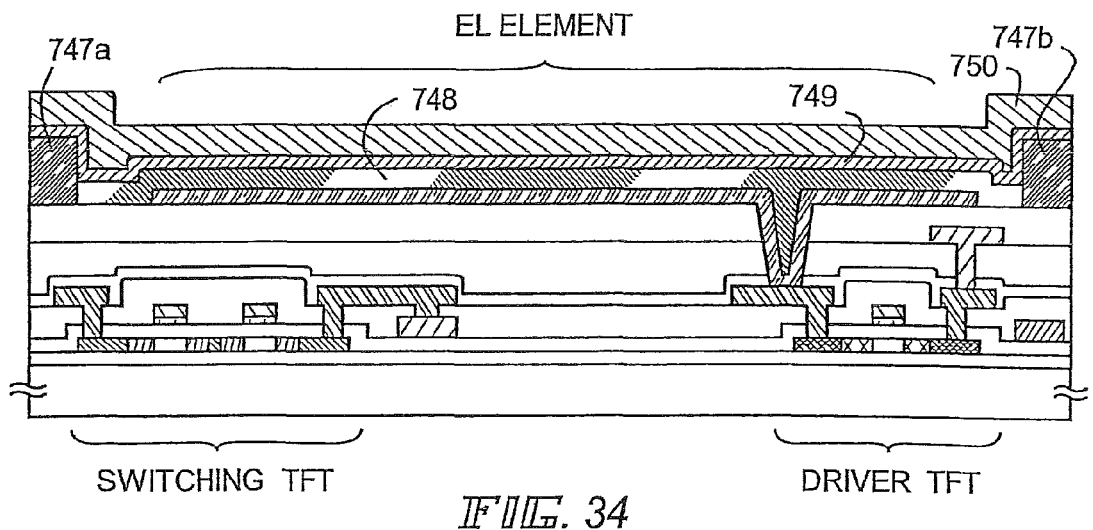
FIG. 34 shows the manufacturing process of the display device of the present invention.

Next, as shown in FIG. 34, resins 747a and 747b are formed with a thickness of 500 nm and an opening portion is formed at the positions corresponding to the pixel electrode 746.

Next, an EL layer 748 and a cathode (MgAg electrode) 749 are formed in succession without exposure to the atmosphere by using a vacuum evaporation method. Note that the thickness of the EL layer 748 may be set to between 80 to 200 nm (typically between 100 and 120 nm) and the thickness of the cathode 749 may be set to between 180 and 300 nm (typically between 200 and 250 nm).

In this process, the EL layer and the cathode are formed one after another with respect to pixels corresponding to the color red, pixels corresponding to the color green, and pixels corresponding to the color blue. However, the EL layer is weak with respect to a solution, and therefore the EL layer and the cathode must be formed with respect to each of the colors without using a photolithography technique. It is preferable to cover areas outside of the desired pixels using a metal mask, and selectively form the EL layer and the cathode only in the necessary locations.

In other words, a mask is first set so as to cover all pixels except for those corresponding to the color red, and the EL layer for emitting red color light and the cathode are selectively formed using the mask. Next, a mask is set so as to cover all pixels except for those corresponding to the color green, and the EL layer for emitting green color light and the cathode are selectively formed using the mask. Similarly, a mask is set so as to cover all pixels except for those corresponding to the color blue, and the EL layer for emitting blue color light and the cathode are selectively formed using the mask. Note that the use of all different masks is stated here, but the same mask may also be reused. Besides, it is preferable that the process is carried out without breaking a vacuum until the EL layers and the cathodes are formed for all the pixels.

A known material can be used as the EL layer 748. Considering the driver voltage, it is preferable to use an organic material as the known material. For example, a four layer structure constituted of a hole injecting layer, a hole transporting layer, a light emitting layer and an electron injecting layer may be adopted as the EL layer. Further, in this embodiment, although the MgAg electrode is used as the cathode of the EL element, the present invention is not limited to this. Other known materials may be used for the cathode.

Further, it is appropriate that a conductive film comprising aluminum as its main constituent is used as a protective electrode 750. The protective electrode 750 may be formed with a vacuum evaporation method using the mask different from that used in the formation of the EL layer and the cathode. In addition, the protective electrode 660 is preferably formed in succession without exposure to the atmosphere after the formation of the EL layer and the cathode.

In this way, the active matrix EL display device with the structure as shown in FIG. 34 is completed.

Note that, in practice, it is preferable to perform packaging (sealing), without exposure to the atmosphere, using a protecting film (such as a laminated film or an ultraviolet cured resin film) having good airtight properties, or a sealing can made of ceramic, after completing through to the state of FIG. 34.

Embodiment 19

The EL display device manufactured by applying the present invention can be used in various kinds of electronic equipment. The electronic equipment, which incorporates the EL display device manufactured by applying the present invention as the display medium, are explained below.

Such kind of electronic equipment include a TV receiver, a telephone, a video camera, a digital camera, a head mounted display (goggle type display), a game machine, a car navigation system, a personal computer, a portable information terminal (a mobile computer, a portable telephone, an electronic book and the like) and the like. Examples of those are shown in FIGS. 17A to 17F.

Figure 17A:
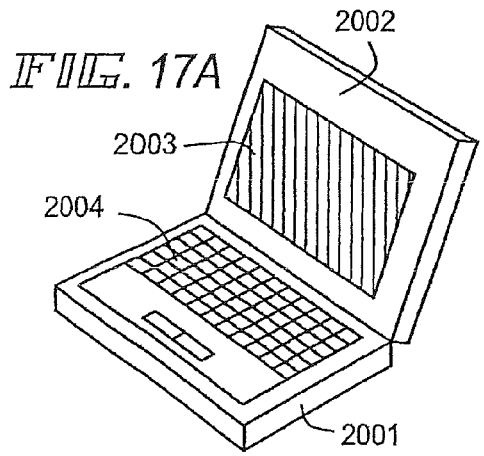
FIGS. 17A to 17F show the electrical appliance using the display device of the present invention.

FIG. 17A shows a personal computer, which contains a main body 2001, a casing 2002, a display portion 2003, a keyboard 2004 and the like. The EL display device of the present invention can be used in the display portion 2003 of the personal computer.

Figure 17B:
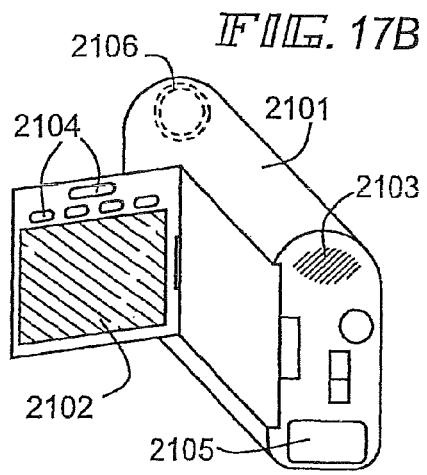

FIG. 17B shows a video camera, which contains a main body 2101, a display portion 2102, a sound input portion 2103, operation switches 2104, a battery 2105, an image receiving portion 2106 and the like. The EL display device of the present invention can be used in the display portion 2102 of the video camera.

Figure 17C:
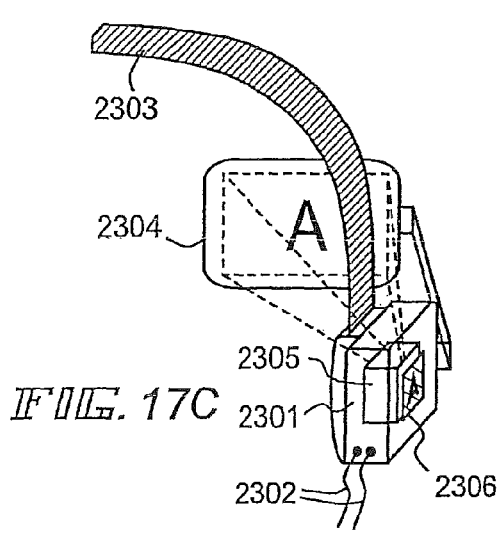

FIG. 17C shows a portion (right side) of a head mounted display, which contains a main body 2301, a signal cable 2302, a head fixing band 2303, a screen monitor 2304, an optical system 2305, a display portion 2306 and the like. The EL display device of the present invention can be used in the display portion 2306 of the head mounted display.

Figure 17D:
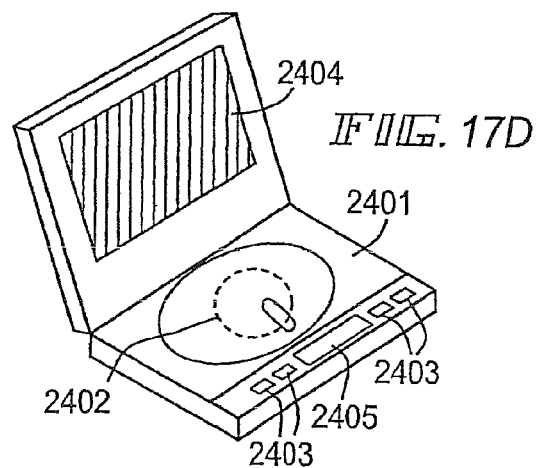

FIG. 17D shows an image playback device equipped with a recording medium (specifically, a DVD playback device), which contains a main body 2401, a recording medium (such as a CD, an LD or a DVD) 2402, operation switches 2403, a display portion (a) 2404, a display portion (b) 2405 and the like. The display portion (a) 2404 is mainly used for displaying image information. The display portion (b) 2405 is mainly used for displaying character information. The EL display device of the present invention can be used in the display portion (a) 2404 and the display portion (b) 2405 of the image playback device equipped with the recording medium. Note that the present invention can be applied to devices such as a CD playback device and a game machine as the image playback device equipped with the recording medium.

Figure 17E:
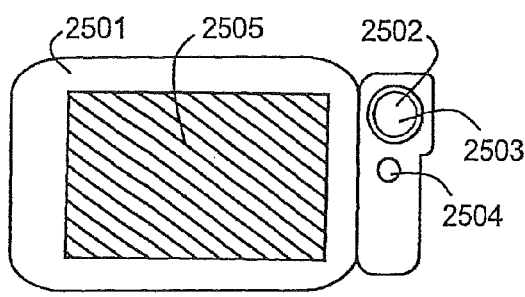

FIG. 17E shows a mobile computer, which contains a main body 2501, a camera portion 2502, an image receiving portion 2503, operation switches 2504, a display portion 2505 and the like. The EL display device of the present invention can be used in the display portion 2505 of the mobile computer.

Figure 17F:
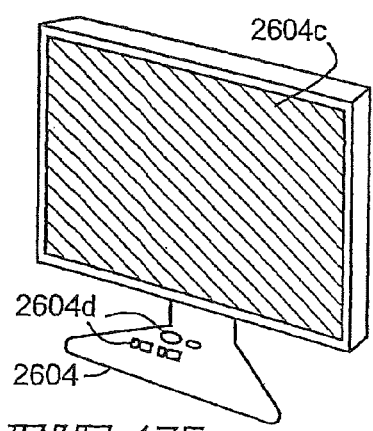
Figure 18:
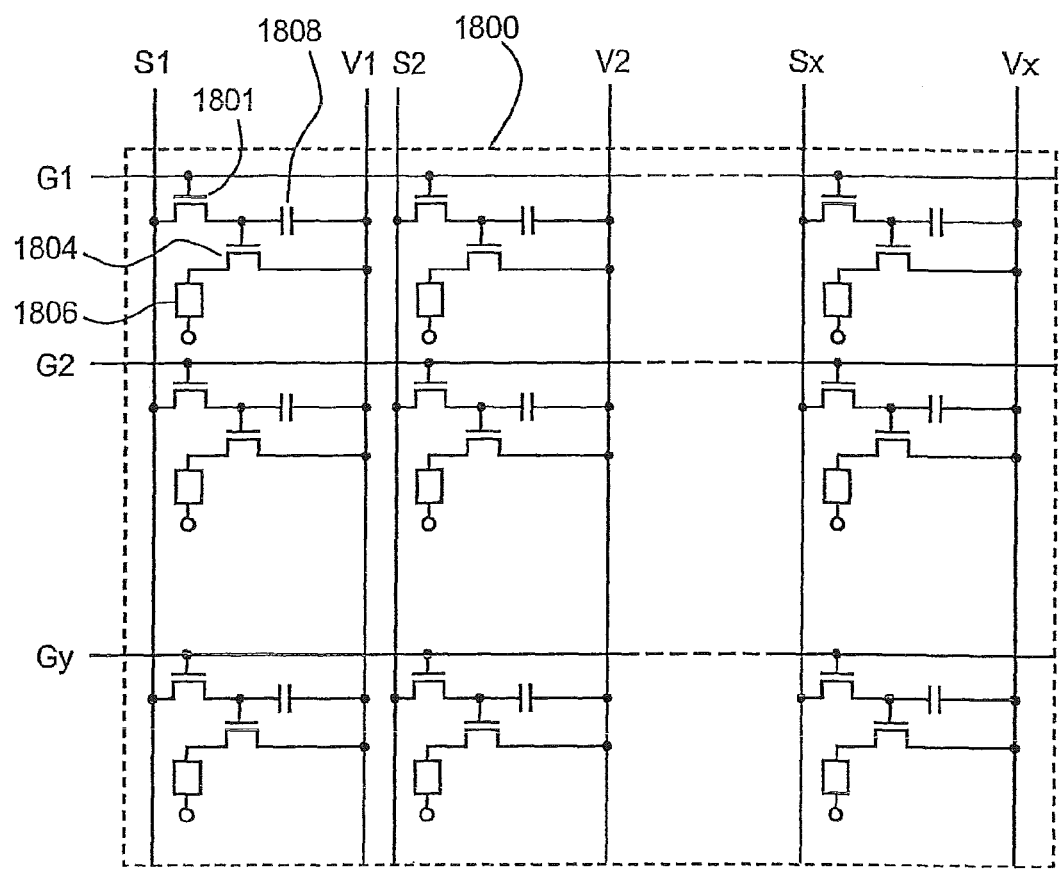
FIG. 18 shows the circuit diagram of the pixel portion of the conventional display device.
Figure 19:
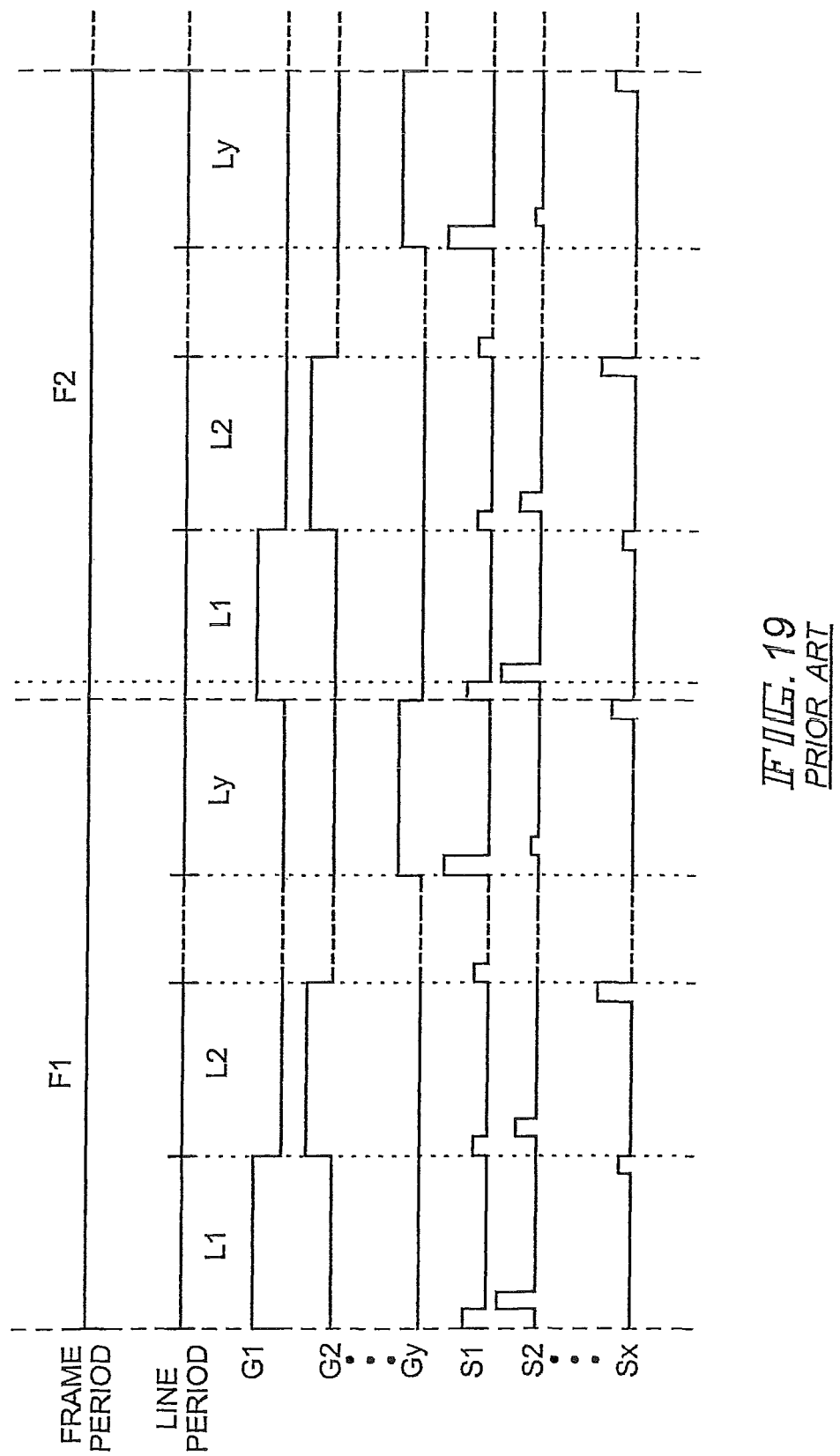
FIG. 19 shows the diagram of the timing chart showing the driving method of the display device.
Figure 20:
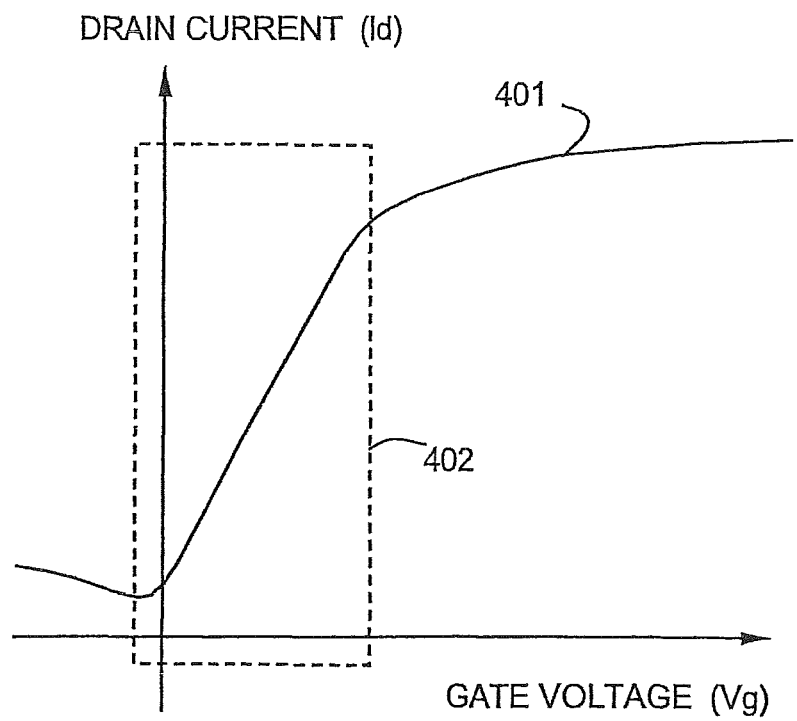
FIG. 20 shows the diagram of a Id-Vg characteristic of a TFT.

FIG. 17F shows a TV receiver, which contains a main body 2604a, a display portion 2604c, operation switches 2604d and the like. The EL display device of the present invention can be used in the display portion 2604c of the TV receiver.

Further, if the emission luminance of an EL material is improved in future, the EL material may be used in a front type or rear type projector.

The applicable range of the present invention is extremely wide, as shown above, and it is possible to apply the present invention to electronic equipment in all fields. Further, the electronic equipment of this embodiment can be realized using the constitution in which Embodiments 1 to 18 are freely combined.

In the conventional EL display device, when the screen size is enlarged, potential drop occurs in the current supply line due to the increase of electric current arisen from the large screen size, and this has been a problem in that the quality of image display is impaired.

However, the present invention may decrease the effect of the wiring resistance by the above structure, and even if the current flowing in the EL element increases, display may be performed without failing the quality of picture.

What is claimed is:

1. A display device comprising:
   a pixel over a substrate, the pixel comprising an EL element and a transistor having atop gate structure and comprising a semiconductor film;
   a gate signal line over the substrate;
   a source signal line over the substrate;
   a first power supply line over the substrate, the first power supply line extending in a direction parallel to the gate signal line;
   a first insulating film over the first power supply line, the first insulating film comprising a first contact hole and a second contact hole;
   a second power supply line over the first insulating film, the second power supply line extending in a direction perpendicular to the first power supply line;

a conductive film over the first insulating film, the conductive film being connected to the semiconductor film through the first contact hole;
a second insulating film over the second power supply line and the conductive film;
a pixel electrode of the EL element over the second insulating film; and
a third insulating film over the second insulating film, the third insulating film comprising an opening,
wherein the first power supply line is made from a same material as the gate signal line,
wherein the second power supply line is made from a same material as the source signal line,
wherein the second power supply line is connected to the first power supply line through the second contact hole, and
wherein the opening and the pixel electrode overlap each other.

2. The display device according to claim 1,
wherein the pixel electrode comprises silver.

3. The display device according to claim 1,
wherein the pixel electrode comprises a compound of indium oxide and tin oxide.

4. The display device according to claim 1,
wherein the semiconductor film comprises polysilicon.

5. A display device comprising:
a pixel over a substrate, the pixel comprising an EL element, a capacitor and a transistor having a top gate structure and comprising a semiconductor film;
a gate signal line over the substrate;
a source signal line over the substrate;
a first power supply line over the substrate, the first power supply line extending in a direction parallel to the gate signal line;
a first insulating film over the first power supply line, the first insulating film comprising a first contact hole and a second contact hole;
a second power supply line over the first insulating film, the second power supply line extending in a direction perpendicular to the first power supply line;
a conductive film over the first insulating film, the conductive film being connected to the semiconductor film through the first contact hole;
a second insulating film over the second power supply line and the conductive film;
a pixel electrode of the EL element over the second insulating film; and
a third insulating film over the second insulating film, the third insulating film comprising an opening,
wherein the first power supply line is made from a same material as the gate signal line,
wherein the second power supply line is made from a same material as the source signal line,
wherein the second power supply line is connected to the first power supply line through the second contact hole,
wherein the second power supply line and the capacitor overlap each other, and
wherein the opening and the pixel electrode overlap each other.

6. The display device according to claim 5,
wherein the pixel electrode comprises silver.

7. The display device according to claim 5,
wherein the pixel electrode comprises a compound of indium oxide and tin oxide.

8. The display device according to claim 5,
wherein the semiconductor film comprises polysilicon.

9. A display device comprising:
a pixel over a substrate, the pixel comprising a transistor having a top gate structure and comprising a semiconductor film;
a gate signal line over the substrate;
a source signal line over the substrate;
a first power supply line extending over the substrate, the first power supply line in a direction parallel to the gate signal line;
a first insulating film over the first power supply line, the first insulating film comprising a first contact hole and a second contact hole;
a second power supply line over the first insulating film, the second power supply line extending in a direction perpendicular to the first power supply line;
a conductive film over the first insulating film, the conductive film being connected to the semiconductor film through the first contact hole;
a second insulating film over the second power supply line and the conductive film;
a pixel electrode over the second insulating film;
a third insulating film over the second insulating film, the third insulating film comprising an opening;
an EL layer over the pixel electrode;
a cathode over the EL layer;
a fourth insulating film over the cathode;
a filler material over the fourth insulating film; and
a cover member over the filler material,
wherein the first power supply line is made from a same material as the gate signal line,
wherein the second power supply line is made from a same material as the source signal line,
wherein the second power supply line is connected to the first power supply line through the second contact hole, and
wherein the opening and the pixel electrode overlap each other.

10. The display device according to claim 9,
wherein the pixel electrode comprises silver.

11. The display device according to claim 9,
wherein the pixel electrode comprises a compound of indium oxide and tin oxide.

12. The display device according to claim 9,
wherein the semiconductor film comprises polysilicon.

* * * * *

UNITED STATES PATENT AND TRADEMARK OFFICE
CERTIFICATE OF CORRECTION

| | | |
|---|---|---|
| PATENT NO. | : 9,536,468 B2 | Page 1 of 1 |
| APPLICATION NO. | : 14/886994 | |
| DATED | : January 3, 2017 | |
| INVENTOR(S) | : Jun Koyama and Hajime Kimura | |

It is certified that error appears in the above-identified patent and that said Letters Patent is hereby corrected as shown below:

In the Specification

Column 5, Line 22; Change "fouled" to --formed--.

Column 18, Line 20; Change "1 ET" to --TFT--.

Column 27, Line 49; Change "need" to --formed--.

In the Claims

Column 40, Line 55, Claim 1; Change "atop" to --a top--.

Signed and Sealed this
Twenty-seventh Day of June, 2017

Joseph Matal
*Performing the Functions and Duties of the*
*Under Secretary of Commerce for Intellectual Property and*
*Director of the United States Patent and Trademark Office*